United States Patent
Fish et al.

(10) Patent No.: US 12,375,052 B2
(45) Date of Patent: Jul. 29, 2025

(54) AUDIO NOTIFICATIONS

(71) Applicant: Sonos, Inc., Santa Barbara, CA (US)

(72) Inventors: Nathan Fish, Santa Barbara, CA (US); Daniel Casimiro, Santa Barbara, CA (US)

(73) Assignee: Sonos, Inc., Goleta, CA (US)

( * ) Notice: Subject to any disclaimer, the term of this patent is extended or adjusted under 35 U.S.C. 154(b) by 0 days.

(21) Appl. No.: 18/048,034

(22) Filed: Oct. 20, 2022

(65) Prior Publication Data
US 2023/0170865 A1    Jun. 1, 2023

Related U.S. Application Data

(63) Continuation of application No. 16/947,895, filed on Aug. 24, 2020, now Pat. No. 11,482,978, which is a (Continued)

(51) Int. Cl.
  *G06F 3/16* (2006.01)
  *G06F 9/54* (2006.01)
  (Continued)

(52) U.S. Cl.
  CPC .......... *H03G 3/3026* (2013.01); *G06F 3/165* (2013.01); *G06F 3/167* (2013.01); *G06F 9/546* (2013.01);
  (Continued)

(58) Field of Classification Search
  CPC ........ G06F 3/165; G06F 3/167; H03G 3/3026
  See application file for complete search history.

(56) References Cited

U.S. PATENT DOCUMENTS

| 999,715 A | 8/1911 | Gundersen |
| 5,717,768 A | 2/1998 | Laroche |
| (Continued) | | |

FOREIGN PATENT DOCUMENTS

| CN | 1748250 A | 3/2006 |
| CN | 1781291 A | 5/2006 |
| (Continued) | | |

OTHER PUBLICATIONS

Amazon Ask Questions, "Q: Can two dots listen to separate music in different rooms?" (Sep. 2017), pp. 1-5 [retrieved from https://www.amazon.com/ask/questions/Tx199M38M3QKL18/1/ref=ask_al_psf_al_hza].*
(Continued)

*Primary Examiner* — Brian W Wathen
(74) *Attorney, Agent, or Firm* — Akerman LLP

(57) ABSTRACT

Systems and methods for a playback device outputting an audio alert from a network-enabled device include (i) while the playback device is playing back audio content, receiving an alert communication from the network-enabled device, the alert communication including (a) an audio notification identifier that identifies an audio notification and (b) a priority identifier that identifies a priority level of the audio notification; (ii) responsive to receiving the alert communication, adding the audio notification to a notification queue at a particular queue position, where the particular queue position of the audio notification in the notification queue is based on the priority level of the audio notification relative to other audio content in the notification queue; (iii) adjusting playback of the audio content for playing back the audio notification; and (iv) the playback device playing back the audio notification.

18 Claims, 11 Drawing Sheets

Related U.S. Application Data continuation of application No. 16/148,879, filed on Oct. 1, 2018, now Pat. No. 10,797,667.

(60) Provisional application No. 62/723,942, filed on Aug. 28, 2018.

(51) Int. Cl.
*H03G 3/30* (2006.01)
*H04L 51/224* (2022.01)
*H04N 21/436* (2011.01)
*H04N 21/482* (2011.01)

(52) U.S. Cl.
CPC ..... *H04L 51/224* (2022.05); *H04N 21/43615* (2013.01); *H04N 21/4825* (2013.01); *H04R 2430/01* (2013.01)

(56) References Cited

U.S. PATENT DOCUMENTS

| | | |
|---|---|---|
| 5,857,172 A | 1/1999 | Rozak |
| 6,070,140 A | 5/2000 | Tran |
| 6,219,645 B1 | 4/2001 | Byers |
| 6,704,671 B1 | 3/2004 | Umminger, III |
| 6,937,977 B2 | 8/2005 | Gerson |
| 7,103,542 B2 | 9/2006 | Doyle |
| 7,516,068 B1 | 4/2009 | Clark |
| 7,571,014 B1 | 8/2009 | Lambourne et al. |
| 7,705,565 B2 | 4/2010 | Patino et al. |
| 8,234,395 B2 | 7/2012 | Millington |
| 8,239,206 B1 | 8/2012 | LeBeau et al. |
| 8,325,909 B2 | 12/2012 | Tashev et al. |
| 8,340,975 B1 | 12/2012 | Rosenberger |
| 8,385,557 B2 | 2/2013 | Tashev et al. |
| 8,386,523 B2 | 2/2013 | Mody et al. |
| 8,423,893 B2 | 4/2013 | Ramsay et al. |
| 8,428,758 B2 | 4/2013 | Naik et al. |
| 8,473,618 B2 | 6/2013 | Spear et al. |
| 8,489,398 B1 | 7/2013 | Gruenstein |
| 8,566,722 B2 | 10/2013 | Gordon et al. |
| 8,588,849 B2 | 11/2013 | Patterson et al. |
| 8,594,320 B2 | 11/2013 | Faller |
| 8,620,232 B2 | 12/2013 | Helsloot |
| 8,639,214 B1 | 1/2014 | Fujisaki |
| 8,676,273 B1 | 3/2014 | Fujisaki |
| 8,719,039 B1 | 5/2014 | Sharifi |
| 8,762,156 B2 | 6/2014 | Chen |
| 8,768,712 B1 | 7/2014 | Sharifi |
| 8,798,995 B1 | 8/2014 | Edara |
| 8,898,063 B1 | 11/2014 | Sykes et al. |
| 8,983,383 B1 | 3/2015 | Haskin |
| 9,002,024 B2 | 4/2015 | Nakadai et al. |
| 9,047,857 B1 | 6/2015 | Barton |
| 9,070,367 B1 | 6/2015 | Hoffmeister et al. |
| 9,088,336 B2 | 7/2015 | Mani et al. |
| 9,098,467 B1 | 8/2015 | Blanksteen et al. |
| 9,124,650 B2 | 9/2015 | Maharajh et al. |
| 9,148,742 B1 | 9/2015 | Koulomzin et al. |
| 9,183,845 B1 | 11/2015 | Gopalakrishnan et al. |
| 9,208,785 B2 | 12/2015 | Ben-David et al. |
| 9,226,088 B2 | 12/2015 | Pandey et al. |
| 9,275,637 B1 | 3/2016 | Salvador et al. |
| 9,313,317 B1 | 4/2016 | Lebeau et al. |
| 9,354,687 B2 | 5/2016 | Bansal et al. |
| 9,361,885 B2 | 6/2016 | Ganong, III et al. |
| 9,368,105 B1 | 6/2016 | Freed et al. |
| 9,390,708 B1 | 7/2016 | Hoffmeister |
| 9,401,058 B2 | 7/2016 | De La Fuente et al. |
| 9,431,021 B1 | 8/2016 | Scalise et al. |
| 9,431,029 B2 | 8/2016 | Yook et al. |
| 9,443,527 B1 | 9/2016 | Watanabe et al. |
| 9,491,033 B1 | 11/2016 | Soyannwo et al. |
| 9,514,747 B1 | 12/2016 | Bisani et al. |
| 9,532,139 B1 | 12/2016 | Lu et al. |
| 9,542,941 B1 | 1/2017 | Weksler et al. |
| 9,558,755 B1 | 1/2017 | Laroche et al. |
| 9,632,748 B2 | 4/2017 | Faaborg et al. |
| 9,640,194 B1 | 5/2017 | Nemala et al. |
| 9,648,564 B1 | 5/2017 | Cui et al. |
| 9,672,812 B1 | 6/2017 | Watanabe et al. |
| 9,691,378 B1 | 6/2017 | Meyers et al. |
| 9,691,384 B1 | 6/2017 | Wang et al. |
| 9,706,320 B2 | 7/2017 | Starobin et al. |
| 9,749,738 B1 | 8/2017 | Adsumilli et al. |
| 9,756,422 B2 | 9/2017 | Paquier et al. |
| 9,767,786 B2 | 9/2017 | Starobin et al. |
| 9,779,725 B2 | 10/2017 | Sun et al. |
| 9,779,732 B2 | 10/2017 | Lee et al. |
| 9,779,734 B2 | 10/2017 | Lee |
| 9,781,532 B2 | 10/2017 | Sheen |
| 9,799,330 B2 | 10/2017 | Nemala et al. |
| 9,805,733 B2 | 10/2017 | Park |
| 9,812,128 B2 | 11/2017 | Mixter et al. |
| 9,818,407 B1 | 11/2017 | Secker-Walker et al. |
| 9,842,584 B1 | 12/2017 | Hart et al. |
| 9,865,264 B2 | 1/2018 | Gelfenbeyn et al. |
| 9,875,740 B1 | 1/2018 | Kumar et al. |
| 9,898,250 B1 | 2/2018 | Williams et al. |
| 9,899,021 B1 | 2/2018 | Vitaladevuni et al. |
| 9,900,723 B1 | 2/2018 | Choisel et al. |
| 9,916,839 B1 | 3/2018 | Scalise et al. |
| 9,940,930 B1 | 4/2018 | Campbell et al. |
| 9,972,343 B1 | 5/2018 | Thorson et al. |
| 9,979,560 B2 | 5/2018 | Kim et al. |
| 9,992,642 B1 | 6/2018 | Rapp et al. |
| 9,997,151 B1 | 6/2018 | Ayrapetian et al. |
| 10,002,259 B1 | 6/2018 | Mai |
| 10,028,069 B1 | 7/2018 | Lang |
| 10,038,419 B1 | 7/2018 | Elliot et al. |
| 10,074,371 B1 | 9/2018 | Wang et al. |
| 10,089,981 B1 | 10/2018 | Elangovan et al. |
| 10,097,919 B2 | 10/2018 | Jarvis et al. |
| 10,108,393 B2 | 10/2018 | Millington et al. |
| 10,115,400 B2 | 10/2018 | Wilberding |
| 10,116,748 B2 | 10/2018 | Farmer et al. |
| 10,127,908 B1 | 11/2018 | Deller et al. |
| 10,134,388 B1 | 11/2018 | Lilly |
| 10,134,398 B2 | 11/2018 | Sharifi |
| 10,134,399 B2 | 11/2018 | Lang et al. |
| 10,152,969 B2 | 12/2018 | Reilly et al. |
| 10,157,042 B1 * | 12/2018 | Jayakumar ............ H04R 27/00 |
| 10,186,266 B1 | 1/2019 | Devaraj et al. |
| 10,186,276 B2 | 1/2019 | Dewasurendra et al. |
| 10,204,624 B1 | 2/2019 | Knudson et al. |
| 10,229,680 B1 | 3/2019 | Gillespie et al. |
| 10,248,376 B2 | 4/2019 | Keyser-Allen et al. |
| 10,249,205 B2 | 4/2019 | Hammersley et al. |
| 10,304,440 B1 | 5/2019 | Panchapagesan et al. |
| 10,304,475 B1 | 5/2019 | Wang et al. |
| 10,318,236 B1 | 6/2019 | Pal et al. |
| 10,332,508 B1 | 6/2019 | Hoffmeister |
| 10,339,957 B1 | 7/2019 | Chenier et al. |
| 10,354,658 B2 | 7/2019 | Wilberding |
| 10,365,887 B1 | 7/2019 | Mulherkar |
| 10,424,296 B2 | 9/2019 | Penilla et al. |
| 10,433,058 B1 | 10/2019 | Torgerson et al. |
| 10,445,365 B2 | 10/2019 | Luke et al. |
| 10,482,899 B2 | 11/2019 | Ramprashad et al. |
| 10,510,340 B1 | 12/2019 | Fu et al. |
| 10,510,362 B2 | 12/2019 | Hicks et al. |
| 10,515,625 B1 | 12/2019 | Metallinou et al. |
| 10,555,077 B2 | 2/2020 | Jarvis |
| 10,565,998 B2 | 2/2020 | Wilberding |
| 10,565,999 B2 | 2/2020 | Wilberding |
| 10,567,515 B1 | 2/2020 | Bao |
| 10,567,900 B2 | 2/2020 | Tanaka et al. |
| 10,573,312 B1 | 2/2020 | Thomson et al. |
| 10,573,321 B1 | 2/2020 | Smith et al. |
| 10,586,534 B1 | 3/2020 | Argyropoulos et al. |
| 10,593,328 B1 | 3/2020 | Wang et al. |
| 10,593,330 B2 | 3/2020 | Sharifi |
| 10,599,287 B2 | 3/2020 | Kumar et al. |
| 10,600,406 B1 | 3/2020 | Shapiro et al. |

(56) References Cited

U.S. PATENT DOCUMENTS

| | | |
|---|---|---|
| 10,602,268 B1 | 3/2020 | Soto |
| 10,623,811 B1 | 4/2020 | Cwik |
| 10,643,609 B1 | 5/2020 | Pogue et al. |
| 10,685,669 B1 | 6/2020 | Lan et al. |
| 10,699,711 B2 | 6/2020 | Reilly |
| 10,706,843 B1 | 7/2020 | Elangovan et al. |
| 10,720,173 B2 | 7/2020 | Freeman et al. |
| 10,728,196 B2 | 7/2020 | Wang |
| 10,735,870 B2 | 8/2020 | Ballande et al. |
| 10,746,840 B1 | 8/2020 | Barton et al. |
| 10,777,189 B1 | 9/2020 | Fu et al. |
| 10,777,203 B1 | 9/2020 | Pasko |
| 10,789,041 B2 | 9/2020 | Kim et al. |
| 10,797,667 B2 | 10/2020 | Fish et al. |
| 10,811,015 B2 | 10/2020 | Smith et al. |
| 10,817,249 B2 | 10/2020 | Tanaka et al. |
| 10,824,682 B2 | 11/2020 | Alvares et al. |
| 10,825,471 B2 | 11/2020 | Walley et al. |
| 10,837,667 B2 | 11/2020 | Nelson et al. |
| 10,847,137 B1 | 11/2020 | Mandal et al. |
| 10,847,149 B1 | 11/2020 | Mok et al. |
| 10,847,164 B2 | 11/2020 | Wilberding |
| 10,867,596 B2 | 12/2020 | Yoneda et al. |
| 10,867,604 B2 | 12/2020 | Smith et al. |
| 10,871,943 B1 | 12/2020 | D'Amato et al. |
| 10,878,811 B2 | 12/2020 | Smith et al. |
| 10,878,826 B2 | 12/2020 | Li et al. |
| 10,885,091 B1 | 1/2021 | Meng et al. |
| 10,964,314 B2 | 3/2021 | Jazi et al. |
| 11,024,311 B2 | 6/2021 | Mixter et al. |
| 11,025,569 B2 | 6/2021 | Lind et al. |
| 11,050,615 B2 | 6/2021 | Mathews et al. |
| 11,062,705 B2 | 7/2021 | Watanabe et al. |
| 11,095,978 B2 | 8/2021 | Gigandet et al. |
| 11,100,923 B2 | 8/2021 | Fainberg et al. |
| 11,137,979 B2 | 10/2021 | Plagge |
| 11,138,969 B2 | 10/2021 | D'Amato |
| 11,140,494 B2 | 10/2021 | Pedersen et al. |
| 11,159,878 B1 | 10/2021 | Chatlani et al. |
| 11,172,328 B2 | 11/2021 | Soto et al. |
| 11,172,329 B2 | 11/2021 | Soto et al. |
| 11,175,880 B2 | 11/2021 | Liu et al. |
| 11,184,704 B2 | 11/2021 | Jarvis et al. |
| 11,184,969 B2 | 11/2021 | Lang et al. |
| 11,189,284 B2 | 11/2021 | Maeng |
| 11,206,052 B1 | 12/2021 | Park et al. |
| 11,212,612 B2 | 12/2021 | Lang et al. |
| 11,264,019 B2 | 3/2022 | Bhattacharya et al. |
| 11,277,512 B1 | 3/2022 | Leeds et al. |
| 11,295,754 B2 | 4/2022 | Eubank et al. |
| 11,302,326 B2 | 4/2022 | Sereshki |
| 11,315,556 B2 | 4/2022 | Smith et al. |
| 11,354,092 B2 | 6/2022 | D'Amato et al. |
| 11,361,763 B1 | 6/2022 | Maas et al. |
| 11,373,645 B1 | 6/2022 | Mathew et al. |
| 11,411,763 B2 | 8/2022 | Mackay et al. |
| 11,445,301 B2 | 9/2022 | Park et al. |
| 11,475,899 B2 | 10/2022 | Lesso |
| 11,514,898 B2 | 11/2022 | Millington |
| 11,531,520 B2 | 12/2022 | Wilberding |
| 11,532,306 B2 | 12/2022 | Kim et al. |
| 11,580,969 B2 | 2/2023 | Han et al. |
| 11,646,023 B2 | 5/2023 | Smith et al. |
| 11,664,023 B2 | 5/2023 | Reilly et al. |
| 11,694,689 B2 | 7/2023 | Smith |
| 11,696,074 B2 | 7/2023 | Woo et al. |
| 11,700,139 B2 | 7/2023 | Drake |
| 11,709,653 B1 | 7/2023 | Shin |
| 11,714,600 B2 | 8/2023 | D'Amato |
| 11,727,936 B2 | 8/2023 | Smith et al. |
| 11,769,505 B2 | 9/2023 | Sereshki |
| 11,790,937 B2 | 10/2023 | Smith et al. |
| 11,816,393 B2 | 11/2023 | Vega-Zayas et al. |
| 11,817,076 B2 | 11/2023 | Sereshki et al. |
| 11,832,068 B2 | 11/2023 | Jarvis et al. |
| 2001/0003173 A1 | 6/2001 | Lim |
| 2002/0046023 A1 | 4/2002 | Fujii et al. |
| 2002/0054685 A1 | 5/2002 | Avendano et al. |
| 2002/0055950 A1 | 5/2002 | Witteman |
| 2002/0143532 A1 | 10/2002 | McLean et al. |
| 2003/0070182 A1 | 4/2003 | Pierre et al. |
| 2003/0097482 A1 | 5/2003 | DeHart et al. |
| 2004/0093219 A1 | 5/2004 | Shin et al. |
| 2004/0128135 A1 | 7/2004 | Anastasakos et al. |
| 2004/0153321 A1 | 8/2004 | Chung et al. |
| 2004/0161082 A1 | 8/2004 | Brown et al. |
| 2005/0131558 A1 | 6/2005 | Braithwaite et al. |
| 2006/0104454 A1 | 5/2006 | Guitarte Perez et al. |
| 2006/0161964 A1 | 7/2006 | Chung |
| 2007/0033043 A1 | 2/2007 | Hyakumoto |
| 2007/0038461 A1 | 2/2007 | Abbott et al. |
| 2007/0038999 A1 | 2/2007 | Millington |
| 2007/0142944 A1 | 6/2007 | Goldberg et al. |
| 2007/0201639 A1 | 8/2007 | Park et al. |
| 2008/0146289 A1 | 6/2008 | Korneluk et al. |
| 2008/0160977 A1 | 7/2008 | Ahmaniemi et al. |
| 2008/0182518 A1 | 7/2008 | Lo |
| 2008/0192946 A1 | 8/2008 | Faller |
| 2008/0221897 A1 | 9/2008 | Cerra et al. |
| 2008/0248797 A1 | 10/2008 | Freeman et al. |
| 2008/0291916 A1 | 11/2008 | Xiong et al. |
| 2009/0013255 A1 | 1/2009 | Yuschik et al. |
| 2009/0113053 A1 | 4/2009 | Van Wie et al. |
| 2009/0191854 A1 | 7/2009 | Beason |
| 2009/0214048 A1 | 8/2009 | Stokes, III et al. |
| 2009/0220107 A1 | 9/2009 | Every et al. |
| 2009/0232481 A1 | 9/2009 | Baalbergen et al. |
| 2009/0299745 A1 | 12/2009 | Kennewick et al. |
| 2009/0323907 A1 | 12/2009 | Gupta et al. |
| 2009/0323924 A1 | 12/2009 | Tashev et al. |
| 2009/0326949 A1 | 12/2009 | Douthitt et al. |
| 2010/0041443 A1 | 2/2010 | Yokota |
| 2010/0070276 A1 | 3/2010 | Wasserblat et al. |
| 2010/0088100 A1 | 4/2010 | Lindahl |
| 2010/0179806 A1 | 7/2010 | Zhang et al. |
| 2010/0260348 A1 | 10/2010 | Bhow et al. |
| 2010/0299639 A1 | 11/2010 | Ramsay et al. |
| 2010/0329472 A1 | 12/2010 | Nakadai et al. |
| 2010/0332236 A1 | 12/2010 | Tan |
| 2011/0019833 A1 | 1/2011 | Kuech et al. |
| 2011/0044461 A1 | 2/2011 | Kuech et al. |
| 2011/0046952 A1 | 2/2011 | Koshinaka |
| 2011/0066634 A1 | 3/2011 | Phillips et al. |
| 2011/0131032 A1 | 6/2011 | Yang, II et al. |
| 2011/0176687 A1 | 7/2011 | Birkenes |
| 2011/0202924 A1 | 8/2011 | Banguero et al. |
| 2011/0216093 A1 | 9/2011 | Griffin |
| 2011/0267985 A1 | 11/2011 | Wilkinson et al. |
| 2012/0009906 A1 | 1/2012 | Patterson et al. |
| 2012/0020485 A1 | 1/2012 | Msser et al. |
| 2012/0027218 A1 | 2/2012 | Every et al. |
| 2012/0076308 A1 | 3/2012 | Kuech et al. |
| 2012/0078635 A1 | 3/2012 | Rothkopf et al. |
| 2012/0086568 A1 | 4/2012 | Scott et al. |
| 2012/0224457 A1 | 9/2012 | Kim et al. |
| 2012/0237047 A1 | 9/2012 | Neal et al. |
| 2012/0245941 A1 | 9/2012 | Cheyer |
| 2012/0265528 A1 | 10/2012 | Gruber et al. |
| 2013/0073293 A1 | 3/2013 | Jang et al. |
| 2013/0080146 A1 | 3/2013 | Kato et al. |
| 2013/0080167 A1 | 3/2013 | Mozer |
| 2013/0080171 A1 | 3/2013 | Mozer et al. |
| 2013/0129100 A1 | 5/2013 | Sorensen |
| 2013/0171930 A1 | 7/2013 | Anand et al. |
| 2013/0185639 A1 | 7/2013 | Lim |
| 2013/0230184 A1 | 9/2013 | Kuech et al. |
| 2013/0238326 A1 | 9/2013 | Kim et al. |
| 2013/0283169 A1 | 10/2013 | Van Wie |
| 2013/0289994 A1 | 10/2013 | Newman et al. |
| 2013/0294611 A1 | 11/2013 | Yoo et al. |
| 2013/0301840 A1 | 11/2013 | Yemdji et al. |
| 2013/0308794 A1 | 11/2013 | Jochim et al. |
| 2013/0322462 A1 | 12/2013 | Poulsen |
| 2013/0322634 A1 | 12/2013 | Bennett et al. |

(56) References Cited

U.S. PATENT DOCUMENTS

| | | |
|---|---|---|
| 2013/0336499 A1 | 12/2013 | Beckhardt et al. |
| 2013/0339028 A1 | 12/2013 | Rosner et al. |
| 2014/0006825 A1 | 1/2014 | Shenhav |
| 2014/0056435 A1 | 2/2014 | Kjems et al. |
| 2014/0064476 A1 | 3/2014 | Mani et al. |
| 2014/0094151 A1 | 4/2014 | Klappert et al. |
| 2014/0108010 A1 | 4/2014 | Maltseff et al. |
| 2014/0112502 A1 | 4/2014 | Lee |
| 2014/0122075 A1 | 5/2014 | Bak et al. |
| 2014/0122092 A1 | 5/2014 | Goldstein |
| 2014/0126745 A1 | 5/2014 | Dickins et al. |
| 2014/0149118 A1 | 5/2014 | Lee et al. |
| 2014/0159581 A1 | 6/2014 | Pruemmer et al. |
| 2014/0161263 A1 | 6/2014 | Koishida et al. |
| 2014/0167929 A1 | 6/2014 | Shim et al. |
| 2014/0172899 A1 | 6/2014 | Hakkani-Tur et al. |
| 2014/0180697 A1 | 6/2014 | Torok et al. |
| 2014/0181199 A1* | 6/2014 | Kumar .................. H04W 4/021 709/204 |
| 2014/0188476 A1 | 7/2014 | Li et al. |
| 2014/0200881 A1 | 7/2014 | Chatlani |
| 2014/0214429 A1 | 7/2014 | Pantel |
| 2014/0222436 A1 | 8/2014 | Binder et al. |
| 2014/0229959 A1 | 8/2014 | Beckhardt et al. |
| 2014/0244269 A1 | 8/2014 | Tokutake |
| 2014/0244712 A1 | 8/2014 | Walters et al. |
| 2014/0253676 A1 | 9/2014 | Nagase et al. |
| 2014/0270216 A1 | 9/2014 | Tsilfidis et al. |
| 2014/0270248 A1 | 9/2014 | Ivanov et al. |
| 2014/0274203 A1 | 9/2014 | Ganong, III et al. |
| 2014/0278343 A1 | 9/2014 | Tran |
| 2014/0278372 A1 | 9/2014 | Nakadai et al. |
| 2014/0278445 A1 | 9/2014 | Eddington, Jr. |
| 2014/0278933 A1 | 9/2014 | McMillan |
| 2014/0288686 A1 | 9/2014 | Sant et al. |
| 2014/0303969 A1 | 10/2014 | Inose et al. |
| 2014/0310002 A1 | 10/2014 | Nitz et al. |
| 2014/0328490 A1 | 11/2014 | Mohammad et al. |
| 2014/0334645 A1 | 11/2014 | Yun et al. |
| 2014/0358535 A1 | 12/2014 | Lee et al. |
| 2014/0363022 A1 | 12/2014 | Dizon et al. |
| 2014/0364089 A1 | 12/2014 | Lienhart et al. |
| 2014/0365225 A1 | 12/2014 | Haiut |
| 2014/0368734 A1 | 12/2014 | Hoffert et al. |
| 2015/0006176 A1 | 1/2015 | Pogue et al. |
| 2015/0006184 A1 | 1/2015 | Marti et al. |
| 2015/0018992 A1 | 1/2015 | Griffiths et al. |
| 2015/0032443 A1 | 1/2015 | Karov et al. |
| 2015/0032456 A1 | 1/2015 | Wait |
| 2015/0039303 A1 | 2/2015 | Lesso et al. |
| 2015/0039310 A1 | 2/2015 | Clark et al. |
| 2015/0039311 A1 | 2/2015 | Clark et al. |
| 2015/0039317 A1 | 2/2015 | Klein et al. |
| 2015/0051723 A1 | 2/2015 | Bates et al. |
| 2015/0058018 A1 | 2/2015 | Georges et al. |
| 2015/0073807 A1 | 3/2015 | Kumar |
| 2015/0086034 A1 | 3/2015 | Lombardi et al. |
| 2015/0106085 A1 | 4/2015 | Lindahl |
| 2015/0112672 A1 | 4/2015 | Giacobello et al. |
| 2015/0112689 A1 | 4/2015 | Nandy et al. |
| 2015/0124975 A1 | 5/2015 | Pontoppidan |
| 2015/0126255 A1 | 5/2015 | Yang et al. |
| 2015/0154953 A1 | 6/2015 | Bapat et al. |
| 2015/0154954 A1 | 6/2015 | Sharifi |
| 2015/0200923 A1 | 7/2015 | Triplett |
| 2015/0215382 A1 | 7/2015 | Arora et al. |
| 2015/0221307 A1 | 8/2015 | Shah et al. |
| 2015/0222563 A1 | 8/2015 | Burns et al. |
| 2015/0243287 A1 | 8/2015 | Nakano et al. |
| 2015/0248885 A1 | 9/2015 | Koulomzin |
| 2015/0279351 A1 | 10/2015 | Nguyen et al. |
| 2015/0355878 A1* | 12/2015 | Corbin .................... G06F 16/64 700/94 |
| 2015/0356968 A1 | 12/2015 | Rice et al. |
| 2015/0370531 A1 | 12/2015 | Faaborg |
| 2015/0373100 A1 | 12/2015 | Kravets et al. |
| 2015/0380010 A1 | 12/2015 | Srinivasan |
| 2015/0382047 A1 | 12/2015 | Van Os et al. |
| 2015/0382128 A1 | 12/2015 | Ridihalgh et al. |
| 2016/0014536 A1 | 1/2016 | Sheen |
| 2016/0027440 A1 | 1/2016 | Gelfenbeyn et al. |
| 2016/0034448 A1 | 2/2016 | Tran |
| 2016/0050488 A1 | 2/2016 | Matheja et al. |
| 2016/0055847 A1 | 2/2016 | Dahan |
| 2016/0055850 A1 | 2/2016 | Nakadai et al. |
| 2016/0066087 A1 | 3/2016 | Solbach et al. |
| 2016/0070526 A1 | 3/2016 | Sheen |
| 2016/0077710 A1 | 3/2016 | Lewis et al. |
| 2016/0077794 A1 | 3/2016 | Kim et al. |
| 2016/0078864 A1 | 3/2016 | Palanisamy et al. |
| 2016/0093281 A1 | 3/2016 | Kuo et al. |
| 2016/0098393 A1 | 4/2016 | Hebert |
| 2016/0098992 A1 | 4/2016 | Renard et al. |
| 2016/0104480 A1 | 4/2016 | Sharifi |
| 2016/0118048 A1 | 4/2016 | Heide |
| 2016/0133259 A1 | 5/2016 | Rubin et al. |
| 2016/0134924 A1 | 5/2016 | Bush et al. |
| 2016/0140957 A1 | 5/2016 | Duta et al. |
| 2016/0148612 A1 | 5/2016 | Guo et al. |
| 2016/0148615 A1 | 5/2016 | Lee et al. |
| 2016/0154089 A1 | 6/2016 | Altman |
| 2016/0155443 A1 | 6/2016 | Khan et al. |
| 2016/0171976 A1 | 6/2016 | Sun et al. |
| 2016/0189716 A1 | 6/2016 | Lindahl et al. |
| 2016/0192099 A1 | 6/2016 | Oishi et al. |
| 2016/0212488 A1 | 7/2016 | Os et al. |
| 2016/0217789 A1 | 7/2016 | Lee et al. |
| 2016/0241976 A1 | 8/2016 | Pearson |
| 2016/0299737 A1 | 10/2016 | Clayton et al. |
| 2016/0314782 A1 | 10/2016 | Klimanis |
| 2016/0316502 A1 | 10/2016 | DeCicco |
| 2016/0322045 A1 | 11/2016 | Hatfield et al. |
| 2016/0335485 A1 | 11/2016 | Kim |
| 2016/0379634 A1 | 12/2016 | Yamamoto et al. |
| 2016/0379635 A1 | 12/2016 | Page |
| 2017/0032244 A1 | 2/2017 | Kurata |
| 2017/0053648 A1 | 2/2017 | Chi |
| 2017/0053650 A1 | 2/2017 | Ogawa |
| 2017/0060526 A1 | 3/2017 | Barton et al. |
| 2017/0070826 A1 | 3/2017 | Pedersen et al. |
| 2017/0076212 A1 | 3/2017 | Shams et al. |
| 2017/0076720 A1 | 3/2017 | Gopalan et al. |
| 2017/0076726 A1 | 3/2017 | Bae |
| 2017/0083285 A1 | 3/2017 | Meyers et al. |
| 2017/0083606 A1 | 3/2017 | Mohan |
| 2017/0084278 A1 | 3/2017 | Jung |
| 2017/0084292 A1 | 3/2017 | Yoo |
| 2017/0090864 A1 | 3/2017 | Jorgovanovic |
| 2017/0094215 A1 | 3/2017 | Western |
| 2017/0103748 A1 | 4/2017 | Weissberg et al. |
| 2017/0103754 A1 | 4/2017 | Higbie et al. |
| 2017/0103755 A1 | 4/2017 | Jeon et al. |
| 2017/0110130 A1 | 4/2017 | Sharifi et al. |
| 2017/0110144 A1 | 4/2017 | Sharifi et al. |
| 2017/0133011 A1 | 5/2017 | Chen et al. |
| 2017/0140449 A1 | 5/2017 | Kannan |
| 2017/0140750 A1 | 5/2017 | Wang et al. |
| 2017/0140757 A1 | 5/2017 | Penilla et al. |
| 2017/0140759 A1 | 5/2017 | Kumar et al. |
| 2017/0151930 A1 | 6/2017 | Boesen |
| 2017/0164139 A1 | 6/2017 | Deselaers et al. |
| 2017/0180561 A1 | 6/2017 | Kadiwala et al. |
| 2017/0186425 A1 | 6/2017 | Dawes et al. |
| 2017/0186427 A1 | 6/2017 | Wang et al. |
| 2017/0236512 A1 | 8/2017 | Williams et al. |
| 2017/0242651 A1 | 8/2017 | Lang et al. |
| 2017/0242653 A1 | 8/2017 | Lang et al. |
| 2017/0242656 A1 | 8/2017 | Plagge et al. |
| 2017/0242657 A1 | 8/2017 | Jarvis et al. |
| 2017/0243587 A1 | 8/2017 | Plagge et al. |
| 2017/0245076 A1 | 8/2017 | Kusano et al. |
| 2017/0269900 A1 | 9/2017 | Triplett |
| 2017/0269975 A1 | 9/2017 | Wood et al. |
| 2017/0270919 A1 | 9/2017 | Parthasarathi et al. |

(56) References Cited

U.S. PATENT DOCUMENTS

| | | |
|---|---|---|
| 2017/0287496 A1 | 10/2017 | Heitkamp et al. |
| 2017/0300289 A1 | 10/2017 | Gattis |
| 2017/0300990 A1 | 10/2017 | Tanaka et al. |
| 2017/0329397 A1 | 11/2017 | Lin |
| 2017/0331869 A1 | 11/2017 | Bendahan et al. |
| 2017/0332035 A1 | 11/2017 | Shah et al. |
| 2017/0332168 A1 | 11/2017 | Moghimi et al. |
| 2017/0337932 A1 | 11/2017 | Iyengar et al. |
| 2017/0353789 A1 | 12/2017 | Kim et al. |
| 2017/0357390 A1 | 12/2017 | Alonso Ruiz et al. |
| 2017/0357475 A1* | 12/2017 | Lee .................. G05B 15/02 |
| 2017/0358313 A1 | 12/2017 | Shih |
| 2017/0364371 A1 | 12/2017 | Nandi et al. |
| 2017/0365247 A1 | 12/2017 | Ushakov |
| 2018/0012077 A1 | 1/2018 | Laska et al. |
| 2018/0018965 A1 | 1/2018 | Daley |
| 2018/0033428 A1 | 2/2018 | Kim et al. |
| 2018/0033429 A1 | 2/2018 | Makke et al. |
| 2018/0033438 A1 | 2/2018 | Toma et al. |
| 2018/0040324 A1 | 2/2018 | Wilberding |
| 2018/0061396 A1 | 3/2018 | Srinivasan et al. |
| 2018/0061409 A1 | 3/2018 | Valentine et al. |
| 2018/0061419 A1 | 3/2018 | Melendo Casado et al. |
| 2018/0061420 A1 | 3/2018 | Patil et al. |
| 2018/0084367 A1 | 3/2018 | Greff et al. |
| 2018/0091898 A1 | 3/2018 | Yoon et al. |
| 2018/0091913 A1 | 3/2018 | Hartung et al. |
| 2018/0096678 A1 | 4/2018 | Zhou et al. |
| 2018/0108351 A1 | 4/2018 | Beckhardt et al. |
| 2018/0120947 A1 | 5/2018 | Wells et al. |
| 2018/0132298 A1 | 5/2018 | Birnam et al. |
| 2018/0137857 A1 | 5/2018 | Zhou et al. |
| 2018/0139512 A1 | 5/2018 | Moran et al. |
| 2018/0165055 A1 | 6/2018 | Yu et al. |
| 2018/0167981 A1 | 6/2018 | Jonna et al. |
| 2018/0182383 A1 | 6/2018 | Kim et al. |
| 2018/0182390 A1 | 6/2018 | Hughes et al. |
| 2018/0182397 A1 | 6/2018 | Carbune et al. |
| 2018/0182410 A1 | 6/2018 | Kaskari et al. |
| 2018/0188948 A1 | 7/2018 | Ouyang et al. |
| 2018/0196776 A1 | 7/2018 | Hershko et al. |
| 2018/0197533 A1 | 7/2018 | Lyon et al. |
| 2018/0199130 A1 | 7/2018 | Jaffe et al. |
| 2018/0204569 A1 | 7/2018 | Nadkar et al. |
| 2018/0211665 A1 | 7/2018 | Park et al. |
| 2018/0228006 A1 | 8/2018 | Baker et al. |
| 2018/0233137 A1* | 8/2018 | Torok .................. G06F 3/167 |
| 2018/0233139 A1 | 8/2018 | Finkelstein et al. |
| 2018/0233141 A1 | 8/2018 | Solomon et al. |
| 2018/0260680 A1 | 9/2018 | Finkelstein et al. |
| 2018/0270573 A1 | 9/2018 | Lang et al. |
| 2018/0270575 A1 | 9/2018 | Akutagawa |
| 2018/0277107 A1 | 9/2018 | Kim |
| 2018/0277113 A1 | 9/2018 | Hartung et al. |
| 2018/0277119 A1 | 9/2018 | Baba et al. |
| 2018/0286394 A1 | 10/2018 | Li et al. |
| 2018/0286414 A1 | 10/2018 | Ravindran et al. |
| 2018/0293221 A1 | 10/2018 | Finkelstein et al. |
| 2018/0301147 A1 | 10/2018 | Kim |
| 2018/0314552 A1 | 11/2018 | Kim et al. |
| 2018/0330589 A1 | 11/2018 | Horling |
| 2018/0330727 A1 | 11/2018 | Tulli |
| 2018/0336892 A1 | 11/2018 | Kim et al. |
| 2018/0349093 A1 | 12/2018 | McCarty et al. |
| 2018/0350356 A1 | 12/2018 | Garcia |
| 2018/0350379 A1 | 12/2018 | Wung et al. |
| 2018/0352014 A1* | 12/2018 | Alsina .................. H04N 21/262 |
| 2018/0352334 A1 | 12/2018 | Family et al. |
| 2018/0356962 A1 | 12/2018 | Corbin |
| 2018/0358009 A1 | 12/2018 | Daley et al. |
| 2018/0358019 A1 | 12/2018 | Mont-Reynaud |
| 2018/0365567 A1 | 12/2018 | Kolavennu et al. |
| 2018/0367944 A1 | 12/2018 | Heo et al. |
| 2019/0013019 A1 | 1/2019 | Lawrence |
| 2019/0014592 A1 | 1/2019 | Hampel et al. |
| 2019/0019112 A1 | 1/2019 | Gelfenbeyn et al. |
| 2019/0035404 A1 | 1/2019 | Gabel et al. |
| 2019/0037173 A1 | 1/2019 | Lee |
| 2019/0043488 A1 | 2/2019 | Bocklet et al. |
| 2019/0044745 A1 | 2/2019 | Knudson et al. |
| 2019/0051298 A1 | 2/2019 | Lee et al. |
| 2019/0051299 A1 | 2/2019 | Ossowski et al. |
| 2019/0066680 A1 | 2/2019 | Woo et al. |
| 2019/0066710 A1 | 2/2019 | Bryan et al. |
| 2019/0073999 A1 | 3/2019 | Prémont et al. |
| 2019/0079724 A1 | 3/2019 | Feuz et al. |
| 2019/0081507 A1 | 3/2019 | Ide |
| 2019/0081810 A1 | 3/2019 | Jung |
| 2019/0087455 A1 | 3/2019 | He et al. |
| 2019/0098400 A1 | 3/2019 | Buoni et al. |
| 2019/0104119 A1 | 4/2019 | Giorgi et al. |
| 2019/0104373 A1 | 4/2019 | Wodrich et al. |
| 2019/0108839 A1 | 4/2019 | Reilly et al. |
| 2019/0122662 A1 | 4/2019 | Chang et al. |
| 2019/0130906 A1 | 5/2019 | Kobayashi et al. |
| 2019/0147860 A1 | 5/2019 | Chen et al. |
| 2019/0156847 A1 | 5/2019 | Bryan et al. |
| 2019/0163153 A1 | 5/2019 | Price et al. |
| 2019/0172452 A1 | 6/2019 | Smith et al. |
| 2019/0172467 A1 | 6/2019 | Kim et al. |
| 2019/0172476 A1 | 6/2019 | Wung et al. |
| 2019/0182072 A1 | 6/2019 | Roe et al. |
| 2019/0186937 A1 | 6/2019 | Sharifi et al. |
| 2019/0188328 A1 | 6/2019 | Oyenan et al. |
| 2019/0189117 A1 | 6/2019 | Kumar |
| 2019/0206391 A1 | 7/2019 | Busch et al. |
| 2019/0206405 A1 | 7/2019 | Gillespie et al. |
| 2019/0206412 A1 | 7/2019 | Li et al. |
| 2019/0237067 A1 | 8/2019 | Friedman et al. |
| 2019/0237069 A1 | 8/2019 | Zhao et al. |
| 2019/0237089 A1 | 8/2019 | Shin |
| 2019/0244608 A1 | 8/2019 | Choi et al. |
| 2019/0251960 A1 | 8/2019 | Maker et al. |
| 2019/0259408 A1 | 8/2019 | Freeman et al. |
| 2019/0281387 A1 | 9/2019 | Woo et al. |
| 2019/0287536 A1 | 9/2019 | Sharifi et al. |
| 2019/0288970 A1 | 9/2019 | Siddiq |
| 2019/0289367 A1 | 9/2019 | Siddiq |
| 2019/0295542 A1 | 9/2019 | Huang et al. |
| 2019/0295555 A1 | 9/2019 | Wilberding |
| 2019/0295556 A1 | 9/2019 | Wilberding |
| 2019/0295563 A1 | 9/2019 | Kamdar et al. |
| 2019/0311715 A1 | 10/2019 | Pfeffinger et al. |
| 2019/0311718 A1 | 10/2019 | Huber et al. |
| 2019/0311720 A1 | 10/2019 | Pasko |
| 2019/0311722 A1 | 10/2019 | Caldwell |
| 2019/0318729 A1 | 10/2019 | Chao et al. |
| 2019/0325870 A1 | 10/2019 | Mitic |
| 2019/0325888 A1 | 10/2019 | Geng |
| 2019/0341037 A1 | 11/2019 | Bromand et al. |
| 2019/0341038 A1 | 11/2019 | Bromand et al. |
| 2019/0348044 A1 | 11/2019 | Chun et al. |
| 2019/0362714 A1 | 11/2019 | Mori et al. |
| 2019/0371324 A1 | 12/2019 | Powell et al. |
| 2019/0371329 A1 | 12/2019 | D'Souza et al. |
| 2019/0371342 A1 | 12/2019 | Tukka et al. |
| 2019/0392832 A1 | 12/2019 | Mitsui et al. |
| 2020/0007987 A1 | 1/2020 | Woo et al. |
| 2020/0034492 A1 | 1/2020 | Verbeke et al. |
| 2020/0043489 A1 | 2/2020 | Bradley et al. |
| 2020/0043494 A1 | 2/2020 | Maeng |
| 2020/0051554 A1 | 2/2020 | Kim et al. |
| 2020/0066279 A1 | 2/2020 | Kang et al. |
| 2020/0074990 A1 | 3/2020 | Kim et al. |
| 2020/0075018 A1 | 3/2020 | Chen |
| 2020/0089469 A1 | 3/2020 | Wilberding et al. |
| 2020/0090646 A1 | 3/2020 | Smith et al. |
| 2020/0090647 A1 | 3/2020 | Kurtz |
| 2020/0098354 A1 | 3/2020 | Lin et al. |
| 2020/0105245 A1 | 4/2020 | Gupta et al. |
| 2020/0105264 A1 | 4/2020 | Jang et al. |
| 2020/0110571 A1 | 4/2020 | Liu et al. |
| 2020/0125162 A1 | 4/2020 | D'Amato et al. |
| 2020/0135194 A1 | 4/2020 | Jeong |

(56) References Cited

U.S. PATENT DOCUMENTS

| | | |
|---|---|---|
| 2020/0135224 A1 | 4/2020 | Bromand et al. |
| 2020/0167597 A1 | 5/2020 | Nguyen et al. |
| 2020/0184980 A1 | 6/2020 | Wilberding |
| 2020/0211539 A1 | 7/2020 | Lee |
| 2020/0211550 A1 | 7/2020 | Pan et al. |
| 2020/0234709 A1 | 7/2020 | Kunitake |
| 2020/0244650 A1 | 7/2020 | Burris et al. |
| 2020/0265838 A1 | 8/2020 | Lee et al. |
| 2020/0265842 A1 | 8/2020 | Singh |
| 2020/0310751 A1 | 10/2020 | Anand et al. |
| 2020/0342869 A1 | 10/2020 | Lee et al. |
| 2020/0364026 A1 | 11/2020 | Lee et al. |
| 2020/0409926 A1 | 12/2020 | Srinivasan et al. |
| 2021/0029452 A1 | 1/2021 | Tsoi et al. |
| 2021/0067867 A1 | 3/2021 | Kagoshima |
| 2021/0118439 A1 | 4/2021 | Schillmoeller et al. |
| 2021/0134280 A1 | 5/2021 | Kurtz |
| 2021/0157542 A1 | 5/2021 | De Assis et al. |
| 2021/0166680 A1 | 6/2021 | Jung et al. |
| 2021/0183366 A1 | 6/2021 | Reinspach et al. |
| 2021/0239831 A1 | 8/2021 | Shin et al. |
| 2021/0249004 A1 | 8/2021 | Smith |
| 2021/0280185 A1 | 9/2021 | Tan et al. |
| 2021/0287670 A1 | 9/2021 | Regan et al. |
| 2021/0295833 A1 | 9/2021 | Rastrow et al. |
| 2021/0295849 A1 | 9/2021 | Van Der Ven et al. |
| 2021/0358481 A1 | 11/2021 | D'Amato et al. |
| 2022/0035514 A1 | 2/2022 | Shin et al. |
| 2022/0036882 A1 | 2/2022 | Ahn et al. |
| 2022/0050585 A1 | 2/2022 | Fettes et al. |
| 2022/0083136 A1 | 3/2022 | DeLeeuw |
| 2022/0301561 A1 | 9/2022 | Robert Jose et al. |
| 2023/0019595 A1 | 1/2023 | Smith |
| 2023/0215433 A1 | 7/2023 | Myers et al. |
| 2023/0237998 A1 | 7/2023 | Smith et al. |
| 2023/0274738 A1 | 8/2023 | Smith et al. |
| 2023/0382349 A1 | 11/2023 | Ham |

FOREIGN PATENT DOCUMENTS

| | | |
|---|---|---|
| CN | 101427154 A | 5/2009 |
| CN | 101569093 A | 10/2009 |
| CN | 102999161 A | 3/2013 |
| CN | 104155938 A | 11/2014 |
| CN | 104572009 A | 4/2015 |
| CN | 104581510 A | 4/2015 |
| CN | 104885406 A | 9/2015 |
| CN | 104885438 A | 9/2015 |
| CN | 105101083 A | 11/2015 |
| CN | 105162886 A | 12/2015 |
| CN | 105284168 A | 1/2016 |
| CN | 105389099 A | 3/2016 |
| CN | 105427861 A | 3/2016 |
| CN | 105453179 A | 3/2016 |
| CN | 105472191 A | 4/2016 |
| CN | 105493179 A | 4/2016 |
| CN | 105493442 A | 4/2016 |
| CN | 105632486 A | 6/2016 |
| CN | 106030699 A | 10/2016 |
| CN | 106796784 A | 5/2017 |
| CN | 106910500 A | 6/2017 |
| CN | 107122158 A | 9/2017 |
| CN | 107465974 A | 12/2017 |
| CN | 107644313 A | 1/2018 |
| CN | 107767863 A | 3/2018 |
| CN | 107832837 A | 3/2018 |
| CN | 107919116 A | 4/2018 |
| CN | 108028047 A | 5/2018 |
| CN | 108028048 A | 5/2018 |
| CN | 108198548 A | 6/2018 |
| EP | 2683147 A1 | 1/2014 |
| EP | 3128767 A2 | 2/2017 |
| EP | 3133595 A1 | 2/2017 |
| EP | 3142107 A1 | 3/2017 |
| GB | 2501367 A | 10/2013 |
| JP | 2003223188 A | 8/2003 |
| JP | 2004096520 A | 3/2004 |
| JP | 2004109361 A | 4/2004 |
| JP | 2004163590 A | 6/2004 |
| JP | 2004354721 A | 12/2004 |
| JP | 2007235875 A | 9/2007 |
| JP | 2008217444 A | 9/2008 |
| JP | 2014510481 A | 4/2014 |
| JP | 2016009193 A | 1/2016 |
| JP | 2016024652 A | 2/2016 |
| JP | 2016095383 A | 5/2016 |
| JP | 2016524193 A | 8/2016 |
| JP | 2017072857 A | 4/2017 |
| JP | 2017129860 A | 7/2017 |
| JP | 2018055259 A | 4/2018 |
| JP | 2019109510 A | 7/2019 |
| KR | 100966415 B1 | 6/2010 |
| KR | 20120111130 A | 10/2012 |
| KR | 20130050987 A | 5/2013 |
| KR | 101284134 B1 | 7/2013 |
| KR | 20140111859 A | 9/2014 |
| KR | 20160005045 A | 1/2016 |
| KR | 20160007527 A | 1/2016 |
| KR | 20160101198 A | 8/2016 |
| KR | 20160145634 A | 12/2016 |
| TW | 201629950 A | 8/2016 |
| WO | 9731437 A1 | 8/1997 |
| WO | 2008096414 A1 | 8/2008 |
| WO | 2015133022 A1 | 9/2015 |
| WO | 2015195216 A1 | 12/2015 |
| WO | 2016003509 A1 | 1/2016 |
| WO | 2016014686 A1 | 1/2016 |
| WO | 2016022926 A1 | 2/2016 |
| WO | 2016057268 A1 | 4/2016 |
| WO | 2016085775 A2 | 6/2016 |
| WO | 2016136062 A1 | 9/2016 |
| WO | 2016171956 A1 | 10/2016 |
| WO | 2017058654 A1 | 4/2017 |
| WO | 2017147081 A1 | 8/2017 |
| WO | 2018027142 A1 | 2/2018 |
| WO | 2018064362 A1 | 4/2018 |
| WO | 2018140777 A1 | 8/2018 |
| WO | 2019005772 A1 | 1/2019 |
| WO | 2020006410 A1 | 1/2020 |
| WO | 2020061439 A1 | 3/2020 |
| WO | 2020068795 A1 | 4/2020 |
| WO | 2020132298 A1 | 6/2020 |
| WO | 2020252163 A1 | 12/2020 |

OTHER PUBLICATIONS

SmartThings.com, "Google Home Broadcasts" (Oct. 2017), pp. 1-7 [retrieved from https://community.smartthings.com/t/google-home-broadcasts/101416].*
Advisory Action mailed on Nov. 7, 2022, issued in connection with U.S. Appl. No. 16/168,389, filed Oct. 23, 2018, 4 pages.
Advisory Action mailed on Feb. 28, 2022, issued in connection with U.S. Appl. No. 16/813,643, filed Mar. 9, 2020, 3 pages.
Australian Patent Office, Australian Examination Report Action mailed on Nov. 10, 2022, issued in connection with Australian Application No. 2018312989, 2 pages.
Australian Patent Office, Australian Examination Report Action mailed on May 19, 2022, issued in connection with Australian Application No. 2021212112, 2 pages.
Australian Patent Office, Australian Examination Report Action mailed on Sep. 28, 2022, issued in connection with Australian Application No. 2018338812, 3 pages.
Australian Patent Office, Australian Examination Report Action mailed on Mar. 4, 2022, issued in connection with Australian Application No. 2021202786, 2 pages.
Canadian Patent Office, Canadian Examination Report mailed on Sep. 14, 2022, issued in connection with Canadian Application No. 3067776, 4 pages.
Canadian Patent Office, Canadian Examination Report mailed on Oct. 19, 2022, issued in connection with Canadian Application No. 3123601, 5 pages.

(56) References Cited

OTHER PUBLICATIONS

Canadian Patent Office, Canadian Examination Report mailed on Mar. 29, 2022, issued in connection with Canadian Application No. 3111322, 3 pages.
Canadian Patent Office, Canadian Examination Report mailed on Jun. 7, 2022, issued in connection with Canadian Application No. 3105494, 5 pages.
Chinese Patent Office, First Office Action and Translation mailed on Jun. 1, 2021, issued in connection with Chinese Application No. 201980089721.5, 21 pages.
Chinese Patent Office, First Office Action and Translation mailed on Feb. 9, 2023, issued in connection with Chinese Application No. 201880076788.0, 13 pages.
Chinese Patent Office, First Office Action and Translation mailed on Oct. 9, 2022, issued in connection with Chinese Application No. 201780056695.7, 10 pages.
Chinese Patent Office, First Office Action and Translation mailed on Nov. 10, 2022, issued in connection with Chinese Application No. 201980070006.7, 15 pages.
Chinese Patent Office, First Office Action and Translation mailed on Jan. 19, 2023, issued in connection with Chinese Application No. 201880064916.X, 10 pages.
Chinese Patent Office, First Office Action and Translation mailed on Sep. 19, 2022, issued in connection with Chinese Application No. 201980056604.9, 13 pages.
Chinese Patent Office, First Office Action and Translation mailed on Nov. 25, 2022, issued in connection with Chinese Application No. 201780056321.5, 8 pages.
Chinese Patent Office, First Office Action and Translation mailed on Feb. 27, 2023, issued in connection with Chinese Application No. 201980003798.6, 12 pages.
Chinese Patent Office, First Office Action and Translation mailed on Dec. 30, 2022, issued in connection with Chinese Application No. 201880076775.3, 10 pages.
Chinese Patent Office, Second Office Action and Translation mailed on Mar. 3, 2022, issued in connection with Chinese Application No. 201880077216.4, 11 pages.
Chinese Patent Office, Second Office Action and Translation mailed on Apr. 1, 2023, issued in connection with Chinese Application No. 201980056604.9, 11 pages.
Chinese Patent Office, Second Office Action mailed on Dec. 21, 2022, issued in connection with Chinese Application No. 201980089721.5, 12 pages.
European Patent Office, Decision to Refuse European Patent Application mailed on May 30, 2022, issued in connection with European Application No. 17200837.7, 4 pages.
European Patent Office, European EPC Article 94.3 mailed on Feb. 10, 2023, issued in connection with European Application No. 19729968.8, 7 pages.
European Patent Office, European EPC Article 94.3 mailed on Mar. 11, 2022, issued in connection with European Application No. 19731415.6, 7 pages.
European Patent Office, European EPC Article 94.3 mailed on May 2, 2022, issued in connection with European Application No. 20185599.6, 7 pages.
European Patent Office, European EPC Article 94.3 mailed on Jun. 21, 2022, issued in connection with European Application No. 19780508.8, 5 pages.
European Patent Office, European EPC Article 94.3 mailed on Feb. 23, 2023, issued in connection with European Application No. 19839734.1, 8 pages.
European Patent Office, European EPC Article 94.3 mailed on Nov. 28, 2022, issued in connection with European Application No. 18789515.6, 7 pages.
European Patent Office, European EPC Article 94.3 mailed on Mar. 3, 2022, issued in connection with European Application No. 19740292.8, 10 pages.
European Patent Office, European EPC Article 94.3 mailed on Jun. 30, 2022, issued in connection with European Application No. 19765953.5, 4 pages.
European Patent Office, European Extended Search Report mailed on Oct. 7, 2022, issued in connection with European Application No. 22182193.7, 8 pages.
European Patent Office, European Extended Search Report mailed on Apr. 22, 2022, issued in connection with European Application No. 21195031.6, 14 pages.
European Patent Office, European Extended Search Report mailed on Jun. 23, 2022, issued in connection with European Application No. 22153180.9, 6 pages.
European Patent Office, European Extended Search Report mailed on Jun. 30, 2022, issued in connection with European Application No. 21212763.3, 9 pages.
European Patent Office, European Extended Search Report mailed on Jul. 8, 2022, issued in connection with European Application No. 22153523.0, 9 pages.
European Patent Office, European Search Report mailed on Mar. 1, 2022, issued in connection with European Application No. 21180778.9, 9 pages.
European Patent Office, European Search Report mailed on Oct. 4, 2022, issued in connection with European Application No. 22180226.7, 6 pages.
European Patent Office, Summons to Attend Oral Proceedings mailed on Jul. 15, 2022, issued in connection with European Application No. 17792272.1, 11 pages.
Final Office Action mailed on Jun. 1, 2022, issued in connection with U.S. Appl. No. 16/806,747, filed Mar. 2, 2020, 20 pages.
Final Office Action mailed on Aug. 17, 2022, issued in connection with U.S. Appl. No. 16/179,779, filed Nov. 2, 2018, 26 pages.
Final Office Action mailed on May 17, 2023, issued in connection with U.S. Appl. No. 16/168,389, filed Oct. 23, 2018, 44 pages.
Final Office Action mailed on Mar. 21, 2022, issued in connection with U.S. Appl. No. 16/153,530, filed Oct. 5, 2018, 23 pages.
Final Office Action mailed on Aug. 22, 2022, issued in connection with U.S. Appl. No. 16/168,389, filed Oct. 23, 2018, 37 pages.
Final Office Action mailed on Jul. 27, 2022, issued in connection with U.S. Appl. No. 16/989,350, filed Aug. 10, 2020, 15 pages.
Final Office Action mailed on Mar. 29, 2023, issued in connection with U.S. Appl. No. 17/549,034, filed Dec. 13, 2021, 21 pages.
Final Office Action mailed on Jun. 7, 2022, issued in connection with U.S. Appl. No. 16/736,725, filed Jan. 7, 2020, 14 pages.
Helwani et al. Source-domain adaptive filtering for MIMO systems with application to acoustic echo cancellation. In 2010 IEEE International Conference on Acoustics, Speech and Signal Processing, Jun. 28, 2010, 4 pages. [retrieved on Feb. 23, 2023], Retrieved from the Internet: URL: https://scholar.google.com/scholar?hl=en&as_sdt=0%2C14&q=SOURCE-DOMAIN+ADAPTIVE+FILTERING+FOR+MIMO+SYSTEMS+WITH+APPLICATION+TO+ACOUSTIC+ECHO+CANCELLATION&btnG=.
International Bureau, International Preliminary Report on Patentability, mailed on Jul. 21, 2022, issued in connection with International Application No. PCT/US2021/070007, filed on Jan. 6, 2021, 8 pages.
International Bureau, International Preliminary Report on Patentability, mailed on Apr. 26, 2022, issued in connection with International Application No. PCT/US2020/056632, filed on Oct. 21, 2020, 7 pages.
Non-Final Office Action mailed on Feb. 7, 2023, issued in connection with U.S. Appl. No. 17/303,001, filed May 18, 2021, 8 pages.
Non-Final Office Action mailed on Mar. 7, 2022, issued in connection with U.S. Appl. No. 16/812,758, filed Mar. 9, 2020, 18 pages.
Notice of Allowance mailed on Nov. 2, 2022, issued in connection with U.S. Appl. No. 16/989,805, filed Aug. 10, 2020, 5 pages.
Notice of Allowance mailed on Nov. 3, 2022, issued in connection with U.S. Appl. No. 17/448,015, filed Sep. 17, 2021, 7 pages.
Notice of Allowance mailed on Feb. 6, 2023, issued in connection with U.S. Appl. No. 17/077,974, filed Oct. 22, 2020, 7 pages.
Notice of Allowance mailed on Jan. 6, 2023, issued in connection with U.S. Appl. No. 17/896,129, filed Aug. 26, 2022, 13 pages.
Notice of Allowance mailed on Dec. 7, 2022, issued in connection with U.S. Appl. No. 17/315,599, filed May 10, 2021, 11 pages.
Notice of Allowance mailed on Feb. 8, 2023, issued in connection with U.S. Appl. No. 17/446,690, filed Sep. 1, 2021, 8 pages.

(56) References Cited

OTHER PUBLICATIONS

Notice of Allowance mailed on Jan. 9, 2023, issued in connection with U.S. Appl. No. 17/247,507, filed Dec. 14, 2020, 8 pages.
Notice of Allowance mailed on Mar. 9, 2023, issued in connection with U.S. Appl. No. 17/662,302, filed May 6, 2022, 7 pages.
Notice of Allowance mailed on Nov. 9, 2022, issued in connection with U.S. Appl. No. 17/385,542, filed Jul. 26, 2021, 8 pages.
Notice of Allowance mailed on Mar. 1, 2022, issued in connection with U.S. Appl. No. 16/879,549, filed May 20, 2020, 9 pages.
Notice of Allowance mailed on Jun. 10, 2022, issued in connection with U.S. Appl. No. 16/879,549, filed May 20, 2020, 8 pages.
Notice of Allowance mailed on May 11, 2022, issued in connection with U.S. Appl. No. 17/135,123, filed Dec. 28, 2020, 8 pages.
Notice of Allowance mailed on May 11, 2022, issued in connection with U.S. Appl. No. 17/145,667, filed Jan. 11, 2021, 7 pages.
Notice of Allowance mailed on May 11, 2023, issued in connection with U.S. Appl. No. 18/061,638, filed Dec. 5, 2022, 15 pages.
Notice of Allowance mailed on Jul. 12, 2022, issued in connection with U.S. Appl. No. 16/907,953, filed Jun. 22, 2020, 8 pages.
Notice of Allowance mailed on Jul. 12, 2022, issued in connection with U.S. Appl. No. 17/391,404, filed Aug. 2, 2021, 13 pages.
Notice of Allowance mailed on Apr. 13, 2022, issued in connection with U.S. Appl. No. 17/236,559, filed Apr. 21, 2021, 7 pages.
Notice of Allowance mailed on Feb. 13, 2023, issued in connection with U.S. Appl. No. 18/045,360, filed Oct. 10, 2022, 9 pages.
Notice of Allowance mailed on Aug. 15, 2022, issued in connection with U.S. Appl. No. 17/101,949, filed Nov. 23, 2020, 11 pages.
Notice of Allowance mailed on Feb. 15, 2023, issued in connection with U.S. Appl. No. 17/659,613, filed Apr. 18, 2022, 21 pages.
Notice of Allowance mailed on Sep. 15, 2022, issued in connection with U.S. Appl. No. 16/736,725, filed Jan. 1, 2020, 11 pages.
Notice of Allowance mailed on Aug. 17, 2022, issued in connection with U.S. Appl. No. 17/135,347, filed Dec. 28, 2020, 14 pages.
Notice of Allowance mailed on Nov. 17, 2022, issued in connection with U.S. Appl. No. 17/486,222, filed Sep. 27, 2021, 10 pages.
Notice of Allowance mailed on Jul. 18, 2022, issued in connection with U.S. Appl. No. 17/222,151, filed Apr. 5, 2021, 5 pages.
Notice of Allowance mailed on Dec. 20, 2022, issued in connection with U.S. Appl. No. 16/806,747, filed Mar. 2, 2020, 5 pages.
Notice of Allowance mailed on Jan. 20, 2023, issued in connection with U.S. Appl. No. 16/915,234, filed Jun. 29, 2020, 6 pages.
Notice of Allowance mailed on Jun. 20, 2022, issued in connection with U.S. Appl. No. 16/947,895, filed Aug. 24, 2020, 7 pages.
Notice of Allowance mailed on Mar. 20, 2023, issued in connection with U.S. Appl. No. 17/562,412, filed Dec. 27, 2021, 9 pages.
Notice of Allowance mailed on Mar. 21, 2023, issued in connection with U.S. Appl. No. 17/353,254, filed Jun. 21, 2021, 8 pages.
Notice of Allowance mailed on Nov. 21, 2022, issued in connection with U.S. Appl. No. 17/454,676, filed Nov. 12, 2021, 8 pages.
Notice of Allowance mailed on Sep. 21, 2022, issued in connection with U.S. Appl. No. 17/128,949, filed Dec. 21, 2020, 8 pages.
Notice of Allowance mailed on Sep. 22, 2022, issued in connection with U.S. Appl. No. 17/163,506, filed Jan. 31, 2021, 13 pages.
Notice of Allowance mailed on Sep. 22, 2022, issued in connection with U.S. Appl. No. 17/248,427, filed Jan. 25, 2021, 9 pages.
Notice of Allowance mailed on Feb. 23, 2023, issued in connection with U.S. Appl. No. 17/532,674, filed Nov. 22, 2021, 10 pages.
Notice of Allowance mailed on Mar. 24, 2022, issued in connection with U.S. Appl. No. 16/378,516, filed Apr. 8, 2019, 7 pages.
Notice of Allowance mailed on Apr. 26, 2022, issued in connection with U.S. Appl. No. 17/896,129, filed Aug. 26, 2022, 8 pages.
Notice of Allowance mailed on Apr. 26, 2022, issued in connection with U.S. Appl. No. 17/658,717, filed Apr. 11, 2022, 11 pages.
Notice of Allowance mailed on Aug. 26, 2022, issued in connection with U.S. Appl. No. 17/145,667, filed Jan. 11, 2021, 8 pages.
Notice of Allowance mailed on Oct. 26, 2022, issued in connection with U.S. Appl. No. 17/486,574, filed Sep. 27, 2021, 11 pages.
Notice of Allowance mailed on Jun. 27, 2022, issued in connection with U.S. Appl. No. 16/812,758, filed Mar. 9, 2020, 16 pages.
Notice of Allowance mailed on Sep. 28, 2022, issued in connection with U.S. Appl. No. 17/444,043, filed Jul. 29, 2021, 17 pages.
Notice of Allowance mailed on Dec. 29, 2022, issued in connection with U.S. Appl. No. 17/327,911, filed May 24, 2021, 14 pages.
Notice of Allowance mailed on Jul. 29, 2022, issued in connection with U.S. Appl. No. 17/236,559, filed Apr. 21, 2021, 6 pages.
Notice of Allowance mailed on Mar. 29, 2023, issued in connection with U.S. Appl. No. 17/722,438, filed Apr. 18, 2022, 7 pages.
Notice of Allowance mailed on Mar. 3, 2022, issued in connection with U.S. Appl. No. 16/679,538, filed Nov. 11, 2019, 7 pages.
Notice of Allowance mailed on Mar. 30, 2023, issued in connection with U.S. Appl. No. 17/303,066, filed May 19, 2021, 7 pages.
Notice of Allowance mailed on Mar. 31, 2023, issued in connection with U.S. Appl. No. 17/303,735, filed Jun. 7, 2021, 19 pages.
Notice of Allowance mailed on Apr. 5, 2023, issued in connection with U.S. Appl. No. 17/549,253, filed Dec. 13, 2021, 10 pages.
Notice of Allowance mailed on Mar. 6, 2023, issued in connection with U.S. Appl. No. 17/449,926, filed Oct. 4, 2021, 8 pages.
Notice of Allowance mailed on Apr. 8, 2022, issued in connection with U.S. Appl. No. 16/813,643, filed Mar. 9, 2020, 7 pages.
Simon Doclo et al. Combined Acoustic Echo and Noise Reduction Using GSVD-Based Optimal Filtering. In 2000 IEEE International Conference on Acoustics, Speech, and Signal Processing. Proceedings (Cat. No. 00CH37100), Aug. 6, 2002, 4 pages. [retrieved on Feb. 23, 2023], Retrieved from the Internet: URL: https://scholar.google.com/scholar?hl=en&as_sdt=0%2C14&q=COMBINED+ACOUSTIC+ECHO+AND+NOISE+REDUCTION+USING+GSVD-BASED+OPTIMAL+FILTERING&btnG=.
Wikipedia. "The Wayback Machine", Speech recognition software for Linux, Sep. 22, 2016, 4 pages. [retrieved on Mar. 28, 2022], Retrieved from the Internet: URL: https://web.archive.org/web/20160922151304/https://en.wikipedia.org/wiki/Speech_recognition_software_for_Linux.
Wolf et al. On the potential of channel selection for recognition of reverberated speech with multiple microphones. INTERSPEECH, TALP Research Center, Jan. 2010, 5 pages.
Wölfel et al. Multi-source far-distance microphone selection and combination for automatic transcription of lectures, INTERSPEECH 2006—ICSLP, Jan. 2006, 5 pages.
Zhang et al. Noise Robust Speech Recognition Using Multi-Channel Based Channel Selection and Channel Weighting. The Institute of Electronics, Information and Communication Engineers, arXiv:1604.03276v1 [cs.SD] Jan. 1, 2010, 8 pages.
International Bureau, International Search Report and Written Opinion mailed on Mar. 20, 2023, issued in connection with International Application No. PCT/US2022/045399, filed on Sep. 30, 2022, 25 pages.
International Searching Authority, Invitation to Pay Additional Fees on Jan. 27, 2023, issued in connection with International Application No. PCT/US2022/045399, filed on Sep. 30, 2022, 19 pages.
Japanese Patent Office, Decision of Refusal and Translation mailed on Oct. 4, 2022, issued in connection with Japanese Patent Application No. 2021-535871, 6 pages.
Japanese Patent Office, Decision of Refusal and Translation mailed on Jul. 26, 2022, issued in connection with Japanese Patent Application No. 2020-513852, 10 pages.
Japanese Patent Office, Non-Final Office Action mailed on Apr. 4, 2023, issued in connection with Japanese Patent Application No. 2021-573944, 5 pages.
Japanese Patent Office, Notice of Reasons for Refusal and Translation mailed on Sep. 13, 2022, issued in connection with Japanese Patent Application No. 2021-163622, 12 pages.
Japanese Patent Office, Office Action and Translation mailed on Nov. 15, 2022, issued in connection with Japanese Patent Application No. 2021-146144, 9 pages.
Japanese Patent Office, Office Action mailed on Nov. 29, 2022, issued in connection with Japanese Patent Application No. 2021-181224, 6 pages.
Katsamanis et al. Robust far-field spoken command recognition for home automation combining adaptation and multichannel processing. ICASSP, IEEE International Conference on Acoustics, Speech and Signal Processing—Proceedings, May 2014, pp. 5547-5551.

(56) References Cited

OTHER PUBLICATIONS

Korean Patent Office, Korean Examination Report and Translation mailed on Apr. 10, 2023, issued in connection with Korean Application No. 10-2022-7024007, 8 pages.
Korean Patent Office, Korean Examination Report and Translation mailed on Oct. 13, 2022, issued in connection with Korean Application No. 10-2021-7030939, 4 pages.
Korean Patent Office, Korean Examination Report and Translation mailed on Apr. 19, 2022, issued in connection with Korean Application No. 10-2021-7008937, 14 pages.
Korean Patent Office, Korean Examination Report and Translation mailed on Jul. 26, 2022, issued in connection with Korean Application No. 10-2022-7016656, 17 pages.
Korean Patent Office, Korean Examination Report and Translation mailed on Mar. 31, 2023, issued in connection with Korean Application No. 10-2022-7016656, 7 pages.
Korean Patent Office, Korean Examination Report and Translation mailed on Oct. 31, 2021, issued in connection with Korean Application No. 10-2022-7024007, 10 pages.
Korean Patent Office, Office Action and Translation mailed on Feb. 27, 2023, issued in connection with Korean Application No. 10-2022-7021879, 5 pages.
Mathias Wolfel. Channel Selection by Class Separability Measures for Automatic Transcriptions on Distant Microphones, INTERSPEECH 2007 10.21437/Interspeech.2007-255, 4 pages.
Non-Final Office Action mailed on Feb. 2, 2023, issued in connection with U.S. Appl. No. 17/305,698, filed Jul. 13, 2021, 16 pages.
Non-Final Office Action mailed on Dec. 5, 2022, issued in connection with U.S. Appl. No. 17/662,302, filed May 6, 2022, 12 pages.
Non-Final Office Action mailed on Oct. 5, 2022, issued in connection with U.S. Appl. No. 17/449,926, filed Oct. 4, 2021, 11 pages.
Non-Final Office Action mailed on Apr. 12, 2023, issued in connection with U.S. Appl. No. 17/878,649, filed Aug. 1, 2022, 16 pages.
Non-Final Office Action mailed on Nov. 14, 2022, issued in connection with U.S. Appl. No. 17/077,974, filed Oct. 22, 2020, 6 pages.
Non-Final Office Action mailed on Sep. 14, 2022, issued in connection with U.S. Appl. No. 17/446,690, filed Sep. 1, 2021, 10 pages.
Non-Final Office Action mailed on Aug. 15, 2022, issued in connection with U.S. Appl. No. 17/448,015, filed Sep. 17, 2021, 12 pages.
Non-Final Office Action mailed on Dec. 15, 2022, issued in connection with U.S. Appl. No. 17/549,253, filed Dec. 13, 2021, 10 pages.
Non-Final Office Action mailed on Feb. 15, 2023, issued in connection with U.S. Appl. No. 17/453,632, filed Nov. 4, 2021, 12 pages.
Non-Final Office Action mailed on Sep. 15, 2022, issued in connection with U.S. Appl. No. 17/247,507, filed Dec. 14, 2020, 9 pages.
Non-Final Office Action mailed on Sep. 15, 2022, issued in connection with U.S. Appl. No. 17/327,911, filed May 24, 2021, 44 pages.
Non-Final Office Action mailed on Feb. 16, 2023, issued in connection with U.S. Appl. No. 17/305,920, filed Jul. 16, 2021, 12 pages.
Non-Final Office Action mailed on Oct. 18, 2022, issued in connection with U.S. Appl. No. 16/949,973, filed Nov. 23, 2020, 31 pages.
Non-Final Office Action mailed on Sep. 19, 2022, issued in connection with U.S. Appl. No. 17/385,542, filed Jul. 26, 2021, 9 pages.
Non-Final Office Action mailed on Sep. 2, 2021, issued in connection with U.S. Appl. No. 16/947,895, filed Aug. 24, 2020, 16 pages.
Non-Final Office Action mailed on Apr. 20, 2023, issued in connection with U.S. Appl. No. 18/061,570, filed Dec. 5, 2022, 12 pages.
Non-Final Office Action mailed on Oct. 20, 2022, issued in connection with U.S. Appl. No. 17/532,674, filed Nov. 22, 2021, 52 pages.
Non-Final Office Action mailed on Dec. 22, 2022, issued in connection with U.S. Appl. No. 16/168,389, filed Oct. 23, 2018, 39 pages.
Non-Final Office Action mailed on Mar. 23, 2022, issued in connection with U.S. Appl. No. 16/907,953, filed Jun. 22, 2020, 7 pages.
Non-Final Office Action mailed on Sep. 23, 2022, issued in connection with U.S. Appl. No. 16/153,530, filed Oct. 5, 2018, 25 pages.
Non-Final Office Action mailed on Apr. 24, 2023, issued in connection with U.S. Appl. No. 17/532,744, filed Nov. 22, 2021, 18 pages.
Non-Final Office Action mailed on May 24, 2022, issued in connection with U.S. Appl. No. 17/101,949, filed Nov. 23, 2020, 10 pages.
Non-Final Office Action mailed on Apr. 25, 2023, issued in connection with U.S. Appl. No. 17/536,572, filed Nov. 29, 2021, 8 pages.
Non-Final Office Action mailed on Apr. 25, 2023, issued in connection with U.S. Appl. No. 17/656,794, filed Mar. 28, 2022, 22 pages.
Non-Final Office Action mailed on Oct. 25, 2022, issued in connection with U.S. Appl. No. 17/549,034, filed Dec. 13, 2021, 20 pages.
Non-Final Office Action mailed on May 26, 2022, issued in connection with U.S. Appl. No. 16/989,805, filed Aug. 10, 2020, 14 pages.
Non-Final Office Action mailed on Feb. 27, 2023, issued in connection with U.S. Appl. No. 17/493,430, filed Oct. 4, 2021, 17 pages.
Non-Final Office Action mailed on Feb. 28, 2023, issued in connection with U.S. Appl. No. 17/548,921, filed Dec. 13, 2021, 12 pages.
Non-Final Office Action mailed on Mar. 28, 2022, issued in connection with U.S. Appl. No. 17/222,151, filed Apr. 5, 2021, 5 pages.
Non-Final Office Action mailed on Sep. 30, 2022, issued in connection with U.S. Appl. No. 17/353,254, filed Jun. 21, 2021, 22 pages.
Non-Final Office Action mailed on Nov. 4, 2022, issued in connection with U.S. Appl. No. 17/445,272, filed Aug. 17, 2021, 22 pages.
Non-Final Office Action mailed on Oct. 4, 2022, issued in connection with U.S. Appl. No. 16/915,234, filed Jun. 29, 2020, 16 pages.
Non-Final Office Action mailed on Apr. 5, 2023, issued in connection with U.S. Appl. No. 18/145,501, filed Dec. 22, 2022, 6 pages.
Non-Final Office Action mailed on Jan. 26, 2024, issued in connection with U.S. Appl. No. 17/450,925, filed Oct. 14, 2021, 9 pages.
Non-Final Office Action mailed on Aug. 28, 2023, issued in connection with U.S. Appl. No. 17/722,661, filed Apr. 18, 2022, 16 pages.
Non-Final Office Action mailed on Mar. 28, 2024, issued in connection with U.S. Appl. No. 18/192,452, filed Mar. 29, 2023, 7 pages.
Non-Final Office Action mailed on Feb. 29, 2024, issued in connection with U.S. Appl. No. 18/449,244, filed Aug. 14, 2023, 15 pages.
Non-Final Office Action mailed on Jul. 3, 2023, issued in connection with U.S. Appl. No. 17/135,173, filed Dec. 28, 2020, 22 pages.
Non-Final Office Action mailed on Jul. 30, 2024, issued in connection with U.S. Appl. No. 17/994,577, filed Nov. 28, 2022, 13 pages.
Non-Final Office Action mailed on May 30, 2024, issued in connection with U.S. Appl. No. 18/503,971, filed Nov. 7, 2023, 8 pages.
Non-Final Office Action mailed on Jul. 5, 2023, issued in connection with U.S. Appl. No. 18/061,579, filed Dec. 5, 2022, 11 pages.
Non-Final Office Action mailed on Aug. 6, 2024, issued in connection with U.S. Appl. No. 18/313,859, filed May 8, 2023, 20 pages.
Non-Final Office Action mailed on Oct. 6, 2023, issued in connection with U.S. Appl. No. 17/222,950, filed Apr. 5, 2021, 9 pages.
Non-Final Office Action mailed on Aug. 7, 2024, issued in connection with U.S. Appl. No. 18/502,644, filed Nov. 6, 2023, 31 pages.

(56) References Cited

OTHER PUBLICATIONS

Non-Final Office Action mailed on Jun. 7, 2023, issued in connection with U.S. Appl. No. 16/179,779, filed Nov. 2, 2018, 29 pages.
Non-Final Office Action mailed on Sep. 7, 2023, issued in connection with U.S. Appl. No. 17/340,590, filed Jun. 7, 2021, 18 pages.
Non-Final Office Action mailed on Jul. 8, 2024, issued in connection with U.S. Appl. No. 18/520,531, filed Nov. 27, 2023, 63 pages.
Non-Final Office Action mailed on Jun. 8, 2023, issued in connection with U.S. Appl. No. 18/061,243, filed Dec. 2, 2022, 10 pages.
Notice of Allowance mailed on Jun. 9, 2023, issued in connection with U.S. Appl. No. 17/532,674, filed Nov. 22, 2021, 13 pages.
Notice of Allowance mailed on Jul. 10, 2023, issued in connection with U.S. Appl. No. 17/315,599, filed May 10, 2021, 2 pages.
Notice of Allowance mailed on Jul. 10, 2024, issued in connection with U.S. Appl. No. 18/309,939, filed May 1, 2023, 5 pages.
Notice of Allowance mailed on Aug. 11, 2023, issued in connection with U.S. Appl. No. 17/878,649, filed Aug. 1, 2022, 7 pages.
Notice of Allowance mailed on Jul. 12, 2023, issued in connection with U.S. Appl. No. 18/151,619, filed Jan. 9, 2023, 13 pages.
Notice of Allowance mailed on Jun. 12, 2023, issued in connection with U.S. Appl. No. 17/453,632, filed Nov. 4, 2021, 9 pages.
Notice of Allowance mailed on Jul. 13, 2023, issued in connection with U.S. Appl. No. 18/145,501, filed Dec. 22, 2022, 9 pages.
Notice of Allowance mailed on Jun. 13, 2023, issued in connection with U.S. Appl. No. 17/249,776, filed Mar. 12, 2021, 10 pages.
Notice of Allowance mailed on Mar. 13, 2024, issued in connection with U.S. Appl. No. 18/449,254, filed Aug. 14, 2023, 10 pages.
Notice of Allowance mailed on Aug. 14, 2023, issued in connection with U.S. Appl. No. 17/549,034, filed Dec. 13, 2021, 9 pages.
Notice of Allowance mailed on Dec. 14, 2023, issued in connection with U.S. Appl. No. 17/722,661, filed Apr. 18, 2022, 12 pages.
Notice of Allowance mailed on Sep. 14, 2023, issued in connection with U.S. Appl. No. 18/061,579, filed Dec. 5, 2022, 7 pages.
Notice of Allowance mailed on Dec. 15, 2023, issued in connection with U.S. Appl. No. 18/157,937, filed Jan. 23, 2023, 8 pages.
Notice of Allowance mailed on Jun. 15, 2023, issued in connection with U.S. Appl. No. 17/305,698, filed Jul. 13, 2021, 8 pages.
Notice of Allowance mailed on Jun. 15, 2023, issued in connection with U.S. Appl. No. 17/305,920, filed Jul. 16, 2021, 8 pages.
Notice of Allowance mailed on Aug. 16, 2023, issued in connection with U.S. Appl. No. 17/536,572, filed Nov. 29, 2021, 7 pages.
Notice of Allowance mailed on Apr. 17, 2024, issued in connection with U.S. Appl. No. 18/088,976, filed Dec. 27, 2022, 7 pages.
Notice of Allowance mailed on Apr. 17, 2024, issued in connection with U.S. Appl. No. 18/471,693, filed Sep. 21, 2023, 12 pages.
Notice of Allowance mailed on Jul. 17, 2024, issued in connection with U.S. Appl. No. 18/310,025, filed May 1, 2023, 7 pages.
Notice of Allowance mailed on Aug. 19, 2024, issued in connection with U.S. Appl. No. 18/345,588, filed Jun. 30, 2023, 20 pages.
Notice of Allowance mailed on Jul. 19, 2024, issued in connection with U.S. Appl. No. 18/328,932, filed Jun. 5, 2023, 9 pages.
Notice of Allowance mailed on Oct. 2, 2023, issued in connection with U.S. Appl. No. 17/810,533, filed Jul. 1, 2022, 8 pages.
Notice of Allowance mailed on Aug. 21, 2023, issued in connection with U.S. Appl. No. 17/548,921, filed Dec. 13, 2021, 10 pages.
Notice of Allowance mailed on Jul. 21, 2023, issued in connection with U.S. Appl. No. 17/986,241, filed Nov. 14, 2022, 12 pages.
Notice of Allowance mailed on Jul. 24, 2024, issued in connection with U.S. Appl. No. 18/456,941, filed Aug. 28, 2023, 11 pages.
Notice of Allowance mailed on May 24, 2024, issued in connection with U.S. Appl. No. 18/154,228, filed Jan. 13, 2023, 8 pages.
Notice of Allowance mailed on Nov. 24, 2023, issued in connection with U.S. Appl. No. 18/070,024, filed Nov. 28, 2022, 7 pages.
Notice of Allowance mailed on Mar. 27, 2024, issued in connection with U.S. Appl. No. 18/061,570, filed Dec. 5, 2022, 8 pages.
Notice of Allowance mailed on Sep. 27, 2023, issued in connection with U.S. Appl. No. 17/656,794, filed Mar. 28, 2022, 11 pages.
Notice of Allowance mailed on Sep. 27, 2023, issued in connection with U.S. Appl. No. 18/048,945, filed Oct. 24, 2022, 9 pages.
Notice of Allowance mailed on Sep. 27, 2023, issued in connection with U.S. Appl. No. 18/061,243, filed Dec. 2, 2022, 8 pages.
Notice of Allowance mailed on Aug. 28, 2024, issued in connection with U.S. Appl. No. 18/432,733, filed Feb. 5, 2024, 10 pages.
Notice of Allowance mailed on Feb. 28, 2024, issued in connection with U.S. Appl. No. 16/989,350, filed Aug. 10, 2020, 9 pages.
Notice of Allowance mailed on Mar. 28, 2024, issued in connection with U.S. Appl. No. 18/316,400, filed May 12, 2023, 8 pages.
Notice of Allowance mailed on Jul. 29, 2024, issued in connection with U.S. Appl. No. 18/459,982, filed Sep. 1, 2023, 08 pages.
Notice of Allowance mailed on Sep. 29, 2023, issued in connection with U.S. Appl. No. 16/168,389, filed Oct. 23, 2018, 11 pages.
Notice of Allowance mailed on Jul. 3, 2024, issued in connection with U.S. Appl. No. 18/507,713, filed Nov. 13, 2023, 11 pages.
Notice of Allowance mailed on May 3, 2024, issued in connection with U.S. Appl. No. 18/331,580, filed Jun. 8, 2023, 7 pages.
Notice of Allowance mailed on Jun. 30, 2023, issued in connection with U.S. Appl. No. 17/303,001, filed May 18, 2021, 8 pages.
Notice of Allowance mailed on Aug. 31, 2023, issued in connection with U.S. Appl. No. 18/145,520, filed Dec. 22, 2022, 2 pages.
Notice of Allowance mailed on Jul. 31, 2024, issued in connection with U.S. Appl. No. 18/192,452, filed Mar. 29, 2023, 8 pages.
Notice of Allowance mailed on Jul. 31, 2024, issued in connection with U.S. Appl. No. 18/453,052, filed Aug. 21, 2023, 9 pages.
Notice of Allowance mailed on Aug. 4, 2023, issued in connection with U.S. Appl. No. 18/145,520, filed Dec. 22, 2022, 10 pages.
Notice of Allowance mailed on Aug. 7, 2024, issued in connection with U.S. Appl. No. 18/478,241, filed Sep. 29, 2023, 10 pages.
Notice of Allowance mailed on Jun. 7, 2024, issued in connection with U.S. Appl. No. 18/316,434, filed May 12, 2023, 9 pages.
Notice of Allowance mailed on Mar. 8, 2024, issued in connection with U.S. Appl. No. 17/135,173, filed Dec. 28, 2020, 9 pages.
Notice of Allowance mailed on Nov. 8, 2023, issued in connection with U.S. Appl. No. 18/066,093, filed Dec. 14, 2022, 11 pages.
Souden et al. "On Optimal Frequency-Domain Multichannel Linear Filtering for Noise Reduction." IEEE Transactions on Audio, Speech, and Language Processing, vol. 18, No. 2, Feb. 2010, 17pages.
Tweet: "How to start using Google app voice commands to make your life easier Share This Story shop @Bullet", Jan. 21, 2016, https://bgr.com/2016/01/21/best-ok-google-voice-commands/, 3 page.
Advisory Action mailed on Feb. 26, 2024, issued in connection with U.S. Appl. No. 17/532,744, filed Nov. 22, 2021, 4 pages.
Australian Patent Office, Australian Examination Report Action mailed on Jul. 11, 2023, issued in connection with Australian Application No. 2022246446, 2 pages.
Australian Patent Office, Australian Examination Report Action mailed on Jun. 14, 2023, issued in connection with Australian Application No. 2019299865, 2 pages.
Australian Patent Office, Australian Examination Report Action mailed on Aug. 16, 2024, issued in connection with Australian Application No. 2023248160, 2 pages.
Australian Patent Office, Australian Examination Report Action mailed on Sep. 18, 2024, issued in connection with Australian Application No. 2020218258, 3 pages.
Australian Patent Office, Australian Examination Report Action mailed on Aug. 19, 2024, issued in connection with Australian Application No. 2023237094, 2 pages.
Australian Patent Office, Australian Examination Report Action mailed on Sep. 25, 2023, issued in connection with Australian Application No. 2018338812, 3 pages.
Australian Patent Office, Australian Examination Report Action mailed on Jul. 29, 2024, issued in connection with Australian Application No. 2023237192, 3 pages.
Australian Patent Office, Australian Examination Report Action mailed on Oct. 31, 2023, issued in connection with Australian Application No. 2023203687, 2 pages.
Bohn, Dieter. The Verge. "Amazon creates a huge alliance to demand voice assistant compatibility." Sep. 24, 2019, 15 pages. Retrieved from the Internet: URL:https://www.theverge.com/2019/9/24/20881321/amazon-voice-interoperability-initia tive-alexa-microsoft-baidu-intel-qualcommspotify-assistants.

(56) References Cited

OTHER PUBLICATIONS

Canadian Patent Office, Canadian Examination Report mailed on Oct. 1, 2024, issued in connection with Canadian Application No. 3123601, 4 pages.
Canadian Patent Office, Canadian Examination Report mailed on Aug. 12, 2024, issued in connection with Canadian Application No. 3067776, 3 pages.
Canadian Patent Office, Canadian Examination Report mailed on Oct. 12, 2023, issued in connection with Canadian Application No. 3084279, 4 pages.
Canadian Patent Office, Canadian Examination Report mailed on Jun. 18, 2024, issued in connection with Canadian Application No. 3084279, 4 pages.
Canadian Patent Office, Canadian Examination Report mailed on Dec. 19, 2023, issued in connection with Canadian Application No. 3067776, 3 pages.
Canadian Patent Office, Canadian Examination Report mailed on Apr. 29, 2024, issued in connection with Canadian Application No. 3164558, 4 pages.
Canadian Patent Office, Canadian Examination Report mailed on Jan. 3, 2024, issued in connection with Canadian Application No. 3123601, 3 pages.
Canadian Patent Office, Canadian Examination Report mailed on May 8, 2024, issued in connection with Canadian Application No. 3146914, 5 pages.
Chinese Patent Office, First Office Action and Translation mailed on Apr. 23, 2024, issued in connection with Chinese Application No. 202110542908.5, 10 pages.
Chinese Patent Office, First Office Action and Translation mailed on Sep. 6, 2023, issued in connection with Chinese Application No. 202010179593.8, 14 pages.
Chinese Patent Office, Second Office Action mailed on May 30, 2023, issued in connection with Chinese Application No. 201980070006.7, 9 pages.
European Patent Office, European EPC Article 94.3 mailed on Jun. 5, 2023, issued in connection with European Application No. 20710649.3, 8 pages.
European Patent Office, European EPC Article 94.3 mailed on Jan. 10, 2024, issued in connection with European Application No. 20757152.2, 6 pages.
European Patent Office, European EPC Article 94.3 mailed on Oct. 12, 2023, issued in connection with European Application No. 20736489.4, 8 pages.
European Patent Office, European EPC Article 94.3 mailed on Dec. 18, 2023, issued in connection with European Application No. 21703134.3, 7 pages.
European Patent Office, European EPC Article 94.3 mailed on Dec. 19, 2024, issued in connection with European Application No. 22153523, 4 pages.
European Patent Office, European EPC Article 94.3 mailed on Jul. 22, 2024, issued in connection with European Application No. 23188226.7, 9 pages.
European Patent Office, European EPC Article 94.3 mailed on Jan. 24, 2024, issued in connection with European Application No. 21180778.9, 8 pages.
European Patent Office, European EPC Article 94.3 mailed on Jun. 27, 2023, issued in connection with European Application No. 21195031.6, 4 pages.
European Patent Office, European EPC Article 94.3 mailed on Nov. 27, 2023, issued in connection with European Application No. 19780508.8, 7 pages.
European Patent Office, European EPC Article 94.3 mailed on Feb. 28, 2024, issued in connection with European Application No. 18306501, 7 pages.
European Patent Office, European EPC Article 94.3 mailed on Nov. 28, 2023, issued in connection with European Application No. 19731415.6, 9 pages.
European Patent Office, European EPC Article 94.3 mailed on Apr. 29, 2024, issued in connection with European Application No. 21195031.6, 4 pages.
European Patent Office, European EPC Article 94.3 mailed on Mar. 29, 2023, issued in connection with European Application No. 22182193.7, 4 pages.
European Patent Office, European EPC Article 94.3 mailed on Aug. 31, 2023, issued in connection with European Application No. 19773326.4, 5 pages.
European Patent Office, European EPC Article 94.3 mailed on Jul. 31, 2023, issued in connection with European Application No. 21164130.3, 5 pages.
European Patent Office, European EPC Article 94.3 mailed on Jun. 4, 2024, issued in connection with European Application No. 21180778.9, 5 pages.
European Patent Office, European EPC Article 94.3 mailed on Apr. 6, 2023, issued in connection with European Application No. 21193616.6, 7 pages.
European Patent Office, European EPC Article 94.3 mailed on Sep. 6, 2023, issued in connection with European Application No. 19197116.7, 4 pages.
European Patent Office, European EPC Article 94.3 mailed on Sep. 7, 2023, issued in connection with European Application No. 20185599.6, 6 pages.
European Patent Office, European Extended Search Report mailed on Dec. 6, 2024, issued in connection with European Application No. 24174559.5, 12 pages.
European Patent Office, European Extended Search Report mailed on Jan. 2, 2024, issued in connection with European Application No. 23188226.7, 10 pages.
European Patent Office, European Extended Search Report mailed on Jul. 9, 2024, issued in connection with European Application No. 24162741.3, 12 pages.
European Patent Office, European Search Report mailed on Feb. 2, 2024, issued in connection with European Application No. 23200723.7, 5 pages.
European Patent Office, European Search Report mailed on Sep. 21, 2023, issued in connection with European Application No. 23172783.5, 8 pages.
European Patent Office, Summons to Attend Oral Proceedings mailed on Jun. 26, 2024, issued in connection with European Application No. 19740292.8, 10 pages.
European Patent Office, Summons to Attend Oral Proceedings mailed on Nov. 29, 2024, issued in connection with European Application No. 21193616.6, 9 pages.
European Patent Office, Summons to Attend Oral Proceedings mailed on Aug. 6, 2024, issued in connection with European Application No. 18789515.6, 8 pages.
Final Office Action mailed on Jul. 18, 2024, issued in connection with U.S. Appl. No. 17/450,925, filed Oct. 14, 2021, 11 pages.
Final Office Action mailed on Aug. 22, 2023, issued in connection with U.S. Appl. No. 18/061,570, filed Dec. 5, 2022, 12 pages.
Final Office Action mailed on Aug. 25, 2023, issued in connection with U.S. Appl. No. 16/989,350, filed Aug. 10, 2020, 21 pages.
Final Office Action mailed on Feb. 27, 2024, issued in connection with U.S. Appl. No. 17/340,590, filed Jun. 7, 2021, 28 pages.
Final Office Action mailed on Oct. 6, 2023, issued in connection with U.S. Appl. No. 17/532,744, filed Nov. 22, 2021, 21 pages.
Final Office Action mailed on Jul. 8, 2024, issued in connection with U.S. Appl. No. 17/222,950, filed Apr. 5, 2021, 10 pages.
Final Office Action mailed on Aug. 9, 2023, issued in connection with U.S. Appl. No. 17/493,430, filed Oct. 4, 2021, 19 pages.
*Google LLC* v. *Sonos, Inc.*, International Trade Commission Case No. 337-TA-1330, Order No. 25: Regarding Respondent Sonos, Inc.'s Omnibus Motion for Summary Determination; dated May 16, 2023, 7 pages.
*Google LLC* v. *Sonos, Inc.*, International Trade Commission Case No. 337-TA-1330, Order No. 28: Regarding Respondent Sonos, Inc.'s Omnibus Motion for Summary Determination; dated May 22, 2023, 3 pages.
*Google LLC* v. *Sonos, Inc.*, International Trade Commission Case No. 337-TA-1330, Order No. 37: Regarding Complainant Google LLC's Motions in Limine; dated Jul. 7, 2023, 10 pages.
*Google LLC* v. *Sonos, Inc.*, International Trade Commission Case No. 337-TA-1330, Respondent Sonos, Inc.'s Motion in Limine No.

(56) References Cited

OTHER PUBLICATIONS

4. Motion to Exclude Untimely Validity Arguments Regarding Claim 11 of U.S. Pat. No. 11,024,311; dated Jun. 13, 2023, 34 pages.
*Google LLC* v. *Sonos, Inc.*, International Trade Commission Case No. 337-TA-1330, Respondent Sonos, Inc.'s Response to Google's Motion in Limine No. 3 Preclude Sonos from Presenting Evidence or Argument that Claim 3 of the '748 Patent is Indefinite for Lack of Antecedent Basis; dated Jun. 12, 2023, 26 pages.
Indian Patent Office, Examination Report mailed on Feb. 28, 2024, issued in connection with Indian Patent Application No. 201847035625, 3 pages.
Indian Patent Office, Examination Report mailed on Dec. 5, 2023, issued in connection with Indian Patent Application No. 201847035625, 3 pages.
International Bureau, International Preliminary Report on Patentability, mailed on Apr. 11, 2024, issued in connection with International Application No. PCT/US2022/077107, filed on Sep. 27, 2022, 9 pages.
International Bureau, International Preliminary Report on Patentability, mailed on Aug. 22, 2024, issued in connection with International Application No. PCT/US2023/062179, filed on Feb. 8, 2023, 8 pages.
International Bureau, International Preliminary Report on Patentability, mailed on Apr. 4, 2024, issued in connection with International Application No. PCT/US2022/076972, filed on Sep. 23, 2022, 14 pages.
International Bureau, International Search Report and Written Opinion mailed on Mar. 23, 2023, issued in connection with International Application No. PCT/US2022/076972, filed on Sep. 23, 2022, 20 pages.
Japanese Patent Office, Decision of Refusal and Translation mailed on May 23, 2023, issued in connection with Japanese Patent Application No. 2021-163622, 13 pages.
Japanese Patent Office, Notice of Reasons for Refusal and Translation mailed on Dec. 10, 2024, issued in connection with Japanese Patent Application No. 2023-149069, 8 pages.
Japanese Patent Office, Notice of Reasons for Refusal and Translation mailed on Dec. 3, 2024, issued in connection with Japanese Patent Application No. 2023-144379, 12 pages.
Japanese Patent Office, Notice of Reasons for Refusal and Translation mailed on Dec. 3, 2024, issued in connection with Japanese Patent Application No. 2023-144387, 8 pages.
Japanese Patent Office, Notice of Reasons for Refusal and Translation mailed on Aug. 8, 2023, issued in connection with Japanese Patent Application No. 2022-101346, 6 pages.
Japanese Patent Office, Office Action and Translation mailed on Oct. 8, 2024, issued in connection with Japanese Patent Application No. 2023-118922, 9 pages.
Korean Patent Office, Korean Examination Report and Translation mailed on Jul. 17, 2024, issued in connection with Korean Application No. 10-2022-7024007, 10 pages.
Korean Patent Office, Korean Examination Report and Translation mailed on Jul. 19, 2023, issued in connection with Korean Application No. 10-2022-7024007, 9 pages.
Korean Patent Office, Korean Examination Report and Translation mailed on Aug. 5, 2024, issued in connection with Korean Application No. 10-2023-7031855, 10 pages.
Korean Patent Office, Korean Examination Report and Translation mailed on Nov. 6, 2024, issued in connection with Korean Application No. 10-2023-7032988, 13 pages.
Korean Patent Office, Korean Office Action and Translation mailed on Oct. 20, 2024, issued in connection with Korean Application No. 10-2023-7036702, 22 pages.
Korean Patent Office, Korean Preliminary Rejection and Translation mailed on Dec. 26, 2023, issued in connection with Korean Application No. 10-2023-7031855, 4 pages.
Korean Patent Office, Korean Preliminary Rejection and Translation mailed on Dec. 5, 2023, issued in connection with Korean Application No. 10-2023-7032988, 11 pages.
Newman, Jared. "Chromecast Audio's multi-room support has arrived," Dec. 11, 2015, https://www.pcworld.com/article/3014204/customer-electronic/chromcase-audio-s-multi-room-support-has . . . , 1 page.
Non-Final Office Action mailed on Feb. 1, 2024, issued in connection with U.S. Appl. No. 18/313,013, filed May 5, 2023, 47 pages.
Non-Final Office Action mailed on May 1, 2024, issued in connection with U.S. Appl. No. 17/650,441, filed Feb. 9, 2022, 12 pages.
Non-Final Office Action mailed on Aug. 10, 2023, issued in connection with U.S. Appl. No. 18/070,024, filed Nov. 28, 2022, 4 pages.
Non-Final Office Action mailed on Jul. 11, 2024, issued in connection with U.S. Appl. No. 18/313,013, filed May 5, 2023, 18 pages.
Non-Final Office Action mailed on Dec. 13, 2023, issued in connection with U.S. Appl. No. 18/316,400, filed May 12, 2023, 6 pages.
Non-Final Office Action mailed on Dec. 13, 2023, issued in connection with U.S. Appl. No. 18/316,434, filed May 12, 2023, 29 pages.
Non-Final Office Action mailed on Mar. 13, 2024, issued in connection with U.S. Appl. No. 18/309,939, filed May 1, 2023, 15 pages.
Non-Final Office Action mailed on Sep. 14, 2023, issued in connection with U.S. Appl. No. 17/528,843, filed Nov. 17, 2021, 20 pages.
Non-Final Office Action mailed on Jul. 18, 2023, issued in connection with U.S. Appl. No. 18/066,093, filed Dec. 14, 2022, 12 pages.
Non-Final Office Action mailed on Mar. 18, 2024, issued in connection with U.S. Appl. No. 17/532,744, filed Nov. 22, 2021, 20 pages.
Non-Final Office Action mailed on Jan. 19, 2024, issued in connection with U.S. Appl. No. 18/331,580, filed Jun. 8, 2023, 11 pages.
Non-Final Office Action mailed on Jun. 20, 2024, issued in connection with U.S. Appl. No. 18/007,415, filed Jan. 30, 2023, 12 pages.
Non-Final Office Action mailed on Jun. 20, 2024, issued in connection with U.S. Appl. No. 18/520,336, filed Nov. 27, 2023, 20 pages.
Non-Final Office Action mailed on May 20, 2024, issued in connection with U.S. Appl. No. 18/600,044, filed Mar. 8, 2024, 24 pages.
Non-Final Office Action mailed on Nov. 21, 2023, issued in connection with U.S. Appl. No. 18/088,976, filed Dec. 27, 2022, 9 pages.
Non-Final Office Action mailed on Jun. 23, 2023, issued in connection with U.S. Appl. No. 18/048,945, filed Oct. 24, 2022, 10 pages.
Non-Final Office Action mailed on Oct. 23, 2023, issued in connection with U.S. Appl. No. 17/932,715, filed Sep. 16, 2022, 14 pages.
Non-Final Office Action mailed on Apr. 24, 2024, issued in connection with U.S. Appl. No. 18/461,430, filed Sep. 5, 2023, 22 pages.
Non-Final Office Action mailed on May 25, 2023, issued in connection with U.S. Appl. No. 18/157,937, filed Jan. 23, 2023, 9 pages.
Non-Final Office Action mailed on Apr. 26, 2024, issued in connection with U.S. Appl. No. 18/310,025, filed May 1, 2023, 9 pages.

\* cited by examiner

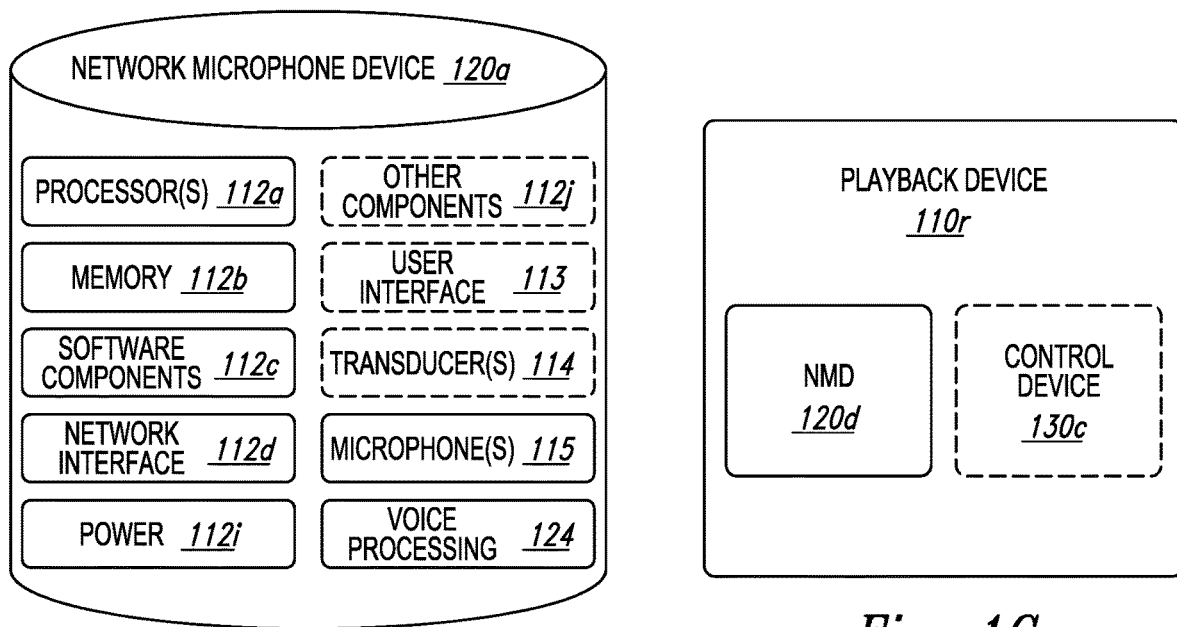
*Fig. 1F*
*Fig. 1G*
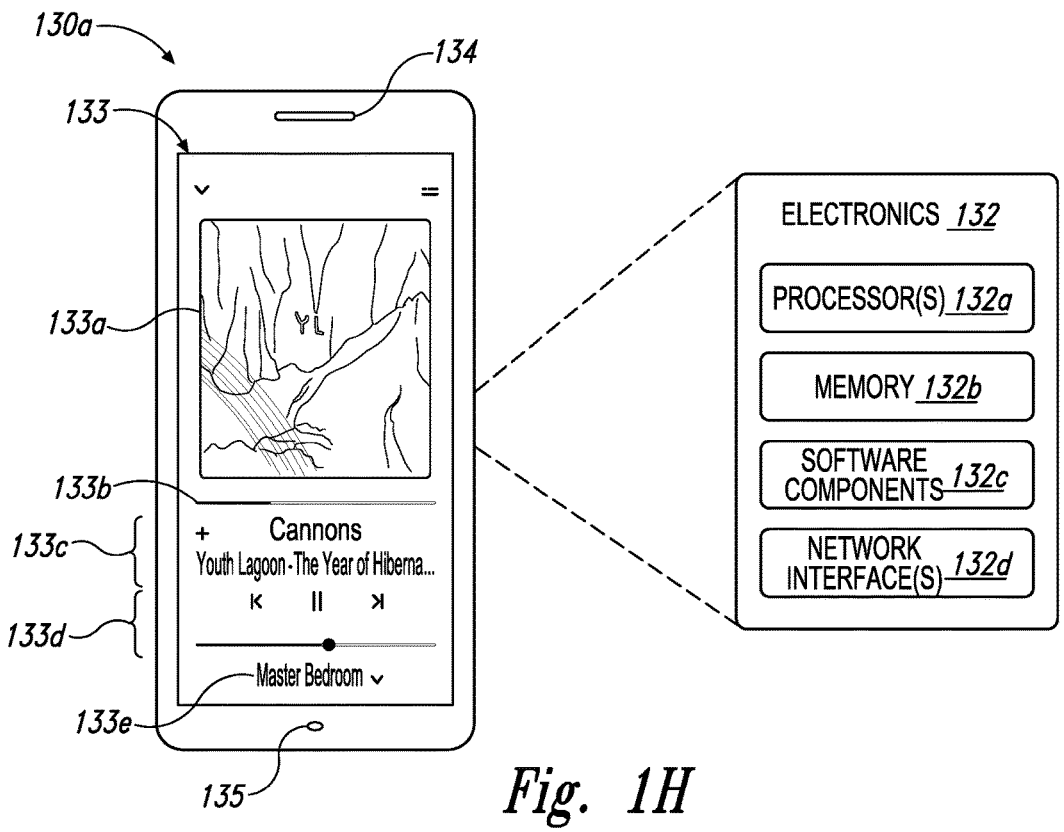
*Fig. 1H*

300

```
[
    {
        "command": "loadAudioClip",        ⎫
        "householdId": "ABCD1234",          ⎬ 302
        "playerId": "xyz"                   ⎭
    },
    {
        "name": "Example",                                      ⎫
        "appId": "com.example.app",                             ⎪
        "priority": "LOW",                                      ⎬ 304
        "notification": "CUSTOM",                               ⎪
        "streamUrl": "http://example.com/notification.mp3",     ⎪
        "expiryMillis": 2000                                    ⎭
    }
]
```

[
    {
        "response": "loadAudioClip",     ⎫
        "success": true,                  ⎪
        "type": "audioClip",              ⎬ 312
        "householdId": "ABCD1234",        ⎪
        "playerId": "xyz"                 ⎭
    },
    {
        "id": "NEW NOTIFICATION",                              ⎫
        "name": "Example",                                      ⎪
        "appId": "com.example.app",                             ⎪
        "priority": "LOW",                                      ⎬ 314
        "notification": "CUSTOM",                               ⎪
        "streamUrl": "http://example.com/notification.mp3",     ⎪
        "expiryMillis": 2000,                                   ⎪
        "status": "PENDING"                                     ⎭
    }
]
```

| 402 | 404 | 406 |
|---|---|---|
| ACTIVE | QUEUED NOTIFICATION 1 | HIGH |
| PENDING | QUEUED NOTIFICATION 2 | HIGH |
| PENDING | QUEUED NOTIFICATION 3 | LOW |
| PENDING | QUEUED NOTIFICATION 4 | LOW |

| 402 | 404 | 406 |
|---|---|---|
| ACTIVE | QUEUED NOTIFICATION 1 | HIGH |
| PENDING | QUEUED NOTIFICATION 2 | HIGH |
| PENDING | QUEUED NOTIFICATION 3 | LOW |
| PENDING | QUEUED NOTIFICATION 4 | LOW |
| PENDING | NEW NOTIFICATION | LOW |

*Fig. 4B*

| 402 | 404 | 406 |
|---|---|---|
| ACTIVE | QUEUED NOTIFICATION 1 | HIGH |
| PENDING | QUEUED NOTIFICATION 2 | HIGH |
| PENDING | NEW NOTIFICATION | HIGH |
| PENDING | QUEUED NOTIFICATION 3 | LOW |
| PENDING | QUEUED NOTIFICATION 4 | LOW |

| 402 | 404 | 406 |
|---|---|---|
| ACTIVE | NEW NOTIFICATION | HIGH |
| PENDING | QUEUED NOTIFICATION 1 | HIGH |
| PENDING | QUEUED NOTIFICATION 2 | HIGH |
| PENDING | QUEUED NOTIFICATION 3 | LOW |
| PENDING | QUEUED NOTIFICATION 4 | LOW |

AUDIO NOTIFICATIONS

CROSS REFERENCE TO RELATED APPLICATIONS

This application is a continuation under 35 U.S.C. § 120 of U.S. patent application Ser. No. 16/947,895, titled "Audio Notifications," filed Aug. 24, 2020, and issuing as U.S. Pat. No. 11,482,978 on Oct. 25, 2022, which is a continuation of U.S. patent application Ser. No. 16/148,879, titled "Audio Notifications," filed on Oct. 1, 2018, and issued as U.S. Pat. No. 10,797,667 on Oct. 6, 2020. The content of these applications is incorporated herein by reference in its entirety.

U.S. patent application Ser. No. 16/148,879 claims priority under 35 U.S.C. § 119 to U.S. provisional App. No. 62/723,942, "Playback Device Control," and filed on Aug. 28, 2018. The content of this application is incorporated herein by reference in its entirety.

FIELD OF THE DISCLOSURE

The present disclosure is related to consumer goods and, more particularly, to methods, systems, products, features, services, and other elements directed to media playback or some aspect thereof.

BACKGROUND

Options for accessing and listening to digital audio in an out-loud setting were limited until in 2002, when SONOS, Inc. began development of a new type of playback system. Sonos then filed one of its first patent applications in 2003, entitled "Method for Synchronizing Audio Playback between Multiple Networked Devices," and began offering its first media playback systems for sale in 2005. The Sonos Wireless Home Sound System enables people to experience music from many sources via one or more networked playback devices. Through a software control application installed on a controller (e.g., smartphone, tablet, computer, voice input device), one can play what she wants in any room having a networked playback device. Media content (e.g., songs, podcasts, video sound) can be streamed to playback devices such that each room with a playback device can play back corresponding different media content. In addition, rooms can be grouped together for synchronous playback of the same media content, and/or the same media content can be heard in all rooms synchronously.

BRIEF DESCRIPTION OF THE DRAWINGS

Features, aspects, and advantages of the presently disclosed technology may be better understood with regard to the following description, appended claims, and accompanying drawings, as listed below. A person skilled in the relevant art will understand that the features shown in the drawings are for purposes of illustrations, and variations, including different and/or additional features and arrangements thereof, are possible.

FIG. 1F is a block diagram of a network microphone device.

FIG. 1G is a block diagram of a playback device.

FIG. 1H is a partially schematic diagram of a control device.

FIG. 3A is an example alert communication from a network-enabled device to a playback device.

FIG. 3B is an example alert response communication from a playback device to a network-enabled device.

FIG. 4A is a simplified diagram of a queue of alert notifications for playback by a playback device.

FIG. 4B is a simplified diagram of a queue of alert notifications for playback by a playback device.

Figure 1A:
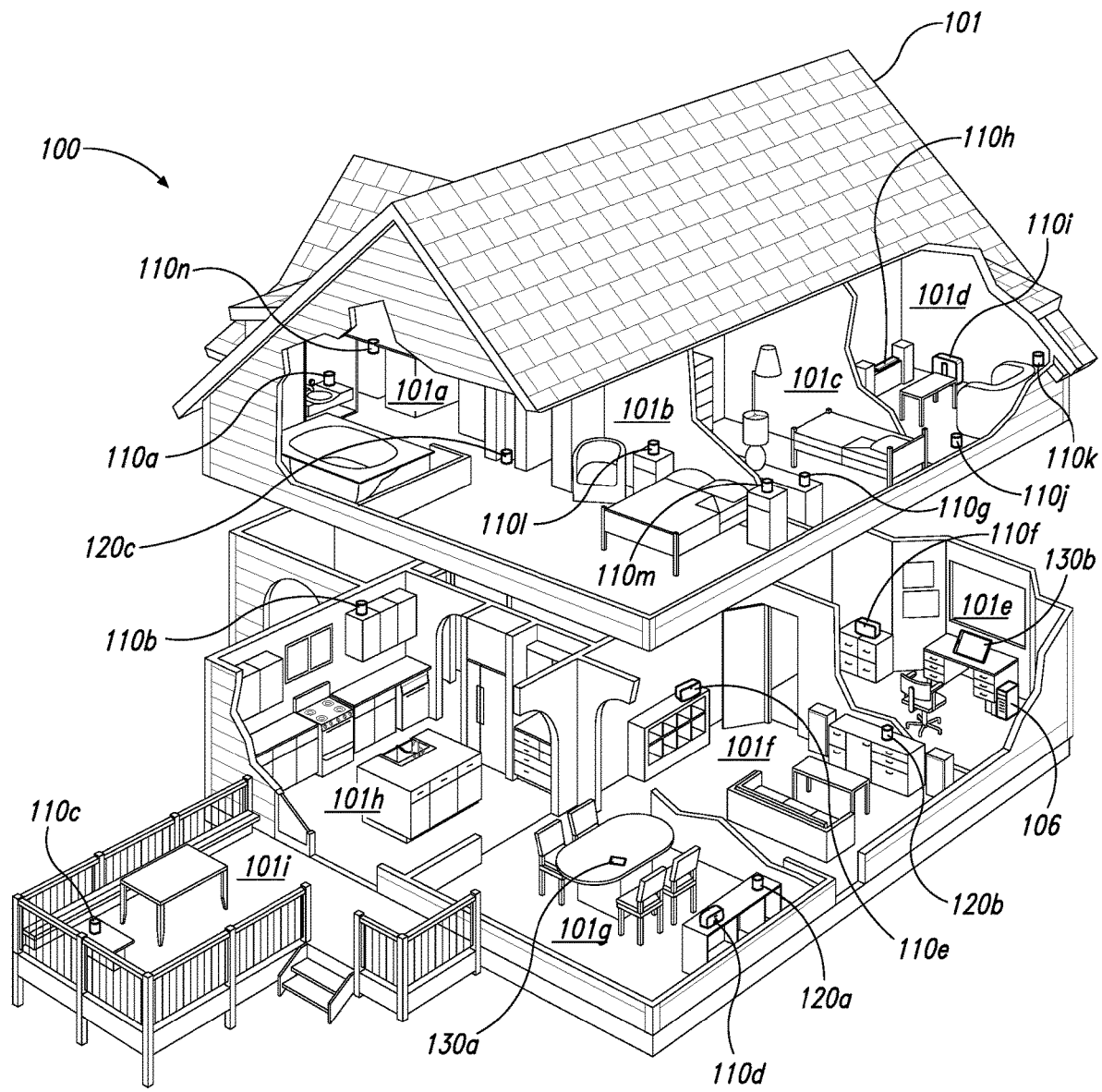
FIG. 1A is a partial cutaway view of an environment having a media playback system configured in accordance with aspects of the disclosed technology.

The drawings are for the purpose of illustrating example embodiments, but those of ordinary skill in the art will understand that the technology disclosed herein is not limited to the arrangements and/or instrumentality shown in the drawings.

DETAILED DESCRIPTION

I. Overview

"Smart devices" (also referred to as "IoT devices" and referred to herein as "network-enabled devices") are becoming more prevalent, such that it is common for an individual to interact with numerous smart devices throughout the course of an ordinary day, and many households include multiple smart devices, often from different manufacturers or providers. For instance, a household may include one or more of a smart doorbell (such as those provided by Nest® or Ring®), a smart thermostat (such as those provided by (Nest® or Ecobee®), a smart vacuum (such as those provided by iRobot® or Neato®), or smart appliances (such as those provided by GE® or Whirlpool®), to name a few examples.

Smart devices may provide convenience by automating various tasks and by allowing a user to remotely control or otherwise interact with the smart devices. For instance, smart devices may generate alerts upon detecting various events in order to notify the user that the detected events have occurred. For instance, a smart doorbell may generate an alert responsive to detecting the presence of an individual at the door, a smart thermostat may generate an alert responsive to determining that a room has reached a threshold high or low temperature or responsive to activating or deactivating an HVAC system, and a smart vacuum may generate an alert responsive to starting or finishing a cleaning cycle.

When a smart device generates an alert, the smart device may notify the user of the generated alert via the user's mobile device. For instance, the smart device may cause the user's mobile device to output an audio and/or visual notification of the generated alert.

In some circumstances, the user might prefer to receive the notification of the generated alert via a playback device. For instance, the user might prefer certain notifications, such as a doorbell ringing or a fire alarm, to be heard or otherwise observed by people other than the user and/or in different rooms from the user. These notifications may be more suited for output via one or more playback devices, as output from the playback devices may be more effectively received by multiple people in different rooms than a notification provided by the user's mobile device.

Further, in some circumstances, the user might not receive the notification of the generated alert via the mobile device. For instance, the user may have powered off or silenced the mobile device, or the mobile device may have powered itself off responsive to low battery power. As another example, the user might not be paying attention or may be otherwise distracted from the mobile device. For instance, the user might be using a television or playback device to watch television or listen to music, and the audio output from the playback device may drown out or otherwise distract the user from the alert notifications output by the mobile device.

Disclosed herein are systems and methods to help address these or other issues. In particular, the present disclosure provides example systems and methods that involve a playback device outputting audio notifications corresponding to smart device alerts. However, as noted above, a user may have smart devices from multiple different manufacturers and/or vendors which may also differ from the manufacturer and/or vendor of the playback device. As such, to facilitate the playback device communicating with various smart devices, the playback device can be configured with an application programming interface (API) through which the smart devices can communicate with the playback device.

Using the playback device API, the playback device can receive alert communications from the smart devices. An alert communication may specify various characteristics of an alert, such as by identifying a particular audio notification that is to be played back by the playback device, as well as by identifying a priority level of the alert.

In some examples, the playback device may handle alert communications differently based on their identified priority level. For instance, when the playback device receives an alert communication, the playback device may add the audio notification identified by the alert communication to a queue of notifications for playback, and the playback device may add higher priority notifications ahead of lower priority notifications in the queue. Other examples of how the playback device treats alert communications differently based on their identified priority level are described in further detail below.

After receiving an alert communication from a smart device, the playback device can then play back the audio notification identified by the alert communication. If the playback device is outputting other audio content, such as music or television audio, then the playback device may stop playing back the other audio content or duck the other audio content in order to facilitate playing back the audio notification. Using the playback device to play back the audio notification corresponding to the smart device alert, instead of or in addition to displaying an alert notification on the user's mobile device, may increase the likelihood that the user will be notified of the alert and may result in an improved user experience.

Accordingly, in some implementations, for example, a playback device includes a network interface, an audio stage comprising an amplifier, one or more speaker drivers, one or more processors, and a housing carrying at least the network interface, the audio stage, the one or more speaker drivers, the one or more processors, and tangible, non-transitory, computer-readable media storing instructions executable by the one or more processors to cause the playback device to perform various operations. The operations include, while playing back audio content via the audio stage and the one or more speaker drivers, receiving, via the network interface, an alert communication from a smart device connected to the playback device via a local area network, the alert communication comprising (i) an audio notification identifier that identifies an audio notification and (ii) a priority identifier that identifies a priority level of the audio notification. The operations further include, responsive to receiving the alert communication, adding the audio notification to a notification queue at a particular queue position, wherein the particular queue position of the audio notification in the notification queue is based on the priority level of the audio notification relative to other audio content in the notification queue. Additionally, the operations include adjusting playback of the audio content for playing back the audio notification, and playing back the audio notification via the audio stage and the one or more speaker drivers.

While some examples described herein may refer to functions performed by given actors such as "users," "listeners," and/or other entities, it should be understood that this is for purposes of explanation only. The claims should not be interpreted to require action by any such example actor unless explicitly required by the language of the claims themselves.

Moreover, some functions are described herein as being performed "based on" or "in response to" (or "responsive to") another element or function. "Based on" should be understood that one element or function is related to another function or element "In response to" should be understood that one element or function is a necessary result of another function or element. For the sake of brevity, functions are generally described as being based on another function when a functional link exists; however, disclosure of either type of relationship should be understood as disclosing both types of functional relationship. In the claims, the functional relationship should be interpreted as recited.

In the Figures, identical reference numbers identify generally similar, and/or identical, elements. To facilitate the discussion of any particular element, the most significant digit or digits of a reference number refers to the Figure in which that element is first introduced. For example, element 110*a* is first introduced and discussed with reference to FIG. 1A. Many of the details, dimensions, angles and other features shown in the Figures are merely illustrative of particular embodiments of the disclosed technology. Accordingly, other embodiments can have other details, dimensions, angles and features without departing from the spirit or scope of the disclosure. In addition, those of ordinary skill in the art will appreciate that further embodiments of the various disclosed technologies can be practiced without several of the details described below.

II. Suitable Operating Environment

FIG. 1A is a partial cutaway view of a media playback system 100 distributed in an environment 101 (e.g., a house). The media playback system 100 comprises one or more playback devices 110 (identified individually as playback devices 110*a-n*), one or more network microphone devices ("NMDs") 120 (identified individually as NMDs 120a-c), and one or more control devices 130 (identified individually as control devices 130a and 130b).

As used herein the term "playback device" can generally refer to a network device configured to receive, process, and output data of a media playback system. For example, a playback device can be a network device that receives and processes audio content. In some embodiments, a playback device includes one or more transducers or speakers powered by one or more amplifiers. In other embodiments, however, a playback device includes one of (or neither of) the speaker and the amplifier. For instance, a playback device can comprise one or more amplifiers configured to drive one or more speakers external to the playback device via a corresponding wire or cable.

Moreover, as used herein the term NMD (i.e., a "network microphone device") can generally refer to a network device that is configured for audio detection In some embodiments, an NMD is a stand-alone device configured primarily for audio detection. In other embodiments, an NMD is incorporated into a playback device (or vice versa).

The term "control device" can generally refer to a network device configured to perform functions relevant to facilitating user access, control, and/or configuration of the media playback system 100.

Each of the playback devices 110 is configured to receive audio signals or data from one or more media sources (e.g., one or more remote servers, one or more local devices) and play back the received audio signals or data as sound. The one or more NMDs 120 are configured to receive spoken word commands, and the one or more control devices 130 are configured to receive user input In response to the received spoken word commands and/or user input, the media playback system 100 can play back audio via one or more of the playback devices 110. In certain embodiments, the playback devices 110 are configured to commence playback of media content in response to a trigger. For instance, one or more of the playback devices 110 can be configured to play back a morning playlist upon detection of an associated trigger condition (e.g., presence of a user in a kitchen, detection of a coffee machine operation). In some embodiments, for example, the media playback system 100 is configured to play back audio from a first playback device (e.g., the playback device 100a) in synchrony with a second playback device (e.g., the playback device 100b). Interactions between the playback devices 110, NMDs 120, and/or control devices 130 of the media playback system 100 configured in accordance with the various embodiments of the disclosure are described in greater detail below with respect to FIGS. 1B-1H.

In the illustrated embodiment of FIG. 1A, the environment 101 comprises a household having several rooms, spaces, and/or playback zones, including (clockwise from upper left) a master bathroom 101a, a master bedroom 101b, a second bedroom 101c, a family room or den 101d, an office 101e, a living room 101f, a dining room 101g, a kitchen 101h, and an outdoor patio 101i. While certain embodiments and examples are described below in the context of a home environment, the technologies described herein may be implemented in other types of environments In some embodiments, for example, the media playback system 100 can be implemented in one or more commercial settings (e.g., a restaurant, mall, airport, hotel, a retail or other store), one or more vehicles (e.g., a sports utility vehicle, bus, car, a ship, a boat, an airplane), multiple environments (e.g., a combination of home and vehicle environments), and/or another suitable environment where multi-zone audio may be desirable.

The media playback system 100 can comprise one or more playback zones, some of which may correspond to the rooms in the environment 101. The media playback system 100 can be established with one or more playback zones, after which additional zones may be added, or removed to form, for example, the configuration shown in FIG. 1A. Each zone may be given a name according to a different room or space such as the office 101e, master bathroom 101a, master bedroom 101b, the second bedroom 101c, kitchen 101h, dining room 101g, living room 101f, and/or the outdoor patio 101i. In some aspects, a single playback zone may include multiple rooms or spaces. In certain aspects, a single room or space may include multiple playback zones.

In the illustrated embodiment of FIG. 1A, the master bathroom 101a, the second bedroom 101c, the office 101e, the living room 101f, the dining room 101g, the kitchen 101h, and the outdoor patio 101i each include one playback device 110, and the master bedroom 101b and the den 101d include a plurality of playback devices 110. In the master bedroom 101b, the playback devices 110l and 110m may be configured, for example, to play back audio content in synchrony as individual ones of playback devices 110, as a bonded playback zone, as a consolidated playback device, and/or any combination thereof. Similarly, in the den 101d, the playback devices 110h-j can be configured, for instance, to play back audio content in synchrony as individual ones of playback devices 110, as one or more bonded playback devices, and/or as one or more consolidated playback devices. Additional details regarding bonded and consolidated playback devices are described below with respect to FIGS. 1B and 1E.

In some aspects, one or more of the playback zones in the environment 101 may each be playing different audio content. For instance, a user may be grilling on the patio 101 and listening to hip hop music being played by the playback device 110c while another user is preparing food in the kitchen 101h and listening to classical music played by the playback device 110b. In another example, a playback zone may play the same audio content in synchrony with another playback zone. For instance, the user may be in the office 101e listening to the playback device 110f playing back the same hip hop music being played back by playback device 110c on the patio 101i. In some aspects, the playback devices 110c and 110f play back the hip hop music in synchrony such that the user perceives that the audio content is being played seamlessly (or at least substantially seamlessly) while moving between different playback zones. Additional details regarding audio playback synchronization among playback devices and/or zones can be found, for example, in U.S. Pat. No. 8,234,395 entitled, "System and method for synchronizing operations among a plurality of independently clocked digital data processing devices," which is incorporated herein by reference in its entirety.

a. Suitable Media Playback System

Figure 1B:
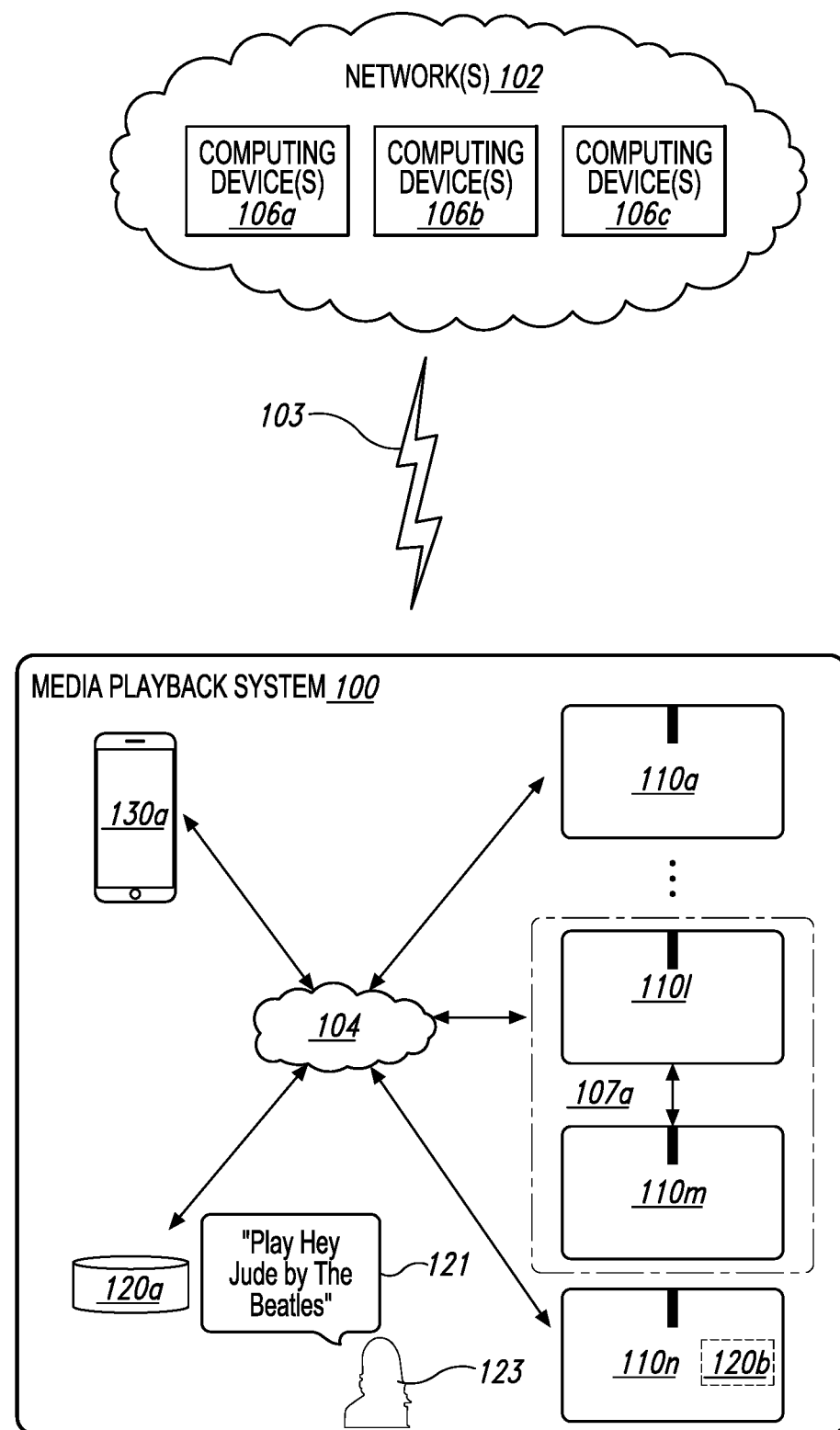
FIG. 1B is a schematic diagram of the media playback system of FIG. 1A and one or more networks.

FIG. 1B is a schematic diagram of the media playback system 100 and a cloud network 102. For ease of illustration, certain devices of the media playback system 100 and the cloud network 102 are omitted from FIG. 1B. One or more communication links 103 (referred to hereinafter as "the links 103") communicatively couple the media playback system 100 and the cloud network 102.

The links 103 can comprise, for example, one or more wired networks, one or more wireless networks, one or more wide area networks (WAN), one or more local area networks (LAN), one or more personal area networks (PAN), one or more telecommunication networks (e.g., one or more Global System for Mobiles (GSM) networks, Code Division Multiple Access (CDMA) networks, Long-Term Evolution (LTE) networks, 5G communication network networks, and/or other suitable data transmission protocol networks), etc. The cloud network 102 is configured to deliver media content (e.g., audio content, video content, photographs, social media content) to the media playback system 100 in response to a request transmitted from the media playback system 100 via the links 103. In some embodiments, the cloud network 102 is further configured to receive data (e.g. voice input data) from the media playback system 100 and correspondingly transmit commands and/or media content to the media playback system 100.

The cloud network 102 comprises computing devices 106 (identified separately as a first computing device 106a, a second computing device 106b, and a third computing device 106c). The computing devices 106 can comprise individual computers or servers, such as, for example, a media streaming service server storing audio and/or other media content, a voice service server, a social media server, a media playback system control server, etc. In some embodiments, one or more of the computing devices 106 comprise modules of a single computer or server. In certain embodiments, one or more of the computing devices 106 comprise one or more modules, computers, and/or servers. Moreover, while the cloud network 102 is described above in the context of a single cloud network, in some embodiments the cloud network 102 comprises a plurality of cloud networks comprising communicatively coupled computing devices. Furthermore, while the cloud network 102 is shown in FIG. 1B as having three of the computing devices 106, in some embodiments, the cloud network 102 comprises fewer (or more than) three computing devices 106.

The media playback system 100 is configured to receive media content from the networks 102 via the links 103. The received media content can comprise, for example, a Uniform Resource Identifier (URI) and/or a Uniform Resource Locator (URL). For instance, in some examples, the media playback system 100 can stream, download, or otherwise obtain data from a URI or a URL corresponding to the received media content. A network 104 communicatively couples the links 103 and at least a portion of the devices (e.g., one or more of the playback devices 110, NMDs 120, and/or control devices 130) of the media playback system 100. The network 104 can include, for example, a wireless network (e.g., a WiFi network, a Bluetooth, a Z-Wave network, a ZigBee, and/or other suitable wireless communication protocol network) and/or a wired network (e g., a network comprising Ethernet, Universal Serial Bus (USB), and/or another suitable wired communication). As those of ordinary skill in the art will appreciate, as used herein, "WiFi" can refer to several different communication protocols including, for example. Institute of Electrical and Electronics Engineers (IEEE) 802.11a, 802.11b, 802.11g, 802.11n, 802.11ac, 802.11ac, 802.11ad, 802.11af, 802.11ah, 802.11ai, 802.11aj, 802.11aq, 802.11ax, 802.11ay, 802.15, etc. transmitted at 2.4 Gigahertz (GHz), 5 GHz, and/or another suitable frequency.

In some embodiments, the network 104 comprises a dedicated communication network that the media playback system 100 uses to transmit messages between individual devices and/or to transmit media content to and from media content sources (e.g., one or more of the computing devices 106). In certain embodiments, the network 104 is configured to be accessible only to devices in the media playback system 100, thereby reducing interference and competition with other household devices. In other embodiments, however, the network 104 comprises an existing household communication network (e.g., a household WiFi network). In some embodiments, the links 103 and the network 104 comprise one or more of the same networks. In some aspects, for example, the links 103 and the network 104 comprise a telecommunication network (e.g., an LTE network, a 5G network). Moreover, in some embodiments, the media playback system 100 is implemented without the network 104, and devices comprising the media playback system 100 can communicate with each other, for example, via one or more direct connections, PANs, telecommunication networks, and/or other suitable communication links.

In some embodiments, audio content sources may be regularly added or removed from the media playback system 100. In some embodiments, for example, the media playback system 100 performs an indexing of media items when one or more media content sources are updated, added to, and/or removed from the media playback system 100. The media playback system 100 can scan identifiable media items in some or all folders and/or directories accessible to the playback devices 110, and generate or update a media content database comprising metadata (e.g., title, artist, album, track length) and other associated information (e.g., URIs, URLs) for each identifiable media item found. In some embodiments, for example, the media content database is stored on one or more of the playback devices 110, network microphone devices 120, and/or control devices 130.

In the illustrated embodiment of FIG. 1B, the playback devices 110l and 110m comprise a group 107a. The playback devices 110l and 110m can be positioned in different rooms in a household and be grouped together in the group 107a on a temporary or permanent basis based on user input received at the control device 130a and/or another control device 130 in the media playback system 100. When arranged in the group 107a, the playback devices 110l and 110m can be configured to play back the same or similar audio content in synchrony from one or more audio content sources. In certain embodiments, for example, the group 107a comprises a bonded zone in which the playback devices 110l and 110m comprise left audio and right audio channels, respectively, of multi-channel audio content, thereby producing or enhancing a stereo effect of the audio content. In some embodiments, the group 107a includes additional playback devices 110. In other embodiments, however, the media playback system 100 omits the group 107a and/or other grouped arrangements of the playback devices 110.

The media playback system 100 includes the NMDs 120a and 120d, each comprising one or more microphones configured to receive voice utterances from a user. In the illustrated embodiment of FIG. 1B, the NMD 120a is a standalone device and the NMD 120d is integrated into the playback device 110n. The NMD 120a, for example, is configured to receive voice input 121 from a user 123. In some embodiments, the NMD 120a transmits data associated with the received voice input 121 to a voice assistant service (VAS) configured to (i) process the received voice input data and (ii) transmit a corresponding command to the media playback system 100. In some aspects, for example, the computing device 106c comprises one or more modules and/or servers of a VAS (e.g., a VAS operated by one or more of SONOS®, AMAZON®, GOOGLE® APPLE®, MICROSOFT®). The computing device 106c can receive the voice input data from the NMD 120a via the network 104 and the links 103. In response to receiving the voice input data, the computing device 106c processes the voice input data (i.e., "Play Hey Jude by The Beatles"), and determines that the processed voice input includes a command to play a song (e.g., "Hey Jude"). The computing device 106c accordingly transmits commands to the media playback system 100 to play back "Hey Jude" by the Beatles from a suitable media service (e.g., via one or more of the computing devices 106) on one or more of the playback devices 110.

b. Suitable Playback Devices

Figure 1C:
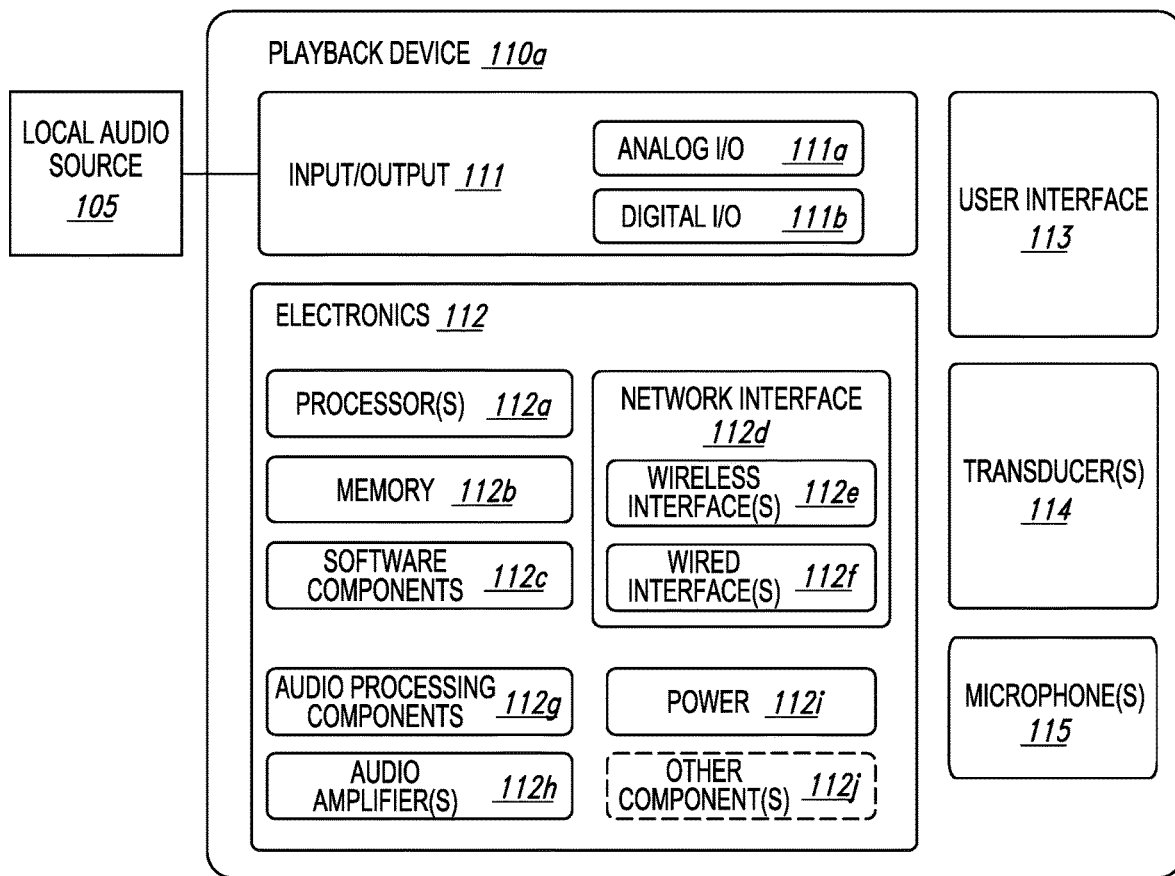
FIG. 1C is a block diagram of a playback device.

FIG. 1C is a block diagram of the playback device 110a comprising an input/output 111. The input/output 111 can include an analog I/O 111a (e.g., one or more wires, cables, and/or other suitable communication links configured to carry analog signals) and/or a digital I/O 111b (e.g., one or more wires, cables, or other suitable communication links configured to carry digital signals). In some embodiments, the analog I/O 111a is an audio line-in input connection comprising, for example, an auto-detecting 3.5 mm audio line-in connection. In some embodiments, the digital I/O 111b comprises a Sony/Philips Digital Interface Format (S/PDIF) communication interface and/or cable and/or a Toshiba Link (TOSLINK) cable. In some embodiments, the digital I/O 111b comprises an High-Definition Multimedia Interface (HDMI) interface and/or cable. In some embodiments, the digital I/O 111b includes one or more wireless communication links comprising, for example, a radio frequency (RF), infrared, WiFi, Bluetooth, or another suitable communication protocol. In certain embodiments, the analog I/O 111a and the digital I/O 111b comprise interfaces (e.g., ports, plugs, jacks) configured to receive connectors of cables transmitting analog and digital signals, respectively, without necessarily including cables.

The playback device 110a, for example, can receive media content (e.g., audio content comprising music and/or other sounds) from a local audio source 105 via the input/output 111 (e.g., a cable, a wire, a PAN, a Bluetooth connection, an ad hoc wired or wireless communication network, and/or another suitable communication link). The local audio source 105 can comprise, for example, a mobile device (e.g., a smartphone, a tablet, a laptop computer) or another suitable audio component (e.g., a television, a desktop computer, an amplifier, a phonograph, a Blu-ray player, a memory storing digital media files). In some aspects, the local audio source 105 includes local music libraries on a smartphone, a computer, a networked-attached storage (NAS), and/or another suitable device configured to store media files. In certain embodiments, one or more of the playback devices 110, NMDs 120, and/or control devices 130 comprise the local audio source 105. In other embodiments, however, the media playback system omits the local audio source 105 altogether. In some embodiments, the playback device 110a does not include an input/output 111 and receives all audio content via the network 104.

The playback device 110a further comprises electronics 112, a user interface 113 (e.g., one or more buttons, knobs, dials, touch-sensitive surfaces, displays, touchscreens), and one or more transducers 114 (referred to hereinafter as "the transducers 114"). The electronics 112 is configured to receive audio from an audio source (e.g., the local audio source 105) via the input/output 111, one or more of the computing devices 106a-c via the network 104 (FIG. 1B)), amplify the received audio, and output the amplified audio for playback via one or more of the transducers 114. In some embodiments, the playback device 110a optionally includes one or more microphones 115 (e.g., a single microphone, a plurality of microphones, a microphone array) (hereinafter referred to as "the microphones 115"). In certain embodiments, for example, the playback device 110a having one or more of the optional microphones 115 can operate as an NMD configured to receive voice input from a user and correspondingly perform one or more operations based on the received voice input.

In the illustrated embodiment of FIG. 1C, the electronics 112 comprise one or more processors 112a (referred to hereinafter as "the processors 112a"), memory 112b, software components 112c, a network interface 112d, one or more audio processing components 112g (referred to hereinafter as "the audio components 112g"), one or more audio amplifiers 112h (referred to hereinafter as "the amplifiers 112h"), and power 112i (e.g., one or more power supplies, power cables, power receptacles, batteries, induction coils, Power-over Ethernet (POE) interfaces, and/or other suitable sources of electric power). In some embodiments, the electronics 112 optionally include one or more other components 112j (e.g., one or more sensors, video displays, touchscreens, battery charging bases).

The processors 112a can comprise clock-driven computing component(s) configured to process data, and the memory 112b can comprise a computer-readable medium (e.g., a tangible, non-transitory computer-readable medium, data storage loaded with one or more of the software components 112c) configured to store instructions for performing various operations and/or functions. The processors 112a are configured to execute the instructions stored on the memory 112b to perform one or more of the operations. The operations can include, for example, causing the playback device 110a to retrieve audio data from an audio source (e.g., one or more of the computing devices 106a-c (FIG. 1B)), and/or another one of the playback devices 110. In some embodiments, the operations further include causing the playback device 110a to send audio data to another one of the playback devices 110a and/or another device (e.g., one of the NMDs 120). Certain embodiments include operations causing the playback device 110a to pair with another of the one or more playback devices 110 to enable a multi-channel audio environment (e.g., a stereo pair, a bonded zone).

The processors 112a can be further configured to perform operations causing the playback device 110a to synchronize playback of audio content with another of the one or more playback devices 110. As those of ordinary skill in the art will appreciate, during synchronous playback of audio content on a plurality of playback devices, a listener will preferably be unable to perceive time-delay differences between playback of the audio content by the playback device 110a and the other one or more other playback devices 110. Additional details regarding audio playback synchronization among playback devices can be found, for example, in U.S. Pat. No. 8,234,395, which was incorporated by reference above.

In some embodiments, the memory 112b is further configured to store data associated with the playback device 110a, such as one or more zones and/or zone groups of which the playback device 110a is a member, audio sources accessible to the playback device 110a, and/or a playback queue that the playback device 110a (and/or another of the one or more playback devices) can be associated with. The stored data can comprise one or more state variables that are periodically updated and used to describe a state of the playback device 110a. The memory 112b can also include data associated with a state of one or more of the other devices (e.g., the playback devices 110, NMDs 120, control devices 130) of the media playback system 100. In some aspects, for example, the state data is shared during predetermined intervals of time (e.g., every 5 seconds, every 10 seconds, every 60 seconds) among at least a portion of the devices of the media playback system 100, so that one or more of the devices have the most recent data associated with the media playback system 100.

The network interface 112d is configured to facilitate a transmission of data between the playback device 110a and one or more other devices on a data network such as, for example, the links 103 and/or the network 104 (FIG. 1B). The network interface 112d is configured to transmit and receive data corresponding to media content (e.g., audio content, video content, text, photographs) and other signals (e.g., non-transitory signals) comprising digital packet data including an Internet Protocol (IP)-based source address and/or an IP-based destination address. The network interface 112d can parse the digital packet data such that the electronics 112 properly receives and processes the data destined for the playback device 110a.

In the illustrated embodiment of FIG. 1C, the network interface 112d comprises one or more wireless interfaces 112e (referred to hereinafter as "the wireless interface 112e"). The wireless interface 112e (e.g., a suitable interface comprising one or more antennae) can be configured to wirelessly communicate with one or more other devices (e.g., one or more of the other playback devices 110, NMDs 120, and/or control devices 130) that are communicatively coupled to the network 104 (FIG. 1B) in accordance with a suitable wireless communication protocol (e.g., WiFi, Bluetooth, LTE). In some embodiments, the network interface 112d optionally includes a wired interface 112f (e.g., an interface or receptacle configured to receive a network cable such as an Ethernet, a USB-A, USB-C, and/or Thunderbolt cable) configured to communicate over a wired connection with other devices in accordance with a suitable wired communication protocol. In certain embodiments, the network interface 112d includes the wired interface 112f and excludes the wireless interface 112e. In some embodiments, the electronics 112 excludes the network interface 112d altogether and transmits and receives media content and/or other data via another communication path (e.g., the input/output 111).

The audio components 112g are configured to process and/or filter data comprising media content received by the electronics 112 (e.g., via the input/output 111 and/or the network interface 112d) to produce output audio signals In some embodiments, the audio processing components 112g comprise, for example, one or more digital-to-analog converters (DAC), audio preprocessing components, audio enhancement components, a digital signal processors (DSPs), and/or other suitable audio processing components, modules, circuits, etc. In certain embodiments, one or more of the audio processing components 112g can comprise one or more subcomponents of the processors 112a. In some embodiments, the electronics 112 omits the audio processing components 112g. In some aspects, for example, the processors 112a execute instructions stored on the memory 112b to perform audio processing operations to produce the output audio signals.

The amplifiers 112h are configured to receive and amplify the audio output signals produced by the audio processing components 112g and/or the processors 112a. The amplifiers 112h can comprise electronic devices and/or components configured to amplify audio signals to levels sufficient for driving one or more of the transducers 114. In some embodiments, for example, the amplifiers 112h include one or more switching or class-D power amplifiers. In other embodiments, however, the amplifiers include one or more other types of power amplifiers (e.g., linear gain power amplifiers, class-A amplifiers, class-B amplifiers, class-AB amplifiers, class-C amplifiers, class-D amplifiers, class-E amplifiers, class-F amplifiers, class-G and/or class H amplifiers, and/or another suitable type of power amplifier). In certain embodiments, the amplifiers 112h comprise a suitable combination of two or more of the foregoing types of power amplifiers. Moreover, in some embodiments, individual ones of the amplifiers 112h correspond to individual ones of the transducers 114. In other embodiments, however, the electronics 112 includes a single one of the amplifiers 112h configured to output amplified audio signals to a plurality of the transducers 114. In some other embodiments, the electronics 112 omits the amplifiers 112h.

The transducers 114 (e.g., one or more speakers and/or speaker drivers) receive the amplified audio signals from the amplifier 112h and render or output the amplified audio signals as sound (e.g., audible sound waves having a frequency between about 20 Hertz (Hz) and 20 kilohertz (kHz)). In some embodiments, the transducers 114 can comprise a single transducer In other embodiments, however, the transducers 114 comprise a plurality of audio transducers In some embodiments, the transducers 114 comprise more than one type of transducer. For example, the transducers 114 can include one or more low frequency transducers (e.g., subwoofers, woofers), mid-range frequency transducers (e.g., mid-range transducers, mid-woofers), and one or more high frequency transducers (e.g., one or more tweeters). As used herein, "low frequency" can generally refer to audible frequencies below about 500 Hz, "mid-range frequency" can generally refer to audible frequencies between about 500 Hz and about 2 kHz, and "high frequency" can generally refer to audible frequencies above 2 kHz. In certain embodiments, however, one or more of the transducers 114 comprise transducers that do not adhere to the foregoing frequency ranges. For example, one of the transducers 114 may comprise a mid-woofer transducer configured to output sound at frequencies between about 200 Hz and about 5 kHz.

Figure 1D:
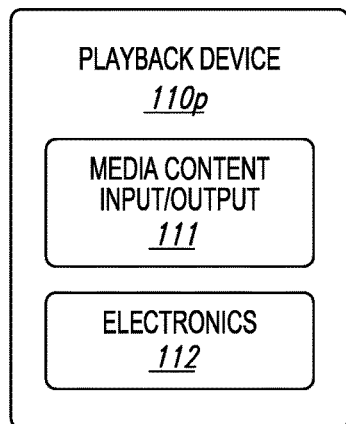
FIG. 1D is a block diagram of a playback device.

By way of illustration, SONOS, Inc. presently offers (or has offered) for sale certain playback devices including, for example, a "SONOS ONE," "PLAY:1" "PLAY:3," "PLAY: 5," "PLAYBAR," "PLAYBASE," "CONNECT:AMP," "CONNECT," and "SUB." Other suitable playback devices may additionally or alternatively be used to implement the playback devices of example embodiments disclosed herein. Additionally, one of ordinary skilled in the art will appreciate that a playback device is not limited to the examples described herein or to SONOS product offerings. In some embodiments, for example, one or more playback devices 110 comprises wired or wireless headphones (e.g., over-the-ear headphones, on-ear headphones, in-ear earphones) In other embodiments, one or more of the playback devices 110 comprise a docking station and/or an interface configured to interact with a docking station for personal mobile media playback devices. In certain embodiments, a playback device may be integral to another device or component such as a television, a lighting fixture, or some other device for indoor or outdoor use. In some embodiments, a playback device omits a user interface and/or one or more transducers. For example, FIG. 1D is a block diagram of a playback device 110p comprising the input/output 111 and electronics 112 without the user interface 113 or transducers 114.

Figure 1E:
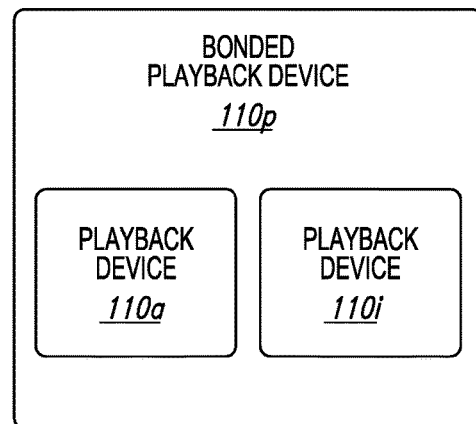
FIG. 1E is a block diagram of a network microphone device.

FIG. 1E is a block diagram of a bonded playback device 110q comprising the playback device 110a (FIG. 1C) sonically bonded with the playback device 110i (e.g., a subwoofer) (FIG. 1A). In the illustrated embodiment, the playback devices 110a and 110i are separate ones of the playback devices 110 housed in separate enclosures. In some embodiments, however, the bonded playback device 110q comprises a single enclosure housing both the playback devices 110a and 110i. The bonded playback device 110q can be configured to process and reproduce sound differently than an unbonded playback device (e.g., the playback device 110a of FIG. 1C) and/or paired or bonded playback devices (e.g., the playback devices 110l and 110m of FIG. 1B). In some embodiments, for example, the playback device 110a is full-range playback device configured to render low frequency, mid-range frequency, and high frequency audio content, and the playback device 110i is a subwoofer configured to render low frequency audio content In some aspects, the playback device 110a, when bonded with the first playback device, is configured to render only the mid-range and high frequency components of a particular audio content, while the playback device 110i renders the low frequency component of the particular audio content. In some embodiments, the bonded playback device 110q includes additional playback devices and/or another bonded playback device.

c. Suitable Network Microphone Devices (NMDs)

FIG. 1F is a block diagram of the NMD 120a (FIGS. 1A and 1B). The NMD 120a includes one or more voice processing components 124 (hereinafter "the voice components 124") and several components described with respect to the playback device 110a (FIG. 1C) including the processors 112a, the memory 112b, and the microphones 115. The NMD 120a optionally comprises other components also included in the playback device 110a (FIG. 1C), such as the user interface 113 and/or the transducers 114. In some embodiments, the NMD 120a is configured as a media playback device (e.g., one or more of the playback devices 110), and further includes, for example, one or more of the audio components 112g (FIG. 1C), the amplifiers 112h, and/or other playback device components. In certain embodiments, the NMD 120a comprises an Internet of Things (IoT) device such as, for example, a thermostat, alarm panel, fire and/or smoke detector, etc. In some embodiments, the NMD 120a comprises the microphones 115, the voice processing 124, and only a portion of the components of the electronics 112 described above with respect to FIG. 1B. In some aspects, for example, the NMD 120a includes the processor 112a and the memory 112b (FIG. 1B), while omitting one or more other components of the electronics 112. In some embodiments, the NMD 120a includes additional components (e.g., one or more sensors, cameras, thermometers, barometers, hygrometers).

In some embodiments, an NMD can be integrated into a playback device. FIG. 1G is a block diagram of a playback device 110r comprising an NMD 120d. The playback device 110r can comprise many or all of the components of the playback device 110a and further include the microphones 115 and voice processing 124 (FIG. 1F). The playback device 110r optionally includes an integrated control device 130c. The control device 130c can comprise, for example, a user interface (e.g., the user interface 113 of FIG. 1B) configured to receive user input (e.g., touch input, voice input) without a separate control device. In other embodiments, however, the playback device 110r receives commands from another control device (e.g., the control device 130a of FIG. 1B).

Referring again to FIG. 1F, the microphones 115 are configured to acquire, capture, and/or receive sound from an environment (e.g., the environment 101 of FIG. 1A) and/or a room in which the NMD 120a is positioned. The received sound can include, for example, vocal utterances, audio played back by the NMD 120a and/or another playback device, background voices, ambient sounds, etc. The microphones 115 convert the received sound into electrical signals to produce microphone data. The voice processing 124 receives and analyzes the microphone data to determine whether a voice input is present in the microphone data. The voice input can comprise, for example, an activation word followed by an utterance including a user request. As those of ordinary skill in the art will appreciate, an activation word is a word or other audio cue that signifying a user voice input. For instance, in querying the AMAZON® VAS, a user might speak the activation word "Alexa." Other examples include "Ok, Google" for invoking the GOOGLE® VAS and "Hey, Siri" for invoking the APPLE® VAS.

After detecting the activation word, voice processing 124 monitors the microphone data for an accompanying user request in the voice input. The user request may include, for example, a command to control a network-enabled device, such as a thermostat (e.g., NEST® thermostat), an illumination device (e.g., a PHILIPS HUE® lighting device), or a media playback device (e.g., a Sonos® playback device). For example, a user might speak the activation word "Alexa" followed by the utterance "set the thermostat to 68 degrees" to set a temperature in a home (e.g., the environment 101 of FIG. 1A). The user might speak the same activation word followed by the utterance "turn on the living room" to turn on illumination devices in a living room area of the home. The user may similarly speak an activation word followed by a request to play a particular song, an album, or a playlist of music on a playback device in the home d. Suitable Control Devices FIG. 1H is a partially schematic diagram of the control device 130a (FIGS. 1A and 1B). As used herein, the term "control device" can be used interchangeably with "controller" or "control system." Among other features, the control device 130a is configured to receive user input related to the media playback system 100 and, in response, cause one or more devices in the media playback system 100 to perform an action(s) or operation(s) corresponding to the user input. In the illustrated embodiment, the control device 130a comprises a smartphone (e.g., an iPhone™, an Android phone) on which media playback system controller application software is installed. In some embodiments, the control device 130a comprises, for example, a tablet (e.g., an iPad™), a computer (e.g., a laptop computer, a desktop computer), and/or another suitable device (e.g., a television, an automobile audio head unit, an IoT device). In certain embodiments, the control device 130a comprises a dedicated controller for the media playback system 100. In other embodiments, as described above with respect to FIG. 1G, the control device 130a is integrated into another device in the media playback system 100 (e.g., one more of the playback devices 110, NMDs 120, and/or other suitable devices configured to communicate over a network).

The control device 130a includes electronics 132, a user interface 133, one or more speakers 134, and one or more microphones 135. The electronics 132 comprise one or more processors 132a (referred to hereinafter as "the processors 132a"), a memory 132b, software components 132c, and a network interface 132d. The processor 132a can be configured to perform functions relevant to facilitating user access, control, and configuration of the media playback system 100. The memory 132b can comprise data storage that can be loaded with one or more of the software components executable by the processor 132a to perform those functions. The software components 132c can comprise applications and/or other executable software configured to facilitate control of the media playback system 100. The memory 112b can be configured to store, for example, the software components 132c, media playback system controller application software, and/or other data associated with the media playback system 100 and the user.

The network interface 132d is configured to facilitate network communications between the control device 130a and one or more other devices in the media playback system 100, and/or one or more remote devices. In some embodiments, the network interface 132d is configured to operate according to one or more suitable communication industry standards (e.g., infrared, radio, wired standards including IEEE 802.3, wireless standards including IEEE 802.11a, 802.11b, 802.11g, 802.11n, 802.11ac, 802.15, 4G, LTE). The network interface 132d can be configured, for example, to transmit data to and/or receive data from the playback devices 110, the NMDs 120, other ones of the control devices 130, one of the computing devices 106 of FIG. 1B, devices comprising one or more other media playback systems, etc. The transmitted and/or received data can include, for example, playback device control commands, state variables, playback zone and/or zone group configurations. For instance, based on user input received at the user interface 133, the network interface 132d can transmit a playback device control command (e.g., volume control, audio playback control, audio content selection) from the control device 130a to one or more of the playback devices 110. The network interface 132d can also transmit and/or receive configuration changes such as, for example, adding/removing one or more playback devices 110 to/from a zone, adding/removing one or more zones to/from a zone group, forming a bonded or consolidated player, separating one or more playback devices from a bonded or consolidated player, among others.

The user interface 133 is configured to receive user input and can facilitate control of the media playback system 100. The user interface 133 includes media content art 133a (e.g., album art, lyrics, videos), a playback status indicator 133b (e.g., an elapsed and/or remaining time indicator), media content information region 133c, a playback control region 133d, and a zone indicator 133e. The media content information region 133c can include a display of relevant information (e.g., title, artist, album, genre, release year) about media content currently playing and/or media content in a queue or playlist. The playback control region 133d can include selectable (e.g., via touch input and/or via a cursor or another suitable selector) icons to cause one or more playback devices in a selected playback zone or zone group to perform playback actions such as, for example, play or pause, fast forward, rewind, skip to next, skip to previous, enter/exit shuffle mode, enter/exit repeat mode, enter/exit cross fade mode, etc. The playback control region 133d may also include selectable icons to modify equalization settings, playback volume, and/or other suitable playback actions. In the illustrated embodiment, the user interface 133 comprises a display presented on a touch screen interface of a smartphone (e.g., an iPhone™, an Android phone). In some embodiments, however, user interfaces of varying formats, styles, and interactive sequences may alternatively be implemented on one or more network devices to provide comparable control access to a media playback system.

The one or more speakers 134 (e.g., one or more transducers) can be configured to output sound to the user of the control device 130a. In some embodiments, the one or more speakers comprise individual transducers configured to correspondingly output low frequencies, mid-range frequencies, and/or high frequencies. In some aspects, for example, the control device 130a is configured as a playback device (e.g., one of the playback devices 110). Similarly, in some embodiments the control device 130a is configured as an NMD (e.g., one of the NMDs 120), receiving voice commands and other sounds via the one or more microphones 135.

The one or more microphones 135 can comprise, for example, one or more condenser microphones, electret condenser microphones, dynamic microphones, and/or other suitable types of microphones or transducers. In some embodiments, two or more of the microphones 135 are arranged to capture location information of an audio source (e.g., voice, audible sound) and/or configured to facilitate filtering of background noise. Moreover, in certain embodiments, the control device 130a is configured to operate as playback device and an NMD. In other embodiments, however, the control device 130a omits the one or more speakers 134 and/or the one or more microphones 135. For instance, the control device 130a may comprise a device (e.g., a thermostat, an IoT device, a network device) comprising a portion of the electronics 132 and the user interface 133 (e.g., a touch screen) without any speakers or microphones.

III. Example Audio Notification Playback

As indicated above, examples described herein relate to example techniques for playback devices to output audio notifications or alert communications from network-enabled devices.

Figure 2:
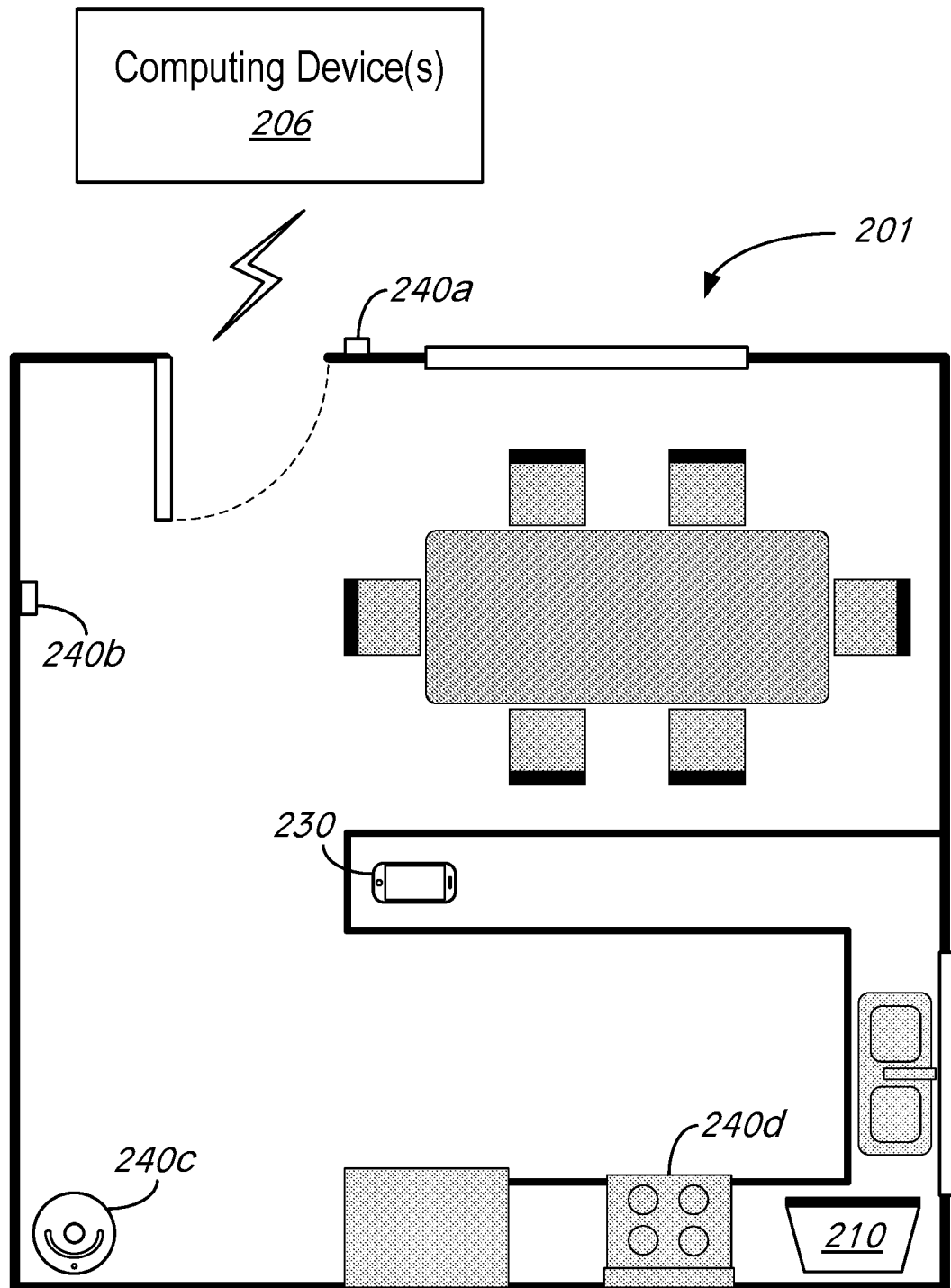
FIG. 2 is a diagram of a playback environment within which a playback device may output audio alerts from network-enabled devices.

FIG. 2 depicts an example environment 201 in which a playback device 210 outputs audio alerts from one or more network-enabled devices 240a, 240b, 240c, and 240d (collectively referred to as network-enabled devices 240).

The playback device 210 may be similar or equivalent to any of the playback devices 110 depicted in FIGS. 1A-1E and 1G. As such, the playback device 210 includes an audio stage having an amplifier configured to receive audio signals and output the received audio signals as sound by driving one or more transducers, such as one or more speakers. In some examples, the playback device 210 includes one or more transducers, and the speaker drivers output the audio signals as sound by driving the transducers of the playback device 210 in other examples, the playback device 210 is coupled to externally connected transducers, such as passive speakers, and the speaker drivers output the audio signals as sound by driving the externally connected transducers.

The network-enabled devices 240 represent various different types of devices configured to communicate with other devices over a network, and are sometimes referred to as "smart devices" or "IoT devices." The network-enabled devices 240 can include third-party devices provided by a manufacturer or vendor that is different from the manufacturer or vendor of the playback device 210. For instance, in examples where the playback device 210 is a playback device manufactured by Sonos®, a third-party network-enabled device 240 can include any non-Sonos® smart device.

As shown in FIG. 2, the environment 201 includes a network-enabled doorbell 240a (e.g., a Nest® Hello or a Ring® Video Doorbell), a network-enabled thermostat 240b (e.g., a Nest® Learning Thermostat or an Ecobee® thermostat), a network-enabled robotic vacuum 240c (e.g., an iRobot® Roomba or a Neato® Botvac), and a network-enabled oven 240d (e.g., a GE® smart oven or a Whirlpool® smart range). However, these example network-enabled devices 240 are merely illustrative, and in other examples the network-enabled devices 240 can include additional, fewer, and/or various other types of smart devices, including, but not limited to, smoke detectors, carbon monoxide detectors, security systems, cameras, lighting systems, and various types of smart appliances, such as refrigerators, microwave ovens, dishwashers, laundry machines, and the like.

The network-enabled devices 240 are configured to generate alerts upon detecting various events. For instance, the doorbell 240a may generate an alert responsive to detecting the presence of an individual at the door, such as by determining that the individual has interacted with a user interface of the doorbell (e.g., detecting a button press or touchscreen interaction) or by using a camera or motion sensor of the doorbell 240a to detect the individual's presence. The thermostat 240b may generate an alert responsive to determining that the environment 201 has reached a threshold high or low temperature or responsive to activating or deactivating an HVAC system of the environment 201. The robotic vacuum 240c may generate an alert responsive to starting or finishing a cleaning cycle. The oven 240d may generate an alert responsive to reaching a threshold temperature or determining that a cook timer has expired. These alert examples are merely illustrative, and in other examples the network-enabled devices 240 may generate additional, fewer, or different types of alerts.

The network-enabled devices 240 provide the generated alerts to a user. In some cases, the network-enabled devices 240 provide the generated alerts to the user by causing the user's mobile device to output an audio and/or visual notification of the generated alert. For instance, the network-enabled device 240 can cause a control device 230 to display a notification of the generated alert. The control device 230 may be similar or equivalent to the control device 130a depicted in FIGS. 1A, 1B, and 1H and may be, for example, a smartphone, a tablet, a laptop computer, or the like.

In some circumstances, the user may prefer to be notified via a media playback system. For example, the user may prefer to be alerted of high-priority events from certain types of devices such as alarms (e.g., smoke alarm, carbon monoxide alarm) via the media playback system.

In some circumstances, the user might not be effectively notified via a mobile device. For instance, the mobile device may be control device 230, and the user might not receive the notification of the generated alerts output by the control device 230, as the user may have powered off or silenced the control device 230, or the control device 230 may have powered itself off responsive to low battery power. As another example, the playback device 210 may be playing back music or other audio content that drowns out or otherwise distracts the user from the alert notifications output by the control device 230.

Disclosed herein are example systems and methods for providing additional and/or alternative notifications of the network-enabled device generated alerts, which can increase the likelihood of the user effectively receiving the notifications and improve the user experience. In particular, the present disclosure provides example systems and methods that involve the playback device 210 outputting audio notifications of the network-enabled device alerts.

In order to output audio notifications of the network-enabled device alerts, the playback device 210 can be configured with an application programming interface (API) through which the network-enabled devices 240 can communicate with the playback device 210. Example features of the API are shown and described in further detail below. However, these API features are merely illustrative, and in other examples, additional, fewer, and/or different API features can be used.

A. Example API

An example API can define various parameters that the network-enabled device 240 and/or the playback device 210 can use to facilitate causing the playback device 210 to output an audio notification of the network-enabled device alert. Table 1 shown below provides example API parameters, each of which are explained in further detail below. However, these parameters are for illustrative purposes, and in other examples, the API may define additional, fewer, and/or alternative parameters.

TABLE 1

| Parameter | Type |
| --- | --- |
| id | String |
| name | String |
| appId | String |
| priority | Enumerated |
| notification | Enumerated |
| streamUrl | String |
| httpAuthorization | String |
| expiryMillis | Integer |
| shouldLoop | Boolean |
| status | Enumerated |
| errorCode | Error |

As shown in Table 1, one example parameter defined by the API is an id parameter. The id parameter represents a string type parameter that represents an identifier of a particular audio notification. In some examples, the playback device 210 generates a value of the id parameter and assigns the value to a particular audio notification.

Another example parameter is a name parameter. The name parameter represents a string type parameter that represents a user-identifiable name associated with an audio notification. The user-identifiable name can include a name of the network-enabled device 240 that generated the alert and/or a description of a type of the alert. In some examples, the network-enabled device 240 specifies a value of the name parameter for a particular audio notification.

Another example parameter is an appId parameter. The appId parameter represents a string type parameter that identifies an application that generated a particular audio notification. As shown, the appId parameter is a reversed Internet domain associated with the application, such as "com.acme.app," where "acme.com" is the domain prior to reversal. In other examples, the appId parameter can take various other forms.

Another example parameter is a priority parameter. The priority parameter represents an enumerated type parameter that specifies a priority of an audio notification. In some examples, the priority parameter comprises enumerated values of "LOW" or "HIGH" for respectively setting the priority as low or high, but in other examples, the priority parameter may comprise additional or different enumerated values. For instance, the priority parameter may indicate priority level on a numerical scale (e.g., 1-5). In some examples, the network-enabled device 240 sets the value of the priority parameter for a particular audio notification. In other examples, the playback device 210 sets the value of the playback parameter based on the type of network-enabled device 240 that generated the alert corresponding to the audio notification. In yet another example, the user may indicate via a user interface the priority to assign to a particular alert from the network-enabled device 240.

The network-enabled devices 240 can set the priority parameter to "HIGH" for audio notifications that correspond to network-enabled device alerts that are particularly time-sensitive, and "LOW" for audio notifications that are less time-sensitive. Time-sensitive audio notifications are alerts that are to be played back as closely as possible to the event triggering the audio notification. Example high priority alerts may include, but are not limited to, smoke alarms, carbon monoxide alarms, oven timers, and security alarms. Example low priority alerts may include, but are not limited to, doorbells, phone calls, completed laundry cycle, motion detectors, and preheated ovens. And, as explained in further detail below with respect to FIGS. 4A-4D, the playback device 210 is configured to play back audio notifications in a certain way based on their specified priority.

Another example parameter is a notification parameter. The notification parameter represents an enumerated type parameter that specifies a particular audio source that the playback device 210 outputs as the network-enabled device alert notification In some examples, the notification parameter comprises enumerated values of (i) "CHIME" which, when set as the notification enumerated value, causes the playback device 210 to output a default chime audio notification as the network-enabled device alert notification, and (ii) "CUSTOM" which, when set as the notification enumerated value, causes the playback device 210 to output a custom audio notification as the network-enabled device alert notification. In other examples, the notification enumerated values may comprise additional or different values. The audio for the default chime audio notification may be stored in the memory of playback device, while the audio for the custom audio notification may be specified by the network-enabled device, as explained in further detail below.

Another example parameter is a streamUrl parameter. The streamUrl parameter represents a string type parameter that specifies a URL of an audio source for the playback device 210 to output as the custom audio notification as the third-part alert notification. As such, when the notification parameter is set as "CUSTOM," the playback device 210 can retrieve the audio source from the URL specified as the streamUrl parameter, and can play back the retrieved audio source as the network-enabled device alert notification.

Another example parameter is an httpAuthorization parameter. The httpAuthorization parameter represents a string type parameter that specifies credentials for authorizing access to the URL specified by the streamUrl parameter when the specified URL requires authentication, such as when the specified URL is secure (e.g., using https).

Another example parameter is an expiryMillis parameter. The expiryMillis parameter represents an integer type parameter that indicates how long a particular audio notification is permitted to be queued in a notification queue for playback before dismissing the audio notification from notification queue. In the present example, the value of the expiryMillis parameter specifies such a time limit in milliseconds, but other example implementations are possible as well.

Another example parameter is a shouldLoop parameter. The shouldLoop parameter can be a Boolean type parameter that specifies whether the playback device 210 should loop the playback of a particular audio notification. If the shouldLoop parameter is set as "FALSE," then the playback device 210 plays back the audio notification once. If the shouldLoop parameter is set as "TRUE," then the playback device 210 loops playback of the audio notification for a predetermined amount of time. The predetermined amount of time may depend on the priority value of the audio notification. For instance, the playback device 210 may be configured to loop playback of high priority audio notifications for a longer predetermined amount of time than low priority audio notifications.

Another example parameter is a status parameter. The status parameter can be an enumerated type parameter that identifies a current status of a particular audio notification. In an example, the status parameter enumerated values include (i) "PENDING" for audio notifications that are scheduled for playback but are not currently being played back, (ii) "ACTIVE" for audio notifications that are currently being played back, and (iii) "DISMISSED" for audio notifications that have been dismissed. In other examples, the status parameter enumerated values may comprise additional or different values.

Another example parameter is an errorCode parameter. The errorCode parameter represents an error type parameter to which the playback device 210 assigns a particular value responsive to detecting a particular error condition. Example error values include (i) "ERROR_AUDIO_CLIP_DO_NOT_DISTURB," which the playback device 210 can assign to the errorCode parameter responsive to determining that the playback device 210 is in a "do not disturb" mode that temporarily disables audio notification playback, (ii) "ERROR_ALUDIO_CLIP_ID_NOT_FOUND," which the playback device 210 can assign to the errorCode parameter responsive to determining that the playback device 210 is unable to retrieve the specified audio source for the audio notification (e.g., the audio source identified by the streamUrl parameter), (iii) "ERROR_AUDIO_CLIP_MEDIA_ERROR," which the playback device 210 can assign to the errorCode parameter responsive to determining that the specified audio source for the audio notification is a type of media that is unsupported for playback by the playback device 210, (iv) "ERROR_AUDIO_CLIP_CANCEL," which the playback device 210 can assign to the errorCode parameter responsive to determining that the audio notification has been canceled prior to playing back the notification, and (v) "ERROR_AUDIO_CLIP_EXPIRE," which the playback device 210 can assign to the errorCode parameter responsive to determining that the audio notification has expired prior to playing back the notification (e.g., determining that the time specified by the expiryMillis parameter has elapsed before playback). In other examples, the playback device 210 can assign additional or different values to the errorCode parameter responsive to detecting additional or different error conditions.

B. Example Use of the API

Using the above-described API, the network-enabled devices 240 can communicate with the playback device 210 to cause the playback device 210 to output an audio notification of one or more alerts generated by the network-enabled devices 240 or to perform various other functions related to the audio notification.

The network-enabled devices 240 can be connected to the same network (e.g., local area network, Bluetooth) as the media playback system of playback device 210. The network-enabled devices 240 can communicate directly with the playback device 210 over the network, or the network-enabled devices 240 can communicate with the playback device 210 via one or more intermediary computing devices, such as the computing devices 206 shown in FIG. 2. For instance, in some examples, the computing devices 206 include a third-party server affiliated with one or more of the network-enabled devices 240 as well as a first-party server affiliated with the playback device 210. In such examples, the network-enabled devices 240 can communicate with the playback device 210 by sending a communication to the third-party server over a wide area network (WAN), which then sends the communication to the first-party server, which then sends the communication to the playback device 210 over a WAN. Similarly, the playback device 210 can communicate with one or more of the network-enabled devices 240 by sending a communication to the first-party server, which then sends the communication to the third-party server, which then sends the communication to the network-enabled device 240. Other examples are possible as well.

Using one or more servers as intermediaries between the playback device 210 and the network-enabled devices 240 may have various advantages. Such servers may be more reliably connected to the playback device 210 and/or the network-enabled devices 240, as such computing devices may have a static network address (or domain) whereas individual devices may have dynamic addresses. Further, such servers may implement additional cloud services, such as backup or logging of notifications. Yet further, security may be enhanced.

FIG. 3A shows an example alert message 300 that the network-enabled devices 240 can send to the playback device 210 to cause or request the playback device 210 to output an audio notification of an alert. The alert message 300 includes a header portion 302 and a body portion 304.

In the header 302, the network-enabled device 240 specifies a command for the playback device 210 to execute, as well as identifiers specifying which playback device 210 is to carry out the command. In this manner, the network-enabled device 240 can specify certain speakers to play back alert notifications, which can improve user experience. For instance, the oven 240*d* is located in a kitchen, so the oven 240*d* can specify that the playback device 210, which is also located in the kitchen, is to play back the alert notification from the oven 240*d*. As shown, the header 302 specifies that the playback device 210 that is named "xyz" and located in household "ABCD1234" is to execute a "loadAudioClip" command. The specified playback device 210 can be a standalone playback device or a playback device that is grouped with one or more other playback devices (e.g., a playback device grouped in a surround sound configuration, including rear channel speakers).

In some examples, the alert message 300 may address multiple playback devices (e.g., all networked playback devices on a given network). For instance, in an example, the header 302 does not specify a particular playback device 210 for carrying out the command to play back an audio notification, so as to address any playback device 210 receiving the alert message 300. In this case, if multiple playback devices receive the notification, all of these networked playback devices concurrently play back the notification. As another example, the alert message 300 can specify multiple playback devices to play back the audio notification, and the playback device 210 receiving the alert message 300 can synchronize playback of the audio notification across the specified playback devices. The multiple playback device specified to play back the audio notifications may be identified individually using an identifier of the playback device (e.g., serial number, name, other unique alphanumeric string, etc.) As yet another example, the alert message 300 can specify that the audio notification is to be played back across grouped playback devices, and the playback device 210 receiving the alert message 300 can synchronize playback of the audio notification across any playback devices grouped with the playback device 210. This feature can be an "include grouped devices" option enabling an alert message 300 targeting a player in a group to be played synchronously by all players in the same group. Other examples are possible as well.

The body 304 of the alert message 300 specifies various parameter values that the playback device 210 uses when executing the "loadAudioClip" command, including values for the name, appId, priority, notification, streamUrl, and expiryMillis parameters, each of which is described above in further detail. As shown in FIG. 3A, the alert message 300 causes the playback device 210 to play back a low priority alert notification generated by a network-enabled device 240 associated with an application named "Example." The alert message 300 further specifies that, when playing back this notification, the playback device 210 will output a custom audio signal that is retrieved from a particular URI or URL such as http://example.com/notification.mp3. Additionally, based on the expiryMillis parameter being set to 2000, the playback device 210 will cancel playback of the notification if 2000 milliseconds (or 2 seconds) elapse before the playback device 210 begins playing back the notification.

Responsive to receiving the alert message 300 from the network-enabled device 240, the playback device 210 sends, to the network-enabled device 240, response message 310 that acknowledges receipt of the alert message 300 and provides a status of the notification. Similar to the alert message 300, the response message 310 includes a header portion 312 and a body portion 314. In the header 312, the playback device 210 specifies that the response message 310 is provided in response to the loadAudioClip command provided by the network-enabled device 240 and indicates that the loadAudioClip command was successfully received.

The body 314 of the response message 310 includes additional parameter values specified by the playback device 210. For instance, the playback device 210 assigns a value to the id parameter, which identifies the audio notification requested by the alert message 300. As shown, the playback device 210 has identified the audio notification as "NEW NOTIFICATION." Additionally, the body 314 of the response message 310 reports a status of the audio notification. As shown, the status of the audio notification is "PENDING," which, as noted above, means the audio notification is queued for playback by the playback device 210.

In addition to sending the response message 310, the playback device 210 also takes steps to play back the audio notification requested by the alert message 300. In some examples, the playback device 210 maintains a queue of notifications, and the playback device plays back the queued notifications according to their order in the notification queue. In such examples, responsive to receiving the alert message 300, the playback device 210 adds the audio notification identified by the alert message 300 into the notification queue.

FIG. 4A depicts an example notification queue 400. The notification queue 400 can be stored in a memory of the playback device 210. The notification queue 400 includes a number of notifications 404 (identified as queued notifications 1-4) queued for playback, each notification having a respective status 402 and a respective priority 406. As shown, the status 402 of queued notification 1 is "ACTIVE," which indicates that the playback device 210 is currently playing back this notification. The remaining notifications have "PENDING" statuses, which indicates that these notifications are awaiting playback by the playback device 210. As further shown, queued notifications 1 and 2 have high priorities, so the playback device 210 has arranged these notifications at the top of the notification queue 400, and queued notifications 3 and 4 have low priorities, so the playback device 210 has arranged these notifications after the high priority notifications.

Figure 4C:
FIG. 4C is a simplified diagram of a queue of alert notifications for playback by a playback device
Figure 4D:
FIG. 4D is a simplified diagram of a queue of alert notifications for playback by a playback device.

FIGS. 4B, 4C, and 4D depict examples of the notification queue 400 after the playback device 210 adds a new notification to the notification queue 400.

FIG. 4B depicts an example of the notification queue 400 after the playback device 210 receives and processes the alert message 300. As noted above, the network-enabled device 240 specifies in the alert message 300 that the new notification has a low priority. Based on the new notification having a low priority, the playback device 210 adds the new notification to the notification queue 400 at a queue position that is after the high priority notifications. As shown, the playback device 210 adds the new notification to the end of the queue, after the other already-queued (i.e., pending) low priority notifications. However, in other examples, the playback device 210 can be configured to add the new notification to the notification queue 400 at a queue position that is after the high priority notifications and before the other pending low priority notifications.

FIG. 4C depicts another example of the notification queue 400 after the playback device 210 adds the new notification to the notification queue 400. In this example, the network-enabled device 240 has specified that the new notification has a high priority. Based on the new notification having a high priority, the playback device 210 adds the new notification to the notification queue 400 at a queue position that is before the low priority notifications. As shown, the playback device 210 adds the new notification before the low priority notifications, but after the other pending high priority notifications. However, in other examples, the playback device 210 can be configured to add the new notification to the notification queue 400 at a queue position that is before the other pending high priority notifications, but after any notification that the playback device 210 is currently playing back (i.e., after any active notification).

FIG. 4D depicts yet another example of the notification queue 400 after the playback device 210 adds the new notification to the notification queue 400. In this example, the network-enabled device 240 has again specified that the new notification has a high priority Based on the new notification having a high priority, the playback device 210 adds the new notification to the front of the notification queue 400 and begins playing back the new notification. To facilitate this, the playback device 210 interrupts (e.g., pauses or stops) playback of the active queued notification 1 and transitions queued notification 1 to a pending state in the notification queue 400. As shown, the playback device 210 moves interrupted queued notification 1 to a queue position that is before all other pending queue notifications. However, in other examples, the playback device 210 can be configured to move interrupted queue notification 1 to a queue position that is after the other pending high priority notifications, or to the end of the notification queue 400 in examples where the interrupted queued notification 1 is a low priority notification.

In some examples, instead of returning an interrupted notification to the notification queue 400 (e.g., as described in connection with FIG. 4D), the playback device 210 can report the interruption to the network-enabled device 240 that initially requested the interrupted notification. Responsive to receiving the reported interruption, the network-enabled device 240 can determine whether the interrupted notification is still relevant (e.g., whether the conditions that caused the network-enabled device 240 to generate the alert corresponding to the interrupted notification are still present) and, if so, then the network-enabled device 240 can then send a subsequent request to the playback device 210 to cause the playback device 210 to play back the interrupted notification again.

In some examples, the playback device 210 is configured to interrupt an active notification in order to play back a new notification (e.g., as described in connection with FIG. 4D) only under certain circumstances. For instance, the playback device 210 can be configured such that, when the active notification is a low priority notification and the new notification is a high priority notification, the playback device 210 interrupts playback of the active low priority notification to play back the new high priority notification. On the other hand, when both the active and new notifications are high priority notifications, the playback device 210 can be configured to interrupt the active high priority notification with the new high priority notification only if the playback device 210 has been playing back the active high priority notification for a threshold amount of time (e.g., 10 seconds). This behavior may prevent a high priority notification from being missed by a user. Otherwise, if the playback device 210 has not been playing back the active high priority notification for the threshold amount of time, then the playback device 210 adds the new notification to the notification queue 400 without interrupting playback of the active notification.

As another example, the playback device 210 can be configured such that, when the new notification is a low priority notification, the playback device 210 does not interrupt playback of the active notification unless the active notification is a low priority notification that the playback device 210 has been playing back for the threshold amount of time. As yet another example, the playback device 210 can be configured such that, when the new notification is a low priority notification, the playback device 210 does not interrupt playback of the active notification, regardless of the priority of the active notification.

In addition to adding new notifications to the notification queue 400, the playback device 210 can be configured to remove notifications from the notification queue 400 under certain circumstances. As described above, for instance, the network-enabled devices 240 can specify a maximum amount of time that an alert notification is permitted to be queued for playback in the notification queue 400 (e.g., using the expiryMillis parameter). As such, the playback device 210 can determine that an alert notification has been in the notification queue 400 for a threshold amount of time corresponding to an expired audio notification, for instance by determining that an alert notification has been in the notification queue 400 for the amount of time specified by the expiryMillis parameter. In response to making such a determination, the playback device 210 can remove the expired alert notification from the notification queue.

In addition to treating the low and high priority notifications differently when adding new notifications to the notification queue 400, the playback device 210 can be configured to treat low and high priority notifications differently when playing back the notifications. As an example, the playback device 210 can be configured to play back high priority notifications at a higher volume than low priority notifications. As another example, the playback device 210 can be configured to play back low and high priority notifications for different lengths of time. For instance, the playback device 210 can be configured to limit playback of notifications to a threshold playback time, and once the threshold playback time has elapsed, the playback device 210 dismisses playback of the notification. As such, the playback device 210 can set the threshold playback time to be longer for high priority notifications (e.g., 1 hour) than for low priority notifications (e.g., 1 minute).

In some examples, the notification queue 400 is empty, such that the playback device 210 is not playing back any notifications. Instead, the playback device 210 can be playing back various other audio content, such as music, television audio, audiobooks, or the like. In such a scenario, when the playback device 210 receives a request from one of the network-enabled devices 240 to play back an alert notification (e.g., when the playback device 210 receives alert message 300), the playback device 210 can adjust the playback of the other audio content in order to facilitate playing back the alert notification.

As described above with respect to the example operating environment, example playback devices 110 may implement a playback queue to manage playback of multiple items of audio content. A notification queue may be separate and distinct from a playback queue implemented by a playback device 110 for general playback of audio content. An example playback device 210 may implement both a playback queue and a notification queue concurrently. In some cases, as described in further detail below, the notification queue may take control or otherwise modify playback from the playback queue.

In some examples, the playback device 210 temporarily reduces the volume of (also referred to as "ducking") the other audio content and plays back the alert notification concurrently with the ducked audio content. U.S. Pat. No. 9,665,341 entitled, "Synchronized audio mixing," which is hereby incorporated by reference, provides in more detail some examples of a playback device mixing audio content for concurrent playback. In other examples, the playback device 210 stops playback of the other audio content, plays back the alert notification, and then resumes playback of the other audio content after playing back the alert notification.

In some examples, whether the playback device 210 ducks the other audio content or stops playback of the other audio content depends on whether the alert notification is a high priority notification or a low priority notification. For instance, for low priority notifications, the playback device 210 can duck the other audio content and play back the low priority notification concurrently with the ducked audio content. For high priority notifications, the playback device 210 can stop playing back the other audio content, play back the high priority notification, and then resume playing back the other audio content after playing back the high priority notification.

Additionally or alternatively, in some examples, whether the playback device 210 ducks the other audio content or stops playback of the other audio content depends on a type of the other audio content. For instance, if the playback device 210 determines that the other audio content includes long play content, such as audiobooks, podcasts, or movie audio, then the playback device 210 stops playing back the other audio content, plays back the notification, and then resumes playing back the other audio content after playing back the notification. If the playback device 210 determines that the other audio content includes short play content, such as music, then the playback device 210 ducks the other audio content and plays back the notification concurrently with the ducked audio content. To facilitate this, the playback device 210 can be preset to treat certain types of audio content as long play or short play.

In some examples, the playback device 210 determines whether to duck or stop playback of the other audio content based on a source of the other audio content. Depending on the audio source, the playback device 210 may be unable to control the audio source (e.g., causing the audio source to pause, stop, or resume the audio content). For instance, some audio sources may provide the other audio content to the playback device 210 through a line-in connection or some other connection through which the playback device 210 is unable to control the audio source. Alternatively, even if the playback device 210 is capable of controlling the audio source, doing so might result in an undesirable user experience. For instance, the audio source may include a live streaming service, such as a live radio broadcast, that if paused would resume at a later live time or would cause the user's feed to be delayed from the live feed. As such, the playback device 210 can be configured to duck playback of any audio content that is provided by an audio source that the playback device 210 cannot interrupt, such as audio content received through a line-in connection, or for which interruption would result in an undesirable user experience, such as live-streaming audio content.

As described above, the playback device 210 can be configured to limit the amount of time that the playback device 210 plays back a particular notification, such that the playback device 210 automatically dismisses playback of the notification after a threshold amount of time elapses. However, a user may wish to dismiss playback of an alert notification without waiting for the threshold amount of time to elapse. As such, the playback device 210 can be configured to receive user input for dismissing playback of an alert notification.

In some examples, the playback device 210 includes a user interface (e.g., one or more buttons, knobs, dials, touch-sensitive surfaces, displays, touchscreens), such as the user interface 113 described above in connection with FIG. 1C The user interface can also include a visual indicator, such as an LED. When the playback device 210 is outputting a notification, the playback device 210 can cause the visual indicator to indicate that the notification is playing, for instance by illuminating the LED in a particular color or in a particular pattern.

While playing back an alert notification, the playback device 210 can receive user input via the user interface, and, responsive to receiving the user input, the playback device 210 dismisses playback of the alert notification. For instance, during playback of an alert notification, a skip forward button may be configured to skip forward from playback of a given notification to playback of another notification in the notification queue or to the currently playing media item in the playback queue. As another example, a play/pause button may be configured to dismiss the currently playing alert notification. As yet another example, the user may perform a particular gesture or input pattern, such as a double tap of a particular button or a particular swipe pattern on the user interface, to dismiss the currently playing alert notification.

In some examples, the playback device 210 causes the control device 230 to display, via its graphical user interface, a visual notification corresponding to an alert notification that the playback device 210 is playing back. For instance, responsive to receiving a request to play back an alert notification (e.g., responsive to receiving alert message 300) or responsive to playing back the alert notification, the playback device 210 can send an instruction to the control device 230 that causes the control device to display an indication that the playback device 210 is playing back the alert notification.

Figure 5:
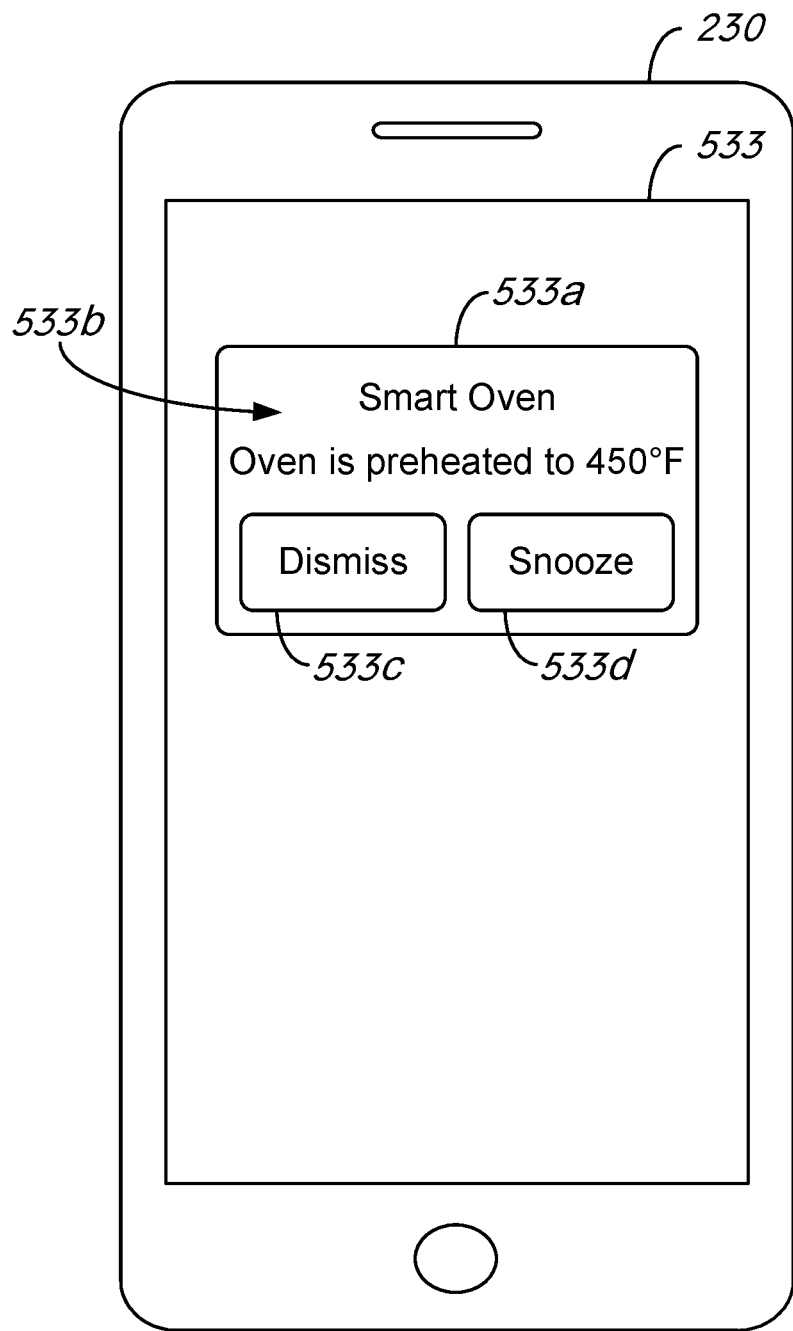
FIG. 5 is a simplified diagram of a control device displaying a notification that a playback device is outputting an alert notification.

FIG. 5 depicts the control device 230 displaying an example indication of the playback device 210 playing back an alert notification. The control device 230 includes a user interface 533, which may be the same or equivalent to the user interface 133 described above in connection with FIG. 1H. The control device 230 displays, via the user interface 133 an indication 533a that the playback device 210 is playing back an alert notification. The control device 230 displays the indication 533a responsive to receiving an instruction from the playback device 210 to display the indication 533a.

The indication 533a includes information 533b about the alert notification that the playback device 210 is playing back. The information 533b can include an identification of the network-enabled device that generated the alert, a description of the conditions that prompted the alert, or various other information that can help the user identify the source of the alert. This information may be populated from parameters in the alert message 300, which the playback device may include in the instruction(s) to the control device to display the indication that the playback device 210 is playing back the alert notification.

As shown in FIG. 5, the information 533b identifies the network-enabled device that generated the alert as a "Smart Oven" and describes the conditions of the alert as "Oven is preheated to 450° F." The playback device 210 can provide the information 533b to the control device 230 as part of the instruction to display the indication 533a, and the playback device 210 can obtain the information 533b from the network-enabled device 240, for instance, by extracting the information 533b from the alert message 300.

The indication 533a further includes a dismiss button 533c and a snooze button 533d. When a user activates the dismiss button 533c, the control device 230 sends a dismiss instruction to the playback device 210. Responsive to receiving the dismiss instruction, the playback device 210 stops playing back the alert notification and removes the alert notification from the notification queue 400. When a user activates the snooze button 533d, the control device 230 sends a snooze instruction to the playback device 210. Then, responsive to receiving the snooze instruction, the playback device 210 stops playing back the alert notification and places the alert notification back into the notification queue 400, for instance, according to one or more of the processes described above in connection with FIGS. 4A-4D. In order to avoid rapidly replaying the snoozed alert notification, such as when the notification queue 400 is empty or nearly empty, the playback device 210 can delay replaying the snoozed alert notification for a threshold amount of time (e.g., 5 minutes)

In some examples, the control device 230 sends the dismiss instruction to the network-enabled device 240, and the network-enabled device 240 responsively sends the dismiss instruction to the playback device 210. In some examples, the control device 230 and the playback device 210 are connected to the same LAN, and the control device 230 sends the dismiss instruction to the playback device 210 over the LAN. In some examples, the control device 230 sends the dismiss instruction to a server device, which then routes the dismiss instruction to the playback device 210. For instance, the control device 230 may send the dismiss instruction to a third-party server, the third-party server may send the dismiss instruction to the network-enabled device 240, and the network-enabled device 240 may send the dismiss instruction to the playback device 210. As another example, the control device 230 may send the dismiss instruction to a first-party server, and the first-party server may send the dismiss instruction to the playback device 210. In examples where the dismiss instruction is not sent to the network-enabled device 240, the control device or the playback device 210 may send a message to the network-enabled device 240 indicating that the alert notification has been dismissed.

In some examples, the playback device 210 is configured to display the indication 533a on a "now playing" screen of the user interface 133. The now playing screen can include various information related to media content that the playback device 210 is currently playing back, such as media content art (e.g., album art, lyrics, videos), a playback status indicator (e.g., an elapsed and/or remaining time indicator), media content information, a playback control icons, and a zone indicator, as shown and described in connection with FIG. 1H. In this manner, the user can dismiss or snooze playback of an alert notification by interacting with the indication 533a through the now playing screen.

In some examples, the network-enabled device 240 causes the control device 230 to display the indication 533a. For instance, in addition to sending the alert message 300 to the playback device 210, the network-enabled device 240 may send a message to the control device 230 instructing the control device 230 to display the indication 533a. Alternatively, the network-enabled device 240 may send a message (e.g., included in or separate from the alert message 300) to the playback device 210 instructing the playback device 210 to cause the control device 230 to display the indication 533a.

In some examples, the playback device 210 provides reports to the network-enabled devices 240 whenever the playback device 210 performs certain actions related to an alert notification. For instance, the playback device 210 can send reports to the network-enabled device 240 (or to the third-party server) indicating that the playback device 210 has queued an alert notification for playback, is currently playing back an alert notification, has dismissed an alert notification (e.g., in response to user input), has interrupted an alert notification in order to play back another alert notification, has removed an expired alert notification from the queue, or has stopped playing back an alert notification based on playing back the alert notification for a threshold amount of time. For a given notification, the playback device 210 can provide these reports only to the network-enabled devices 240 associated with notification, or the playback device 210 can provide these reports to multiple ones or all of the network-enabled devices 240 that are networked with the playback device 210.

Figure 6:
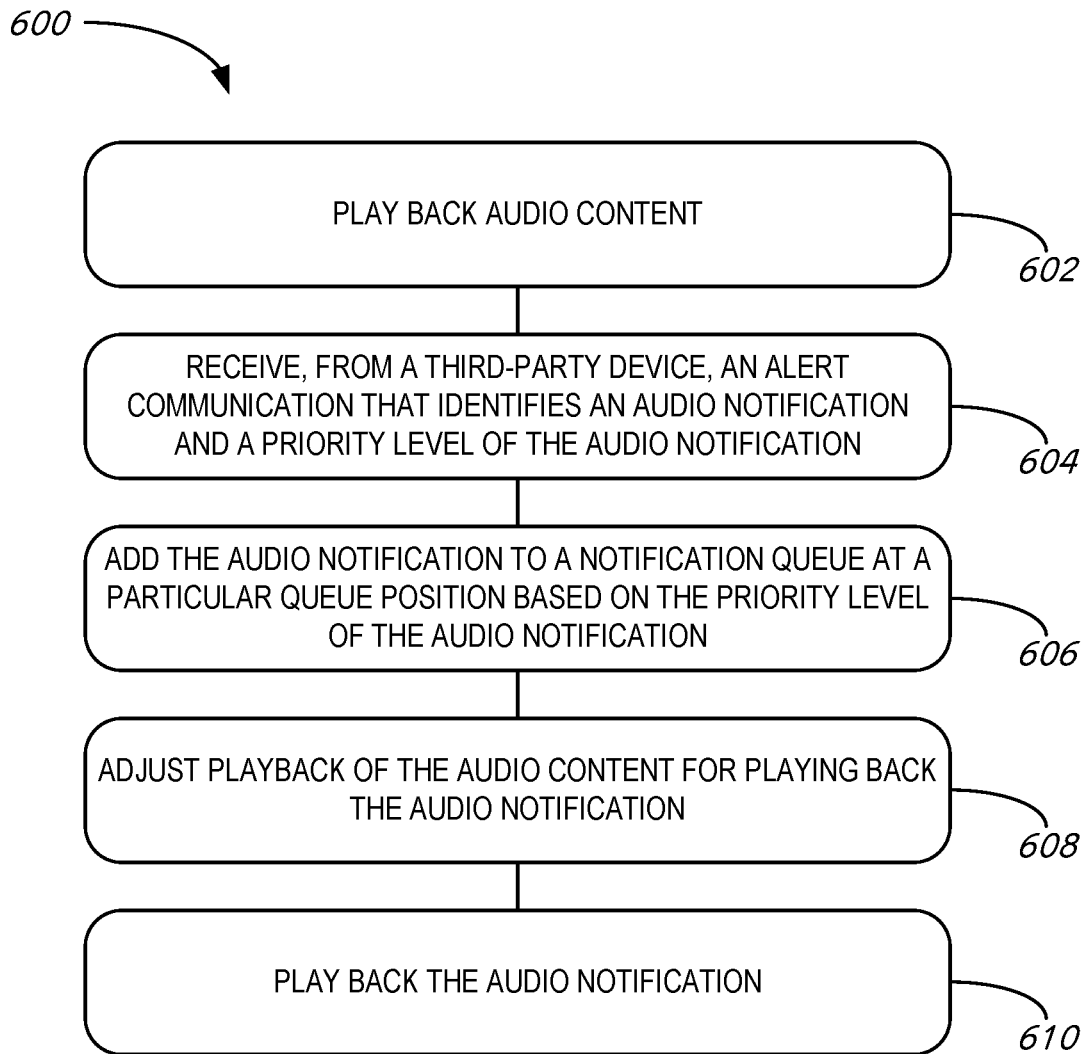
FIG. 6 is a flowchart of a method for a playback device outputting alert notifications from network-enabled devices.

FIG. 6 shows an example method 600 for a playback device outputting alert notifications from network-enabled devices. Method 600 can be implemented by any of the playback devices disclosed and/or described herein, or any other playback device now known or later developed.

Various embodiments of method 600 include one or more operations, functions, and actions illustrated by blocks 602 through 610. Although the blocks are illustrated in sequential order, these blocks may also be performed in parallel, and/or in a different order than the order disclosed and described herein. Also, the various blocks may be combined into fewer blocks, divided into additional blocks, and/or removed based upon a desired implementation.

In addition, for the method 600 and for other processes and methods disclosed herein, the flowchart shows functionality and operation of one possible implementation of some embodiments. In this regard, each block may represent a module, a segment, or a portion of program code, which includes one or more instructions executable by one or more processors for implementing specific logical functions or steps in the process. The program code may be stored on any type of computer readable medium, for example, such as a storage device including a disk or hard drive. The computer readable medium may include non-transitory computer readable media, for example, such as tangible, non-transitory computer-readable media that stores data for short periods of time like register memory, processor cache, and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the method 600 and for other processes and methods disclosed herein, each block in FIG. 6 may represent circuitry that is wired to perform the specific logical functions in the process.

Method 600 begins at block 602, which involves the playback device playing back audio content via an audio stage and one or more speaker drivers of the playback device. As described above, playing back audio content may involve playing back alert notifications from a notification queue, or may involve playing back audio content that excludes alert notifications, such as music, television audio, audiobooks, or the like.

At block 604, method 600 involves, while playing back the audio content, the playback device receiving, via a network interface of the playback device, an alert communication from a network-enabled device, the alert communication comprising (i) an audio notification identifier that identifies an audio notification and (ii) a priority identifier that identifies a priority level of the audio notification. As described above, receiving the alert communication may involve receiving alert message according to an API of the playback device. Additionally, the audio notification identifier may identify a default audio notification supported by the playback device, or the audio notification identifier may identify a custom audio notification. The audio for the default audio notification may be stored in the memory of playback device.

At block 606, method 600 involves, responsive to receiving the alert communication, the playback device adding the audio notification to a notification queue at a particular queue position, wherein the particular queue position of the audio notification in the notification queue is based on the priority level of the audio notification relative to other audio content in the notification queue. As described above, the playback device adds high priority notifications ahead of low priority notifications in the notification queue.

At block 608, method 600 involves the playback device adjusting playback of the audio content for playing back the audio notification. As described above, adjusting playback of the audio content may involve stopping playback of the audio content or ducking the audio content.

At block 610, method 600 involves the playback device playing back the audio notification. In examples where adjusting playback of the audio content involves ducking the audio content, playing back the audio notification involves playing back the audio notification concurrently with the ducked audio content. In examples where adjusting playback of the audio content involves stopping playback of the audio content, the method 600 may further involve, after playing back the audio notification, resuming playback of the audio content Within examples, the audio notification is a first audio notification, the notification queue includes a second audio notification, and adding the audio notification to the notification queue involves adding the first audio notification to the notification queue ahead of the second audio notification based on the priority level of the first audio notification being a higher priority than a priority level of the second audio notification.

In some examples, the audio notification is a first audio notification, the audio content includes a second audio notification, the priority level of the first audio notification is higher than a priority level of the second audio notification, and stopping playback of the audio content involves stopping playback of the second audio notification based on the priority level of the first audio notification being higher than the priority level of the second audio notification.

In further examples, the audio notification is a first audio notification, the audio content includes a second audio notification, and adjusting playback of the audio content involves (i) determining, based on the particular queue position of the first audio notification, that the first audio notification is ready for playback, (ii) determining that the playback device has been playing back the second audio notification for a threshold amount of time corresponding to a partially-played back notification, and (iii) based on both the first audio notification being ready for playback and the playback device having played back the second audio notification for the threshold amount of time corresponding to a partially-played back notification, stopping playback of the second audio notification and starting the playback of the first audio notification.

In some examples, the audio notification is a first audio notification, the notification queue includes a second audio notification, and the method 600 further involves (i) the playback device determining that the second audio notification has been in the notification queue for a threshold amount of time corresponding to an expired audio notification and (ii) responsive to determining that the second audio notification has been in the notification queue for the threshold amount of time corresponding to the expired audio notification, the playback device removing the second audio notification from the notification queue.

Within examples, the method 600 further involves the playback device sending, via the network interface to a mobile device having a graphical user interface, an instruction that causes the mobile device to display, via the graphical user interface, an indication that the playback device is playing back the audio notification. In such examples, the method 600 may further involve (i) the playback device receiving, via the network interface from the mobile device, an instruction to dismiss the audio notification and (ii) in response to receiving the instruction to dismiss the audio notification, the playback device stopping playback of the audio notification and resuming playback of the audio content.

While the method 600 is described with respect to a playback device receiving an alert communication while playing back other audio content, the systems and methods disclosed herein are not limited to such a scenario. For instance, a playback device can receive an alert communication when the playback device is not playing back other audio content, and, in such a scenario, the playback device can execute some or all of the processes described above in order to output an audio notification based on the alert communication.

IV. Conclusion

The above discussions relating to playback devices, controller devices, playback zone configurations, and media content sources provide only some examples of operating environments within which functions and methods described below may be implemented. Other operating environments and configurations of media playback systems, playback devices, and network devices not explicitly described herein may also be applicable and suitable for implementation of the functions and methods.

(Feature 1) A method to be performed by a playback device comprising: a network interface; an audio stage comprising an amplifier; one or more speaker drivers; one or more processors; and a housing carrying at least the network interface, the audio stage, the one or more speaker drivers, the one or more processors, and tangible, non-transitory, computer-readable media storing instructions executable by the one or more processors to cause the playback device to perform the method. The method comprising: while playing back audio content via the audio stage and the one or more speaker drivers, receiving, via the network interface, an alert communication from a network-enabled device connected to the playback device via a local area network, the alert communication comprising (i) an audio notification identifier that identifies an audio notification and (ii) a priority identifier that identifies a priority level of the audio notification: responsive to receiving the alert communication, adding the audio notification to a notification queue at a particular queue position, wherein the particular queue position of the audio notification in the notification queue is based on the priority level of the audio notification relative to other audio content in the notification queue; adjusting playback of the audio content for playing back the audio notification; and playing back the audio notification via the audio stage and the one or more speaker drivers (Feature 2) The method of feature 1, wherein the audio notification is a first audio notification, wherein the notification queue comprises a second audio notification, and wherein adding the audio notification to the notification queue comprises adding the first audio notification to the notification queue ahead of the second audio notification based on the priority level of the first audio notification being a higher priority than a priority level of the second audio notification.

(Feature 3) The method of feature 1, wherein the audio content excludes audio notifications, wherein adjusting playback of the audio content comprises ducking the audio content, and wherein playing back the audio notification comprises playing back the audio notification concurrently with the ducked audio content.

(Feature 4) The method of feature 1, wherein adjusting playback of the audio content comprises stopping playback of the audio content, and wherein the method further comprises: after playing back the audio notification, resuming playback of the audio content.

(Feature 5) The method of feature 4, wherein the audio notification is a first audio notification, wherein the audio content comprises a second audio notification, wherein the priority level of the first audio notification is higher than a priority level of the second audio notification, and wherein stopping playback of the audio content comprises stopping playback of the second audio notification based on the priority level of the first audio notification being higher than the priority level of the second audio notification.

(Feature 6) The method of feature 1, wherein the audio notification is a first audio notification, wherein the audio content comprises a second audio notification, and wherein adjusting playback of the audio content comprises: determining, based on the particular queue position of the first audio notification, that the first audio notification is ready for playback; determining that the playback device has been playing back the second audio notification for a threshold amount of time corresponding to a partially-played back notification; and based on both (i) the first audio notification being ready for playback and (ii) the playback device having played back the second audio notification for the threshold amount of time corresponding to a partially-played back notification, stopping playback of the second audio notification and starting the playback of the first audio notification.

(Feature 7) The method of feature 1, wherein the audio notification is a first audio notification, wherein the notification queue comprises a second audio notification, and wherein the method further comprises: determining that the second audio notification has been in the notification queue for a threshold amount of time corresponding to an expired audio notification; and responsive to determining that the second audio notification has been in the notification queue for the threshold amount of time corresponding to the expired audio notification, removing the second audio notification from the notification queue.

(Feature 8) The method of feature 1, further comprising: sending, via the network interface to a mobile device having a graphical user interface, an instruction that causes the mobile device to display, via the graphical user interface, an indication that the playback device is playing back the audio notification.

(Feature 9) The method of feature 1, further comprising: receiving, via the network interface from a mobile device, an instruction to dismiss the audio notification; and in response to receiving the instruction to dismiss the audio notification, stopping playback of the audio notification and resuming playback of the audio content.

(Feature 10) A playback device configured to perform the method of any of features 1-9.

(Feature 11) Tangible, non-transitory, computer-readable media storing instructions executable by one or more processors of a playback device to cause the playback device to perform the method of any of features 1-9.

(Feature 12) A system configured to perform the method of any of features 1-9.

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only ways) to implement such systems, methods, apparatus, and/or articles of manufacture.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the foregoing description of embodiments.

When any of the appended claims are read to cover a purely software and/or firmware implementation, at least one of the elements in at least one example is hereby expressly defined to include a tangible, non-transitory medium such as a memory, DVD. CD, Blu-ray, and so on, storing the software and/or firmware.

The invention claimed is:

1. A playback device of a media playback system, the playback device comprising:
 a network interface;
 one or more speaker drivers;
 one or more processors; and
 a housing, the housing carrying at least the network interface, the one or more speaker drivers, the one or more processors, and tangible, non-transitory, computer-readable media comprising instructions that are executable by the one or more processors such that the playback device is configured to:
 receive, via the network interface, an alert communication from a device, wherein the alert communication: (i) corresponds to an audio notification to be played back by one or more playback devices in the media playback system, and (ii) comprises an indication identifying at least one particular playback device in the media playback system for playback of the audio notification, wherein the indication identifies the playback device and at least one second playback device of the media playback system, and wherein the playback device and the at least one second playback device are configured to play back different media content;
 after receiving the alert communication:
 add the audio notification to a notification queue, wherein the playback device is configured to play back media content from a playback queue, and wherein the playback queue is separate from the notification queue;
 play back the audio notification in accordance with the notification queue via the one or more speaker drivers; and
 cause the at least one second playback device to play back, in synchrony with the playback device, the audio notification via respective one or more second speaker drivers of the at least one second playback device.

2. The playback device of claim 1, wherein:
 adding the audio notification to the notification queue comprises adding the audio notification at a particular queue position; and
 the particular queue position is based on a priority level of the audio notification relative to other audio notifications in the notification queue.

3. The playback device of claim 1, wherein playing back the audio notification in accordance with the notification queue comprises adjusting playback of the media content in the playback queue for playing back the audio notification in the notification queue.

4. The playback device of claim 1, wherein the device comprises one or more of: a control device of the media playback system, a local computing device, a remote computing device, a second playback device, a non-playback device, a server, or a network-enabled device connected to the playback device via a local area network.

5. The playback device of claim 1, wherein receiving the alert communication from the device comprises receiving the alert communication via at least one intermediary computing device.

6. The playback device of claim 5, wherein the at least one intermediary computing device comprises one or more of: a server associated with the playback device, or a server associated with the device.

7. The playback device of claim 1, wherein causing the at least one second playback device to play back the audio notification comprises causing the at least one second playback device to play back the audio notification in accordance with the notification queue.

8. The playback device of claim 1, wherein causing the at least one second playback device to play back the audio notification in synchrony with the playback device comprises causing the at least one second playback device to play back the audio notification while the playback device is playing back first media content and the at least one second playback device is one of: (i) not playing back any other media content, or (ii) playing back second media content different from the first media content.

9. The playback device of claim 1, wherein causing the at least one second playback device to play back the audio notification comprises causing the at least one second playback device to:
 add the audio notification to a second notification queue; and
 play back the audio notification in accordance with the second notification queue via the one or more second speaker drivers.

10. A non-transitory computer-readable medium having stored thereon instructions executable by one or more processors to cause a playback device of a media playback system to perform functions comprising:
 receiving, via a network interface of the playback device, an alert communication from a device, wherein the alert communication: (i) corresponds to an audio notification to be played back by one or more playback devices in the media playback system, and (ii) comprises an indication identifying at least one particular playback device in the media playback system for playback of the audio notification, wherein the indication identifies the playback device and at least one second playback device of the media playback system, and wherein the playback device and the at least one second playback device are configured to play back different media content;

after receiving the alert communication:
adding the audio notification to a notification queue, wherein the playback device is configured to play back media content from a playback queue, and wherein the playback queue is separate from the notification queue;
playing back the audio notification in accordance with the notification queue via one or more speaker drivers of the playback device; and
causing the at least one second playback device to play back, in synchrony with the playback device, the audio notification via respective one or more second speaker drivers of the at least one second playback device.

11. The non-transitory computer-readable medium of claim 10, wherein:
adding the audio notification to the notification queue comprises adding the audio notification at a particular queue position; and
the particular queue position is based on a priority level of the audio notification relative to other audio notifications in the notification queue.

12. The non-transitory computer-readable medium of claim 10, wherein playing back the audio notification in accordance with the notification queue comprises adjusting playback of the media content in the playback queue for playing back the audio notification in the notification queue.

13. The non-transitory computer-readable medium of claim 10, wherein the device comprises one or more of: a control device of the media playback system, a local computing device, a remote computing device, a second playback device, a non-playback device, a server, or a network-enabled device connected to the playback device via a local area network.

14. The non-transitory computer-readable medium of claim 10, wherein receiving the alert communication from the device comprises receiving the alert communication via at least one intermediary computing device.

15. The non-transitory computer-readable medium of claim 14, wherein the at least one intermediary computing device comprises one or more of: a server associated with the playback device, or a server associated with the device.

16. The non-transitory computer-readable medium of claim 10, wherein causing the at least one second playback device to play back the audio notification comprises causing the at least one second playback device to play back the audio notification in accordance with the notification queue.

17. The non-transitory computer-readable medium of claim 10, wherein causing the at least one second playback device to play back the audio notification in synchrony with the playback device comprises causing the at least one second playback device to play back the audio notification while the playback device is playing back first media content and the at least one second playback device is one of: (i) not playing back any other media content, or (ii) playing back second media content different from the first media content.

18. A method to be performed by a playback device of a media playback system, the method comprising:
receiving, via a network interface of the playback device, an alert communication from a device, wherein the alert communication: (i) corresponds to an audio notification to be played back by one or more playback devices in the media playback system, and (ii) comprises an indication identifying at least one particular playback device in the media playback system for playback of the audio notification, wherein the indication identifies the playback device and at least one second playback device of the media playback system, and wherein the playback device and the at least one second playback device are configured to play back different media content;
after receiving the alert communication:
adding the audio notification to a notification queue, wherein the playback device is configured to play back media content from a playback queue, and wherein the playback queue is separate from the notification queue;
playing back the audio notification in accordance with the notification queue via one or more speaker drivers of the playback device; and
causing the at least one second playback device to play back, in synchrony with the playback device, the audio notification via respective one or more second speaker drivers of the at least one second playback device.

* * * * *